(12) United States Patent
Tsai et al.

(10) Patent No.: US 9,655,244 B1
(45) Date of Patent: May 16, 2017

(54) FLEXIBLE ELECTRONIC DEVICE AND METHOD FOR MANUFACTURING THE SAME

(71) Applicant: INDUSTRIAL TECHNOLOGY RESEARCH INSTITUTE, Hsinchu (TW)

(72) Inventors: Chen-Chu Tsai, Taichung (TW); Cheng-Yi Wang, Zhubei (TW); Yuh-Zheng Lee, Zhubei (TW); Ko-Chin Yang, Taipei (TW); Shi-Chang Chen, Hualien County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/356,522

(22) Filed: Nov. 18, 2016

Related U.S. Application Data

(60) Provisional application No. 62/258,295, filed on Nov. 20, 2015.

(30) Foreign Application Priority Data

Aug. 15, 2016 (TW) .............................. 105125993 A

(51) Int. Cl.
*H05K 1/00* (2006.01)
*H05K 1/14* (2006.01)
(Continued)

(52) U.S. Cl.
CPC ............ *H05K 1/144* (2013.01); *H05K 1/028* (2013.01); *H05K 1/181* (2013.01); *H05K 3/007* (2013.01);
(Continued)

(58) Field of Classification Search
USPC ........................................ 361/749, 748, 750
See application file for complete search history.

(56) References Cited

U.S. PATENT DOCUMENTS

| 6,653,205 B2 | 11/2003 | Yanagita et al. |
| 6,716,084 B2 | 4/2004 | Basol et al. |

(Continued)

FOREIGN PATENT DOCUMENTS

| CN | 1049374 C | 2/2000 |
| CN | 103177998 A | 6/2013 |

(Continued)

OTHER PUBLICATIONS

TW Office Action dated Mar. 2, 2017 as received in Application No. 104143269.

*Primary Examiner* — Andargie M Aychillhum
(74) *Attorney, Agent, or Firm* — Maschoff Brennan

(57) ABSTRACT

A flexible electronic device includes a first flexible substrate, a first electronic component, a second flexible substrate, a second electronic component and an adhesive layer disposed between the first flexible substrate and the second flexible substrate. The first electronic component is disposed on a first surface of the first flexible substrate. The second electronic component is disposed on a first surface of the second flexible substrate. The first surface of the first flexible substrate has a first FPC bonding area having an orthogonal projection projected on a plane where the second flexible substrate is located does not overlap the second flexible substrate. The first surface of the second flexible substrate has a second FPC bonding area having an orthogonal projection projected on a plane where the first flexible substrate is located does not overlap the first flexible substrate.

21 Claims, 43 Drawing Sheets

(51) Int. Cl.
*H05K 1/02* (2006.01)
*H05K 1/18* (2006.01)
*H05K 3/36* (2006.01)
*H05K 3/00* (2006.01)

(52) U.S. Cl.
CPC ....... *H05K 3/361* (2013.01); *H05K 2201/058* (2013.01); *H05K 2201/09036* (2013.01); *H05K 2203/0228* (2013.01)

(56) References Cited

U.S. PATENT DOCUMENTS

| | | | |
|---|---|---|---|
| 7,229,900 | B2 | 6/2007 | Takayama et al. |
| 7,858,411 | B2 | 12/2010 | Yamazaki et al. |
| 8,376,017 | B2 | 2/2013 | Lee et al. |
| 8,434,538 | B2 | 5/2013 | Akiyama et al. |
| 2006/0199382 | A1 | 9/2006 | Sugiyama et al. |
| 2011/0007478 | A1* | 1/2011 | Takahashi ........... H01L 23/3121 361/721 |
| 2011/0048611 | A1 | 3/2011 | Carre et al. |
| 2011/0274840 | A1 | 11/2011 | Kwon et al. |
| 2013/0011969 | A1 | 1/2013 | Chen et al. |
| 2013/0118692 | A1 | 5/2013 | Miki et al. |
| 2015/0060869 | A1 | 3/2015 | Ro et al. |
| 2016/0192478 | A1* | 6/2016 | Kuo .................... H05K 1/0281 361/749 |

FOREIGN PATENT DOCUMENTS

| | | |
|---|---|---|
| CN | 104765168 A | 7/2015 |
| CN | 204884440 U | 12/2015 |
| EP | 3135490 A1 | 3/2017 |
| JP | 2000-349136 A | 12/2000 |
| TW | 508690 B | 11/2002 |
| TW | 531826 B | 5/2003 |
| TW | M329047 U | 3/2008 |
| TW | I321241 B | 3/2010 |
| TW | 201213100 A1 | 4/2012 |
| TW | 201301972 A | 1/2013 |
| TW | I381495 B | 1/2013 |
| TW | I394722 B | 5/2013 |
| TW | 201522067 A | 9/2013 |
| TW | 201408488 A | 3/2014 |
| TW | 201418031 A | 5/2014 |
| TW | I436702 B | 5/2014 |
| TW | 201434649 A | 9/2014 |
| TW | 201446526 A | 12/2014 |
| TW | I487017 B | 6/2015 |
| TW | M506987 U | 8/2015 |

\* cited by examiner

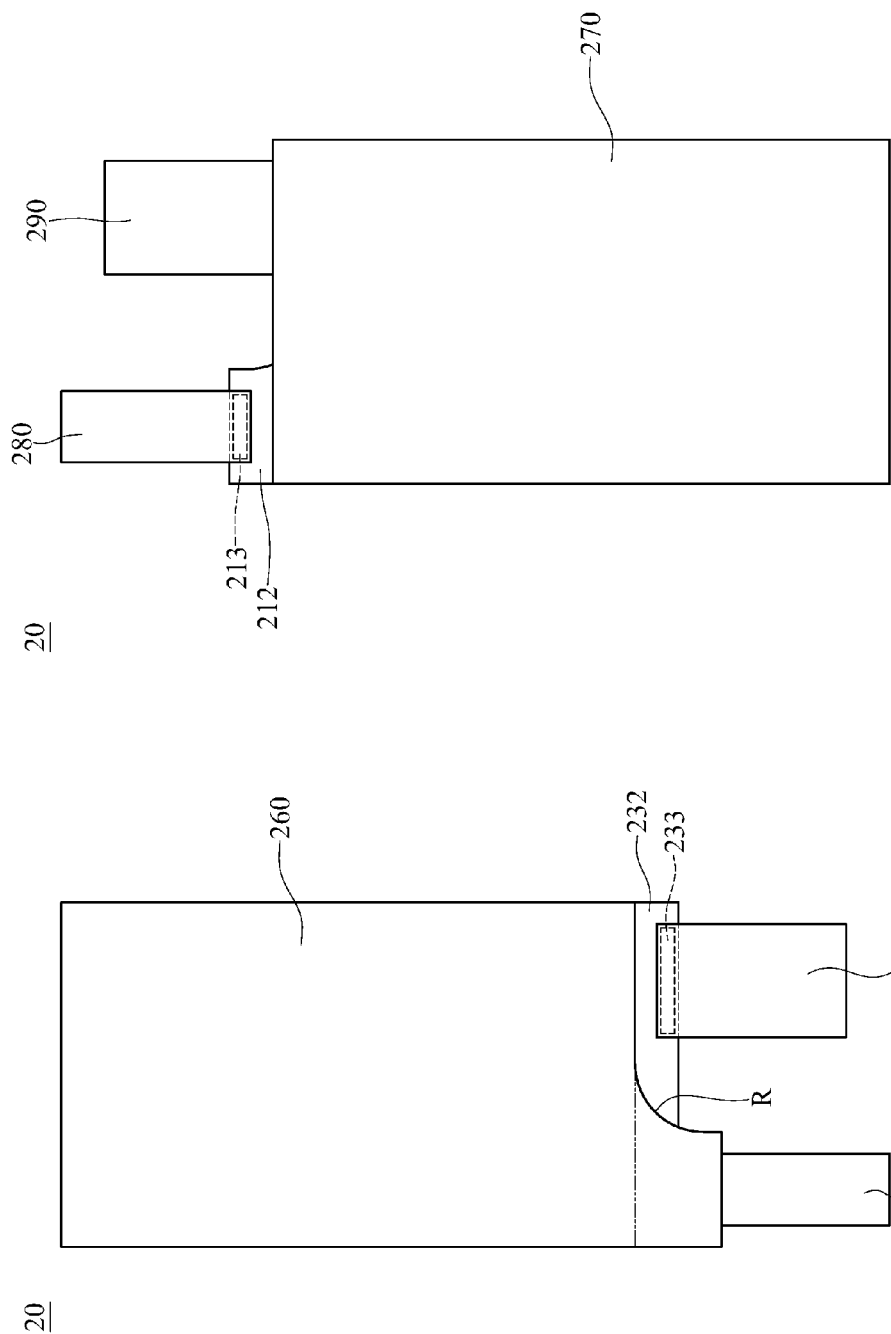

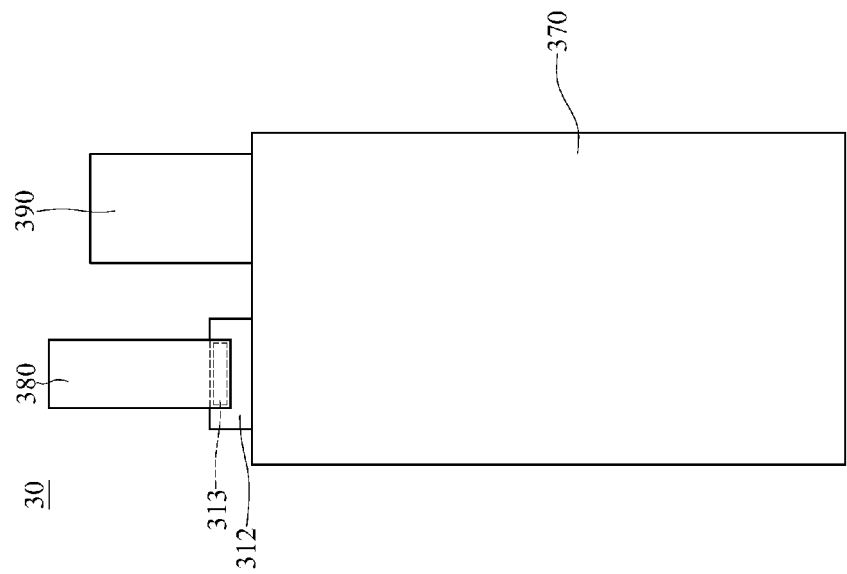
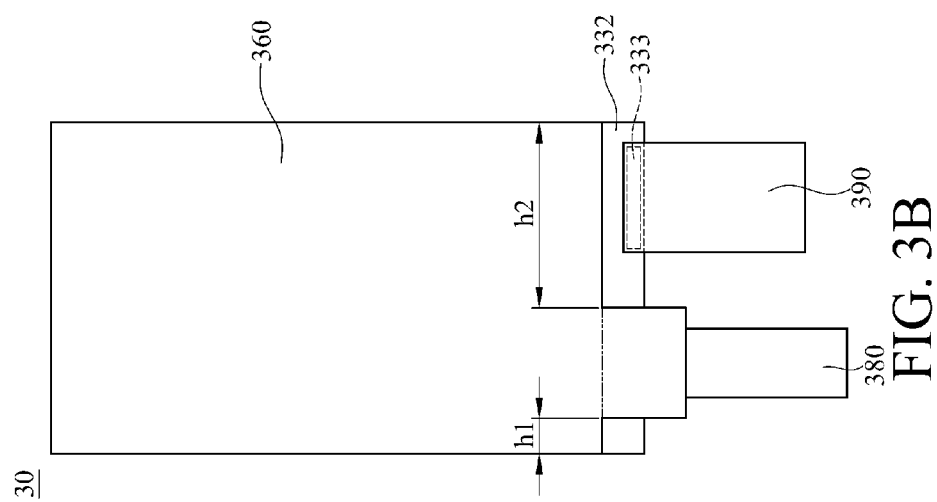

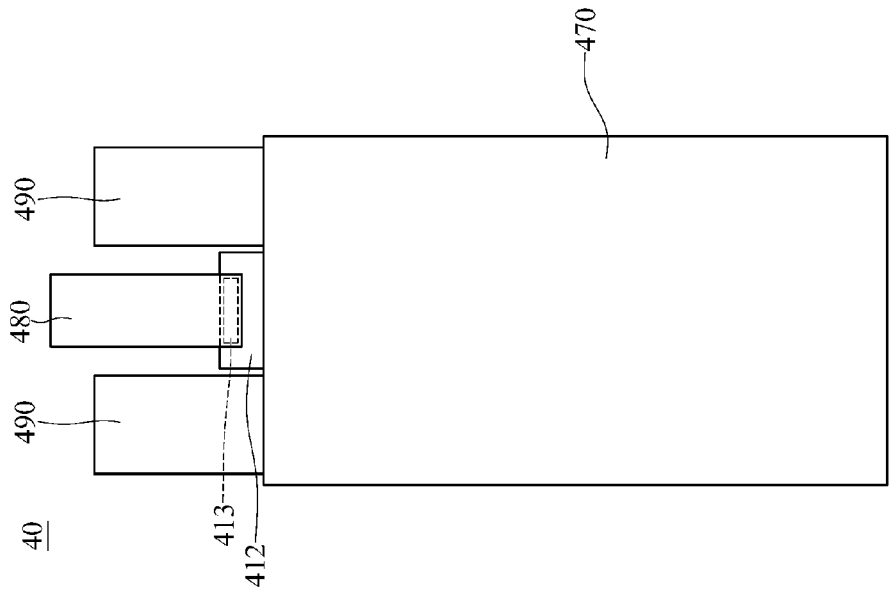
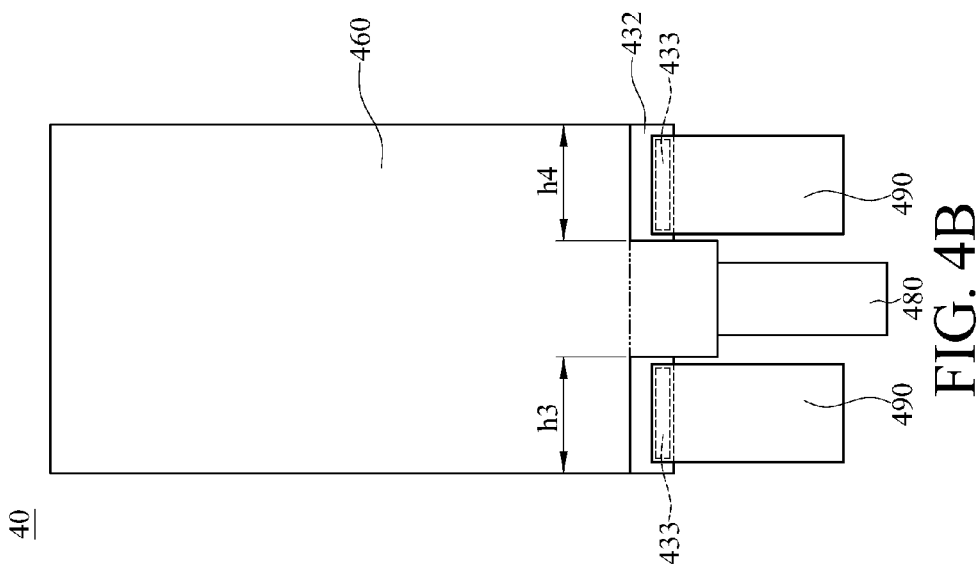
FIG. 4C
FIG. 4B

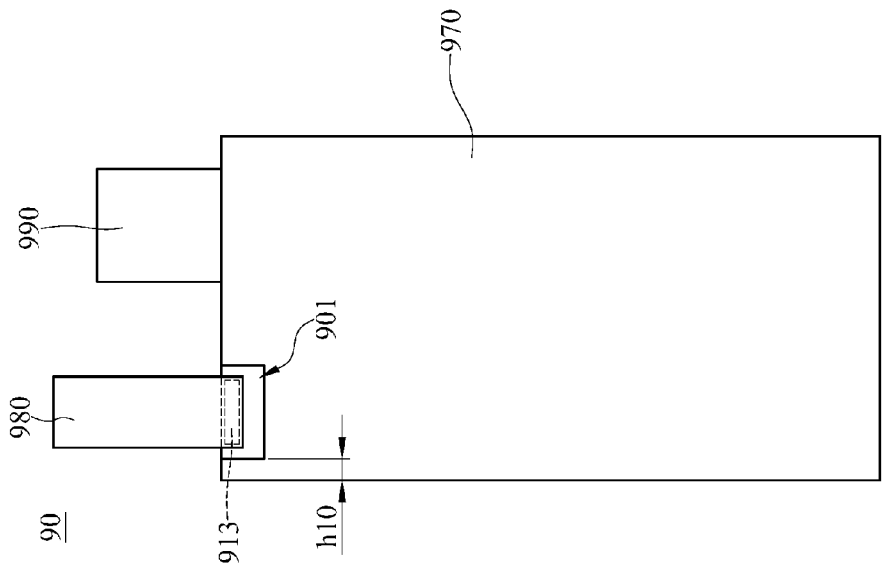
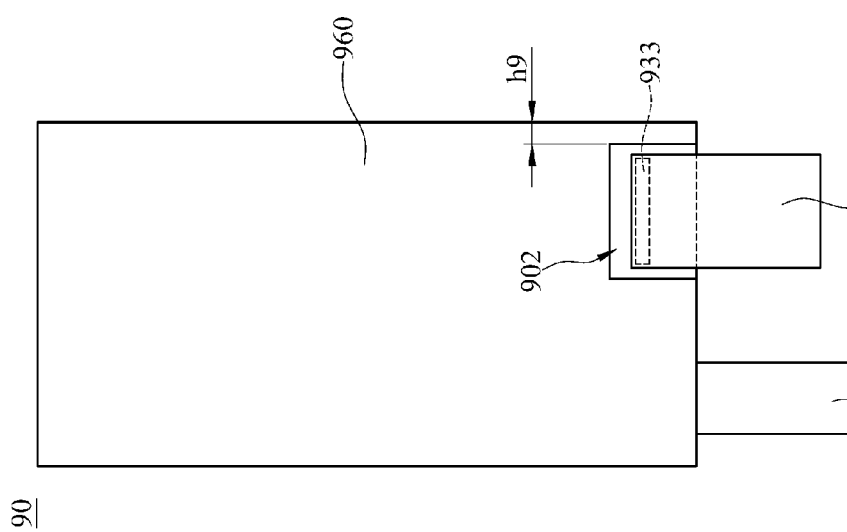
FIG. 9D
FIG. 9C

FLEXIBLE ELECTRONIC DEVICE AND METHOD FOR MANUFACTURING THE SAME

CROSS-REFERENCE TO RELATED APPLICATIONS

This application claims the priority benefits of U.S. provisional application Ser. No. 62/258,295, filed on Nov. 20, 2015, Taiwan application serial no. 105125993, filed on Aug. 15, 2016. The entirety of each of the above-mentioned patent applications is hereby incorporated by reference herein.

TECHNICAL FIELD

The present disclosure provides a flexible electronic device and a method for manufacturing the flexible electronic device.

BACKGROUND

In the current process of manufacturing flexible electronic component, a flexible printed circuit (FPC) and a substrate should be bonded to each other, and then the substrate and its electronic components are removed from a carrier.

However, in such a case, by referring to an experimental result, there is a high debonding force (stress) occurs on bonding area while the substrate is removed from the carrier, because of the structural stiffness increase of the bonding area. As a result, the aforementioned process is not favorable for removing the substrate and its electronic components from the carrier so that a yield of the process is reduced and it is not favorable for manufacturing multiple flexible electronic components on a large size carrier.

SUMMARY

The embodiment of the present disclosure provides a flexible electronic device including a first flexible substrate, a first electronic component, a second flexible substrate, a second electronic component and an adhesive layer. The first flexible substrate has a first surface and a second surface which are opposite to each other. The first electronic component is disposed on the first surface of the first flexible substrate. The second flexible substrate has a first surface and a second surface which are opposite to each other, and the first surface of the second flexible substrate faces the first surface of the first flexible substrate. The second electronic component is disposed on the first surface of the second flexible substrate. The adhesive layer is disposed between the first surface of the first flexible substrate and the first surface of the second flexible substrate. The first surface of the first flexible substrate has a first flexible printed circuit (FPC) bonding area outside the adhesive layer, an orthogonal projection of the first FPC bonding area projected on a plane where the second flexible substrate is located does not overlap the second flexible substrate, the first surface of the second flexible substrate has a second FPC bonding area outside the adhesive layer, and an orthogonal projection of the second FPC bonding area projected on a plane where the first flexible substrate is located does not overlap the first flexible substrate.

The embodiment of the present disclosure provides a method for manufacturing a flexible electronic device, the method including: providing a first plate member comprising a first carrier, a first flexible substrate, a plurality of first electronic components, an adhesive layer and a release film, wherein the first carrier, the first flexible substrate, the plurality of first electronic components, the adhesive layer and the release film are stacked in sequence; providing a second plate member comprising a second carrier, a second flexible substrate and a plurality of second electronic components, wherein the second carrier, the second flexible substrate and the plurality of second electronic components are stacked in sequence; removing the release film on the first plate member to leave the adhesive layer exposed; adhering the first plate member and the second plate member by the adhesive layer; removing the first carrier on the first plate member; removing the second carrier on the second plate member; performing a unit cutting process on the first plate member and the second plate member which are adhered to each other to produce a plurality of flexible electronic devices; and bonding a first FPC and a second FPC to one of the plurality of flexible electronic devices.

The embodiment of the present disclosure provides a method for manufacturing a flexible electronic device, the method including: providing a first plate member comprising a first carrier, a first flexible substrate, and a plurality of first electronic components, wherein the first carrier, the first flexible substrate, and the plurality of first electronic components are stacked in sequence; providing a second plate member comprising a second flexible substrate and a plurality of second electronic components; adhering the first plate member and the second plate member by an adhesive layer; removing the first carrier on the first plate member; performing a unit cutting process on the first plate member and the second plate member which are adhered to each other to produce a plurality of flexible electronic devices; and bonding a first FPC and a second FPC to one of the plurality of flexible electronic devices.

BRIEF DESCRIPTION OF THE DRAWINGS

The present disclosure will become more understood from the detailed description given herein below and the accompanying drawings which are given by way of illustration only and thus are not limitative of the present disclosure and wherein:

FIG. 2B is a top view of the flexible electronic device according to one embodiment of the present disclosure;

FIG. 2C is a bottom view of the flexible electronic device according to one embodiment of the present disclosure;

FIG. 3B is a top view of the flexible electronic device according to one embodiment of the present disclosure;

FIG. 3C is a bottom view of the flexible electronic device according to one embodiment of the present disclosure;

FIG. 4B is a top view of the flexible electronic device according to one embodiment of the present disclosure;

FIG. 4C is a bottom view of the flexible electronic device according to one embodiment of the present disclosure;

FIG. 9C is a top view of the flexible electronic device according to one embodiment of the present disclosure;

FIG. 9D is a bottom view of the flexible electronic device according to one embodiment of the present disclosure;

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
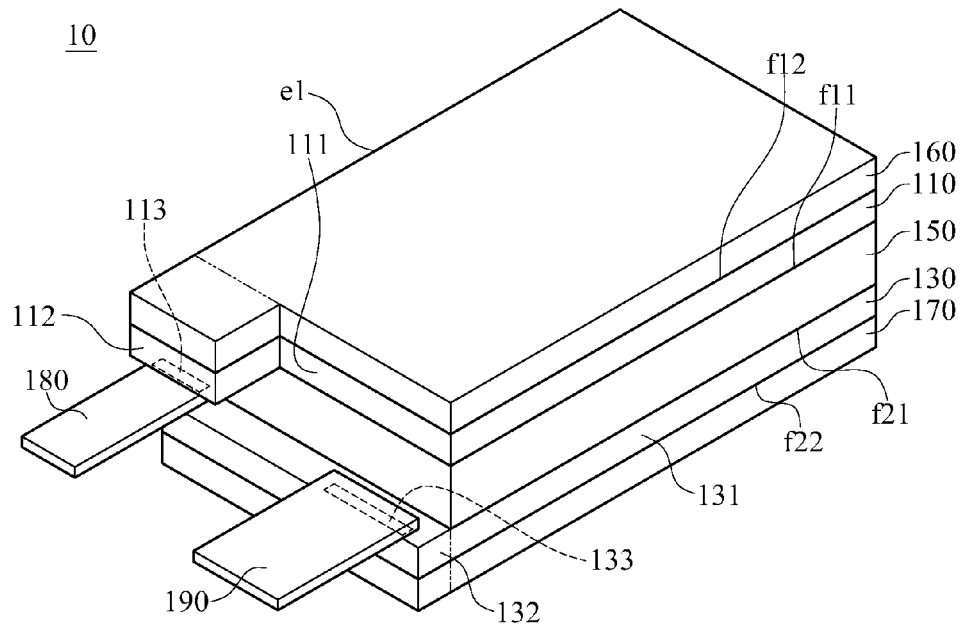
FIG. 1A is a perspective view of a flexible electronic device according to one embodiment of the present disclosure.
Figure 1B:
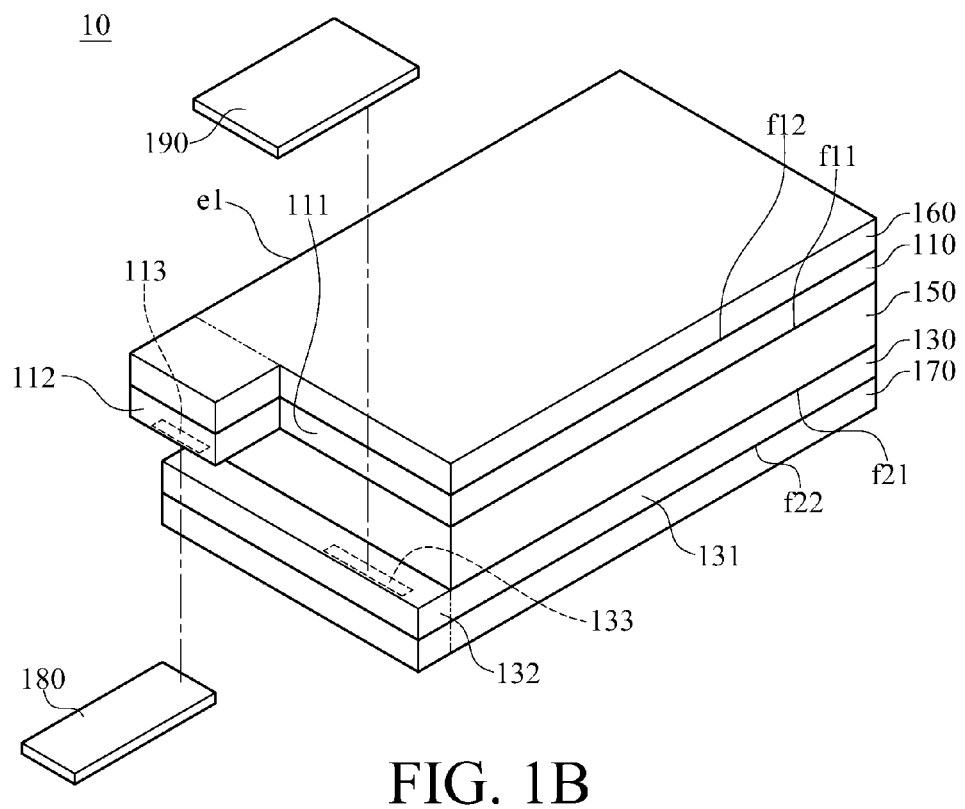
FIG. 1B is an exploded view of the flexible electronic device according to one embodiment of the present disclosure.
Figure 1D:
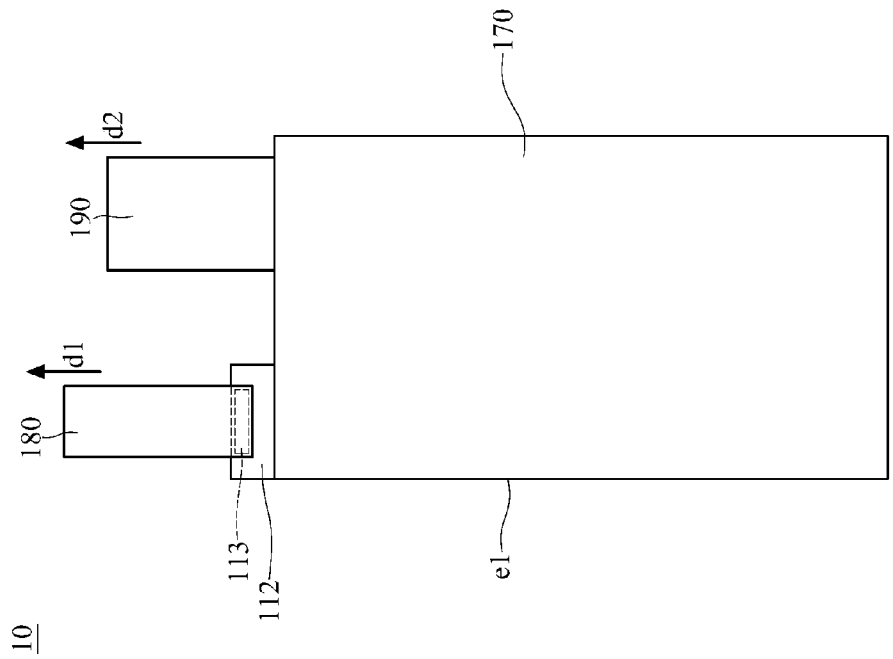
FIG. 1D is a bottom view of the flexible electronic device according to one embodiment of the present disclosure.
Figure 1C:
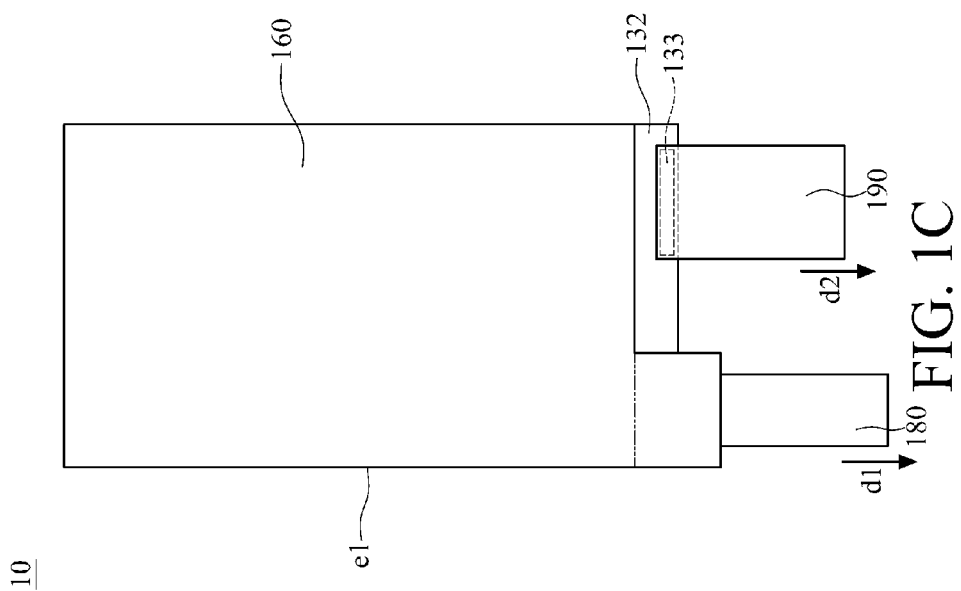
FIG. 1C is a top view of the flexible electronic device according to one embodiment of the present disclosure.
Figure 1E:
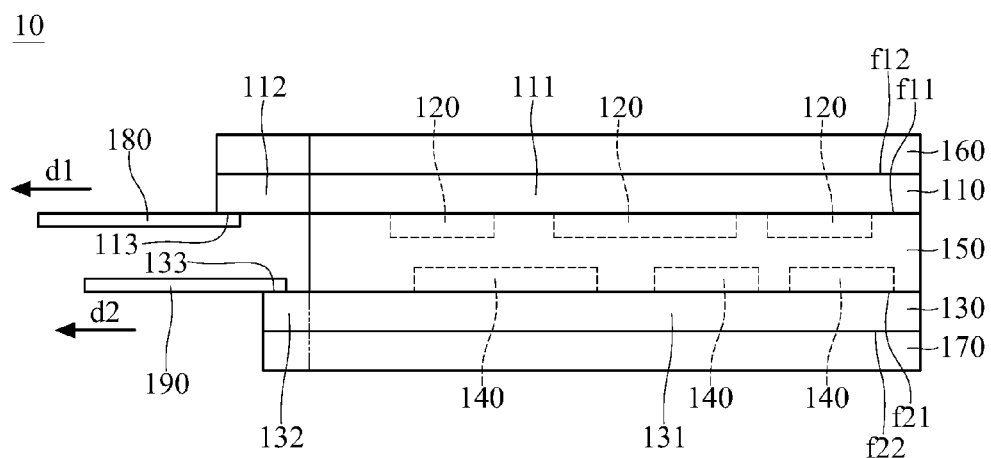
FIG. 1E is a side view of the flexible electronic device according to one embodiment of the present disclosure.

Please refer to FIGS. 1A to 1E, FIG. 1A is a perspective view of a flexible electronic device according to one embodiment of the present disclosure, FIG. 1B is an exploded view of the flexible electronic device according to one embodiment of the present disclosure, FIG. 1C is a top view of the flexible electronic device according to one embodiment of the present disclosure, FIG. 1D is a bottom view of the flexible electronic device according to one embodiment of the present disclosure, and FIG. 1E is a side view of the flexible electronic device according to one embodiment of the present disclosure. As shown in FIG. 1A to FIG. 1E, a flexible electronic device 10 includes a first flexible substrate 110, a first electronic component 120, a second flexible substrate 130, a second electronic component 140, an adhesive layer 150, a first protective layer 160, a second protective layer 170, a first flexible print circuit (FPC) 180 and a second FPC 190. Please refer to FIG. 1A to FIG. 1E.

The first flexible substrate 110 and the second flexible substrate 130 are made of a flexible material. The first electronic component 120 is, for example, a touch sensor or the touch sensor with a color filter, an optical structure, a water oxygen resistance structure or a combination of other components, the present disclosure is not limited thereto. The second electronic component 140 is, for example, an active-matrix organic light-emitting diode (AMOLED), an active matrix liquid crystal display (AMLCD), a passive matrix organic light emitting diode (PMOLED), or the other display devices, the present disclosure is not limited thereto. The adhesive layer 150 is, for example, made of a binder, but the present disclosure is not limited thereto. The first protective layer 160 is, for example, a protection film (PF), or a film having other functions, the present disclosure is limited thereto. The second protective layer 170 is, for example, a support film (SF), or a film having other functions, the present disclosure is not limited thereto.

The first protective layer 160, the first flexible substrate 110, the first electronic component 120, the adhesive layer 150, the second electronic component 140, the second flexible substrate 130 and the second protection layer 170 are stacked in sequence. The first flexible substrate 110 has a first surface f11 and a second surface f12 opposite to each other. The first electronic component 120 is disposed on the first face f11 of the first flexible substrate 110. The second flexible substrate 130 has a first surface f21 and a second surface f22 opposite to each other, and the first surface f21 of the second flexible substrate 130 faces the first surface f11 of the first flexible substrate 110. The second electronic component 140 is disposed on the first surface f21 of the second flexible substrate 130. The adhesive layer 150 is disposed between the first surface f11 of the first flexible substrate 110 and the first surface f21 of the second flexible substrate 130, and the first electronic component 120 and the second electronic component 140 are wrapped by the adhesive layer 150. As seen in FIG. 1E, it can also be interpreted that the first electronic component 120 and the second electronic component 140 are embedded in the adhesive layer 150. The first protection layer 160 is disposed on the second surface f12 of the first flexible substrate 110, and the second protection layer 170 is disposed on the second surface f22 of the second flexible substrate 130. The first protection layer 160 and the first flexible substrate 110 are the same in shape since the first protection layer 160 and the first flexible substrate 110 are produced by the same cutting process. Similarly, the second protection layer 170 and the second flexible substrate 130 are produced by the same cutting process, so the second protection layer 170 and the second flexible substrate 130 are the same in shape as well.

The first surface f11 of the first flexible substrate 110 has a first FPC bonding area 113 outside the adhesive layer 150, and an orthogonal projection of the first FPC bonding area 113 projected to a plane (not shown) where the second flexible substrate 130 is located does not overlap the second flexible substrate 130. That is, the orthogonal projection of the first FPC bonding area 113 projected to the plane (not shown), where the second flexible substrate 130 is located, is located outside an edge of the second flexible substrate 130. In other words, an orthogonal projection of the second flexible substrate 130 projected to the first flexible substrate 110 does not overlap the first FPC bonding area 113. In addition, the first surface f21 of the second flexible substrate 130 has a second FPC bonding area 133 outside the adhesive layer 150, and an orthogonal projection of the second FPC bonding area 133 projected to a plane (not shown) where the first flexible substrate 110 is located does not overlap the first flexible substrate 110. That is, the orthogonal projection of the second FPC bonding area 133 projected to the plane (not shown), where the first flexible substrate 110 is located, is located outside an edge of the first flexible substrate 110. In other words, an orthogonal projection of the first flexible substrate 110 projected to the second flexible substrate 130 does not overlap the second FPC bonding area 133. Hence, from the point of view from the second protection layer 170 to the first protection layer 160, when the first flexible print circuit 180 is not bonded to the first FPC bonding area 113, the first FPC bonding area 113 is not covered by the second flexible substrate 130 and the second protection layer 170 and exposed to outside. Similarly, from the point of view from the first protection layer 160 to the second protection layer 170, when the second FPC 190 is not bonded to the second FPC bonding area 133, the second FPC bonding area 133 is not covered by the first flexible substrate 110 and the first the first protection layer 160 and exposed to outside. In FIG. 1A to FIG. 1D, the covered first FPC bonding area 113 and the covered second FPC bonding area 133 are shown in dotted lines.

In more detail, the first flexible substrate 110 of the flexible electronic device 10 includes a first main body structure 111 and a first protruding structure 112. The first protruding structure 112 protrudes from an edge of the first main body structure 111, and the first FPC bonding area 113 is on the first protruding structure 112 so that the orthogonal projection of the first FPC bonding area 113 projected to the plane (not shown), where the second flexible substrate 130 is located, does not overlap the second flexible substrate 130. Similarly, the second flexible substrate 130 of the flexible electronic device 10 includes a second main body structure 131 and a second protruding structure 132. The second protruding structure 132 protrudes from an edge of the second main body structure 131, and the second FPC bonding area 133 is on the second protruding structure 132 so that the orthogonal projection of the second FPC bonding area 133 projected to the plane (not shown), where the first flexible substrate 110 is located, does not overlap the first flexible substrate 110. Accordingly, it is noted that the first protruding structure 112 is a part of the first flexible substrate 110 not in contact with the adhesive layer 150 and exposed to outside, and the second protruding structure 132 is a part of the second flexible substrate 130 not in contact with the adhesive layer 150 and exposed to outside.

In this embodiment, as shown in FIG. 1A to FIG. 1D, the first protruding structure 112 protrudes from the first main body structure 111 in a first direction d1, the second protruding structure 132 protrudes from the second main body structure 131 in a second direction d2, and the first direction d1 and the second direction d2 are the same direction. In addition, the first protruding structure 112 and the second protruding structure 132 are disposed on the same side of the flexible electronic device 10. For example, as shown in FIG. 1C, the first protruding structure 112 and the second protruding structure 132 are disposed on the bottom side of the flexible electronic device 10; as shown in FIG. 1D, the first protruding structure 112 and the second protruding structure 132 are disposed on the top side of the flexible electronic device 10; and as shown in FIG. 1E, the first protruding structure 112 and the second protruding structure 132 are disposed on the left side of the flexible electronic device 10.

Furthermore, as shown in FIG. 1A to FIG. 1D, the first FPC 180 is bonded to the first FPC bonding area 113 so that the first FPC 180 is stacked on the first flexible substrate 110.

Figure 12:
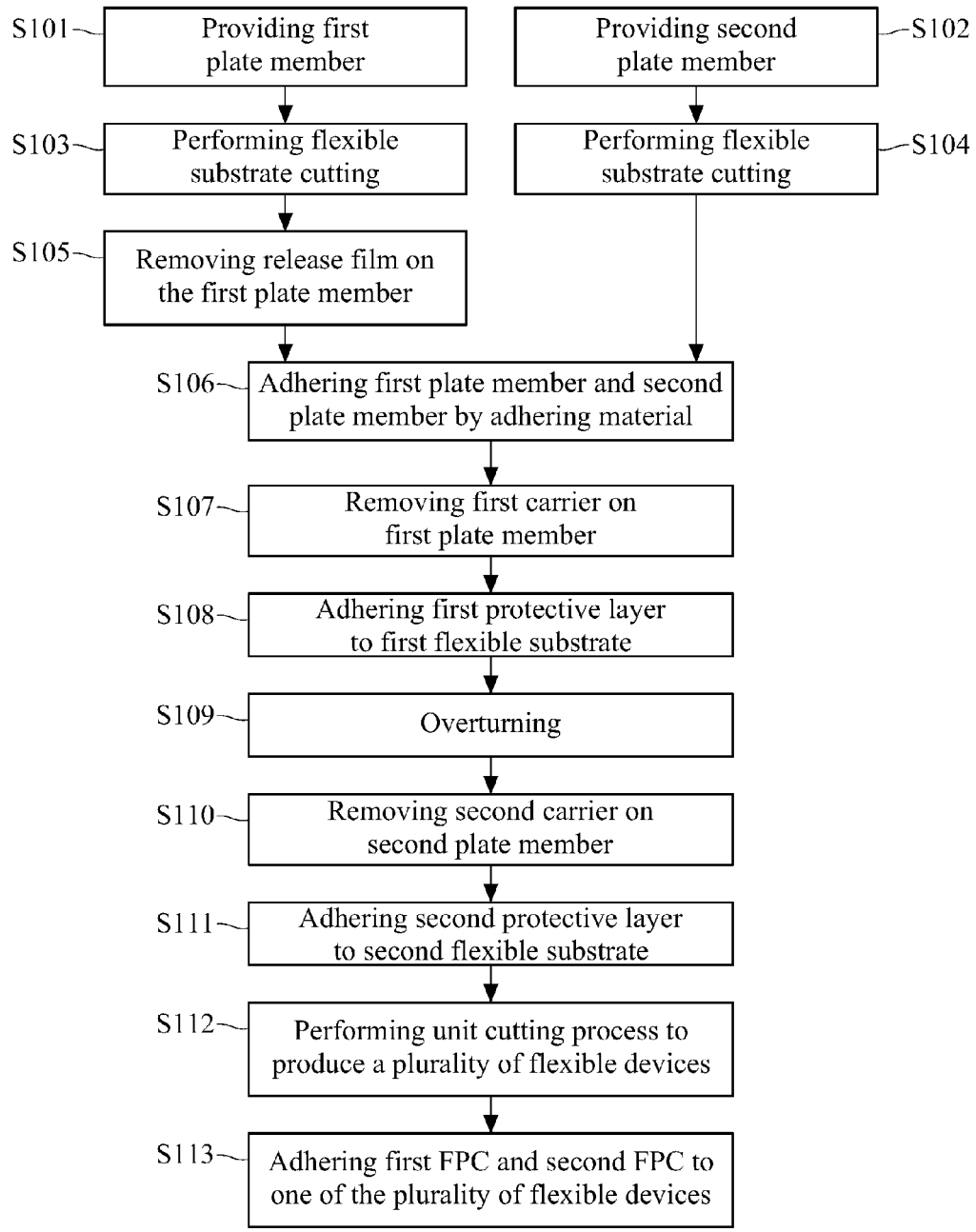
FIG. 12 is a flow chart of a method for manufacturing a flexible electronic device according to one embodiment of the present disclosure.

The second FPC 190 is bonded to the second FPC bonding area 133 so that the second FPC 190 is stack on the second flexible substrate 130. Before bonding the first FPC 180 or the second FPC 190, the first FPC bonding area 113 and the second FPC bonding area 133 are uncovered and exposed to outside. Thus, in a method for manufacturing the flexible electronic device 10, the step of bonding the first FPC 180 to the first FPC bonding area 113 and the step of bonding the second FPC 190 to the second FPC bonding area 133 may be the last two steps among the steps. In a production stage of the flexible electronic device 10, when the flexible substrate is removed from the carrier, a high stress occurs on the FPC bonding areas. If the step of bonding the FPC to the FPC bonding area is prior to the step of removing the flexible substrate from the carrier, the flexible electronic device would be damaged and a yield of the flexible electronic device 10 would be affected. Thus, when the step of bonding the FPC to the FPC bonding area is after the step of removing the flexible substrate from the carrier, a failure rate of manufacturing the flexible electronic device 10 can be largely reduced so as to advantage in manufacturing large size flexible electronic device. The related steps of manufacturing the flexible electronic device are described in the following embodiments as shown in FIGS. 12, 15 and 17.

In addition, appearances of the first protruding structure 112 and the second protruding structure 132 may be varied in shape. For example, as shown in FIG. 1A to FIG. 1E, a width of the first protruding structure 112 is less than a width of the first main body structure 111. However, in other embodiments, the width of the first protruding structure 112 may be the same as the width of the first protruding structure 112, the present disclosure is not limited thereto. In addition, as shown in FIGS. 1A to 1E, the width of the first protruding structure 112 is less than the width of the second protruding structure 132. However, in other embodiments, the width of the first protruding structure 112 may be greater than or the same as the width of the second protruding structure 132, the present disclosure is not limited thereto.

In this embodiment, the flexible substrate 110 has one first protruding structure 112, and the second flexible substrate 130 has one second protruding structure 132, but the present disclosure is not limited thereto. In other embodiments, the first flexible substrate 110 may have more than one first protruding structure 112, and the second flexible substrate 130 may have more than one second protruding structure 132.

In this embodiment, one of side edges of the first protruding structure 112 and one of side edges of the first main body structure 111 are aligned to each other. In other words, as shown in FIG. 1A to 1D, from a top view or a bottom view of the flexible electronic device 10, one of the side edges of the first protruding structure 112 and one of the side edges of the first main body structure 111 together form a straight line e1. The positions and the numbers of the first protruding structure 112 and the second protruding structure 132 (or the first FPC bonding area 113 and the second FPC bonding area 133) may be changed according to the wire arrangements on the first FPC 180 and the second FPC 190. For example, when manufacturing the flexible electronic device 10, wires may be arranged in a distributed or centralized manner so as to advantage a unit cutting step to proceed. In another case, the wires may be arranged in another manner so that the wires would not interfere with each other, and the noise can be prevented. It is understood that the positions and the numbers of the first protruding structure 112 and the second protruding structure 132 may be changed according to actual requirements.

The first flexible substrate 110 and the second flexible substrate 130 are respectively made of, for example, glass, metal foil, plastic material or polymer material. For example, polyimide (PI), polyimide with an inorganic mixture (hybrid PI), polyethylene terephthalate (PET), polyethersulfone (PES), polyacrylate (PA), polyethylene naphthalate (PEN), polycarbonate (PC), polynorbornene (PNB), polyetherimide (PEI), polyetheretherketone (PEEK), cyclo olefin polymer (COP), poly(methyl methacrylate) (PMMA), glass fiber reinforced plastic (GFRP), carbon fiber reinforced polymer (CFRP) and so on, or the other suitable flexible materials. Alternatively, the first flexible substrate 110 and the second flexible substrate 130 are respectively made of, for example, multilayer organic material or a multilayer inorganic material with a function of moisture resistance, but the present disclosure is not limited to the compositions and types of the first flexible substrate 110 and the second flexible substrate 130. In addition, the material of the first flexible substrate 110 may be the same or different from the material of the second flexible substrate 130.

The adhesive layer 150 is made of, for example, UV curable resin, thermosetting resin, epoxy resin, pressure sensitive adhesive (PSA). The first protective layer 160 and the second protective layer 170 are respectively made of, for example, plastic film having an adhesive layer such as PET, PC and PI. The materials of the protective film (PF) may be the same or different from the material of the support film (SF).

Figure 2A:
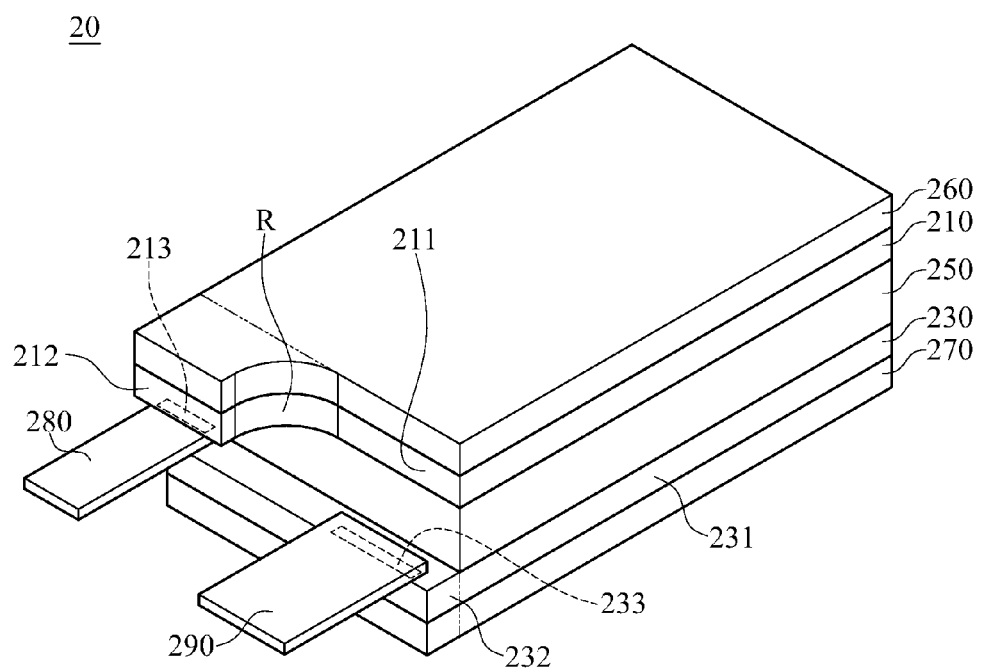
FIG. 2A is a perspective view of a flexible electronic device according to one embodiment of the present disclosure.

FIG. 2A is a perspective view of a flexible electronic device according to one embodiment of the present disclosure. FIG. 2B is a top view of the flexible electronic device according to one embodiment of the present disclosure. FIG. 2C is a bottom view of the flexible electronic device according to one embodiment of the present disclosure. As shown in FIG. 2A to FIG. 2C, the flexible electronic device 20 includes a first flexible substrate 210, a first electronic component 220 (not shown in figure), a second flexible substrate 230, a second electronic component 240 (not shown in figure), an adhesive layer 250, a first protection layer 260, a second protection layer 270, a first FPC 280, a second FPC 290, a first main body structure 211, a first protruding structure 212, a first FPC bonding area 213, a second main body structure 231, a second protruding structure 232, and a second FPC bonding area 233. The materials and components for achieving the aforementioned structures and the positions of the aforementioned structures similar to that in the aforementioned embodiment are not described hereinafter.

In this embodiment, a conjunction between the first protruding structure 212 and the first main body structure 211 has a cove cut R. In other words, a side of the first protruding structure 212 adjacent to the first main body structure 211 has a curved surface. The said cove cut structure R increases the structural strength of the conjunction between the first protruding structure 212 and the first main body structure 211 so as to reduce stress concentration occurring on the said conjunction.

Figure 3A:
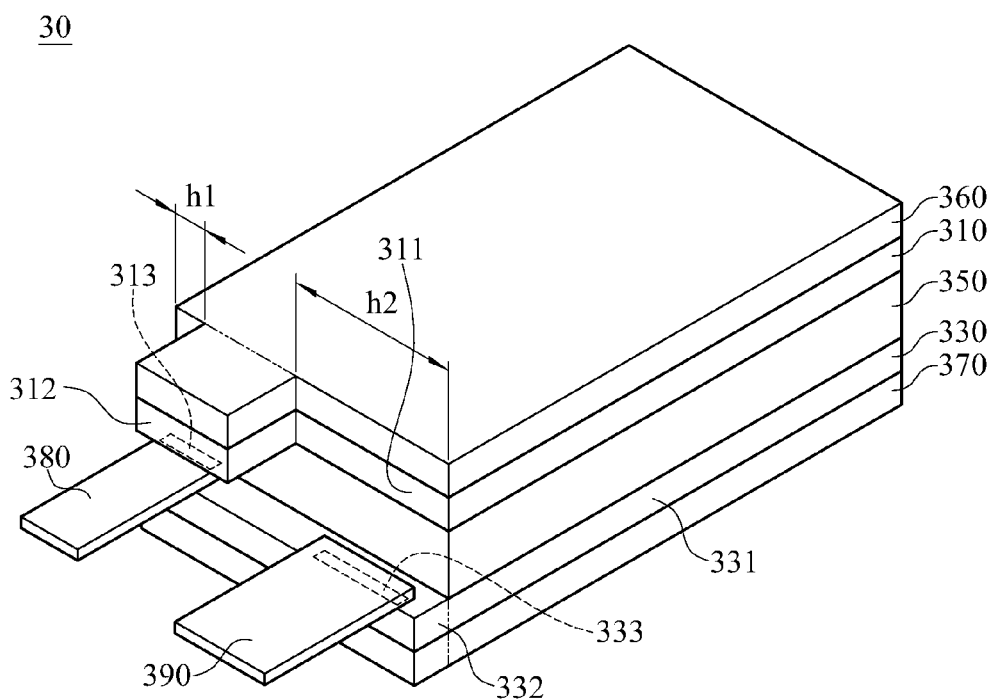
FIG. 3A is a perspective view of a flexible electronic device according to one embodiment of the present disclosure.

FIG. 3A is a perspective view of a flexible electronic device according to one embodiment of the present disclosure. FIG. 3B is a top view of the flexible electronic device according to one embodiment of the present disclosure. FIG. 3C is a bottom view of the flexible electronic device according to one embodiment of the present disclosure. As shown in FIG. 3A to 3C, the flexible electronic device 30 includes a flexible substrate 310, an electronic component 320 (not shown in figures), a second flexible substrate 330, a second electronic component 340 (not shown in figures), and an adhesive layer 350. In this embodiment, the flexible electronic device 30 further includes a first protection layer 360, a second protection layer 370, a first FPC 380, a second FPC 390, a first main body structure 311, a first protruding structure 312, a first FPC bonding area 313, a second main body structure 331, a second protruding structure 332, and a second FPC bonding area 333. The materials and components for achieving the aforementioned structures and the positions of the aforementioned structures similar to that in the aforementioned embodiments are not described hereinafter.

In this embodiment, one of side edges of the first protruding structure 312 and one of side edges of the first main body structure 311 are spaced apart by a distance. In other words, the side edges of the first protruding structure 312 does not align with the side edges of the first main body structure 311. As shown in FIGS. 3A to 3C, one of the side edges of the first protruding structure 312 and one of the side edges of the first main body structure 311 are spaced apart by a distance h1, and the opposite side edge of the first protruding structure 312 and the opposite side edge of the first main body structure 311 are spaced apart by a distance h2. Similarly, the positions and the numbers of the first protruding structure 312 and the second protruding structure 332 (or the first FPC bonding area 313 and the second FPC bonding area 333) may be changed according to the wire arrangement on the first FPC 380 and the second FPC 390. For example, when manufacturing the flexible electronic device 30, wires may be arranged in a distributed or centralized manner so as to advantage a unit cutting step to proceed. In another case, the wires may be arranged in another manner so that the wires would not interfere with each other, and the noise can be prevented. It is understood that the positions and the numbers of the first protruding structure 312 and the second protruding structure 332 may be changed according to actual requirements.

Figure 4A:
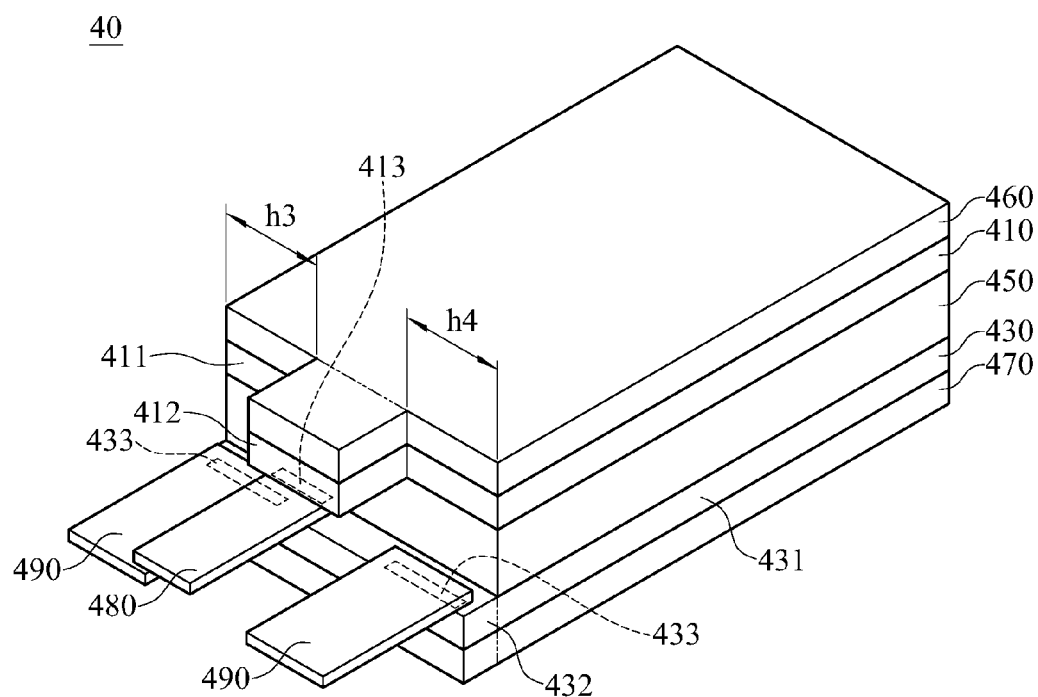
FIG. 4A is a perspective view of a flexible electronic device according to one embodiment of the present disclosure.

FIG. 4A is a perspective view of a flexible electronic device according to one embodiment of the present disclosure. FIG. 4B is a top view of the flexible electronic device according to one embodiment of the present disclosure. FIG. 4C is a bottom view of the flexible electronic device according to one embodiment of the present disclosure. As shown in FIG. 4A to 4C, the flexible electronic device 40 includes a first flexible substrate 410, a first electronic component 420 (not shown in figures), a second flexible substrate 430, a second electronic component 440 (not shown in figures), an adhesive layer 450, a protection layer 460, a second protection layer 470, a first FPC 480, two second FPCs 490, a first main body structure 411, a first protruding structure 412, a first FPC bonding area 413, a second main body structure 431, a second protruding structure 432 and two second FPC bonding areas 433. The materials and components for achieving the aforementioned structures and the positions of the aforementioned structures similar to that in the aforementioned embodiments are not described hereinafter.

In this embodiment, there are two second FPC bonding areas 433 on the second protruding structure 432 of the second flexible substrate 430 for the two second FPCs 490 to dispose. However, the present disclosure is not limited to the number of the second FPC bonding areas 433 (or the second FPCs 490) on the second protruding structure 432; it may be changed according to actual requirements.

In addition, in this embodiment, side edges of the first protruding structure 412 and side edges of the first main body structure 411 are spaced apart by a distance. As shown in FIGS. 4A to 4C, one of the side edges of the first protruding structure 412 and one of the side edges of the first main body structure 411 are spaced apart by a distance h3, and the opposite side edge of the first protruding structure 412 and the opposite side edge of the first main body structure 411 are spaced apart by a distance h4.

In this embodiment, the positions of the two second FPC 490 (or the two second FPC bonding areas 433) respectively correspond to the ranges of the distances h3 and h4.

Figure 5A:
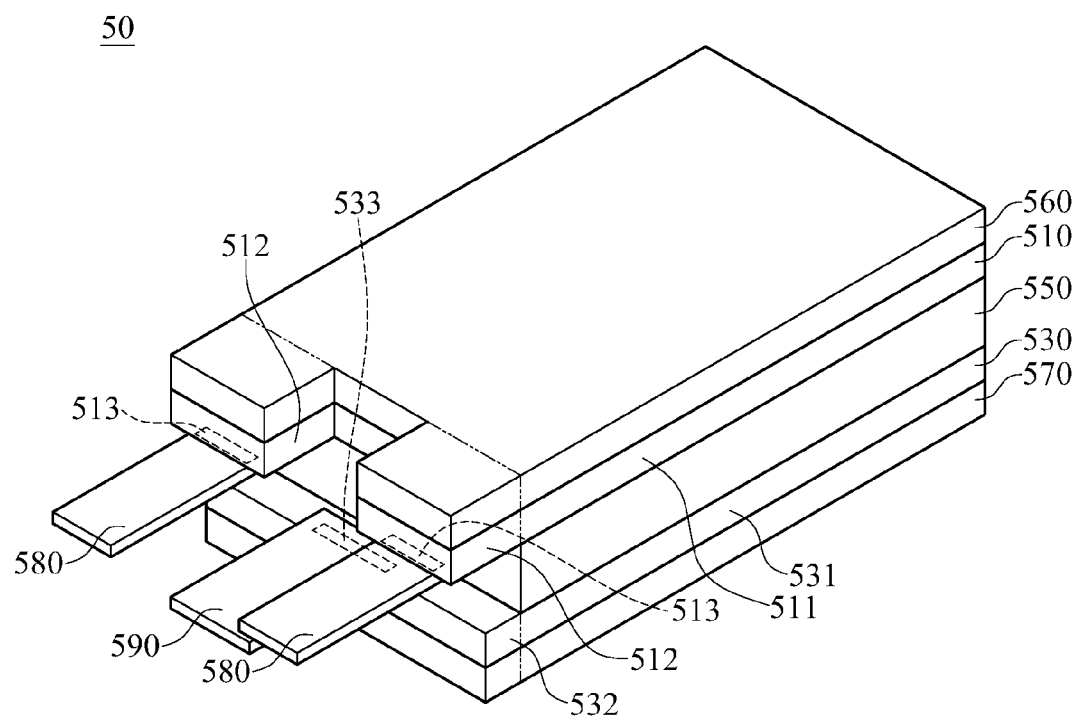
FIG. 5A is a perspective view of a flexible electronic device according to one embodiment of the present disclosure.
Figure 5C:
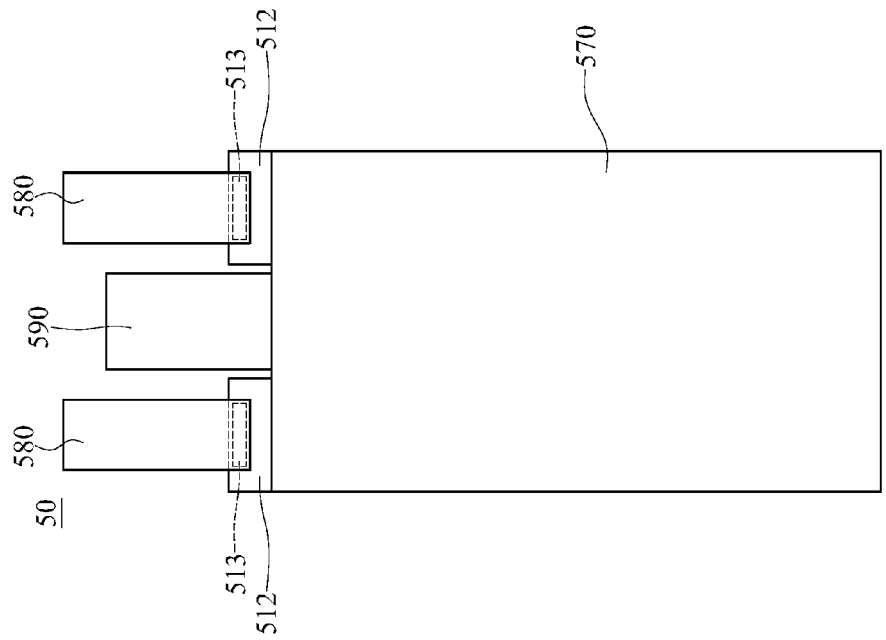
FIG. 5C is a bottom view of the flexible electronic device according to one embodiment of the present disclosure.
Figure 5B:
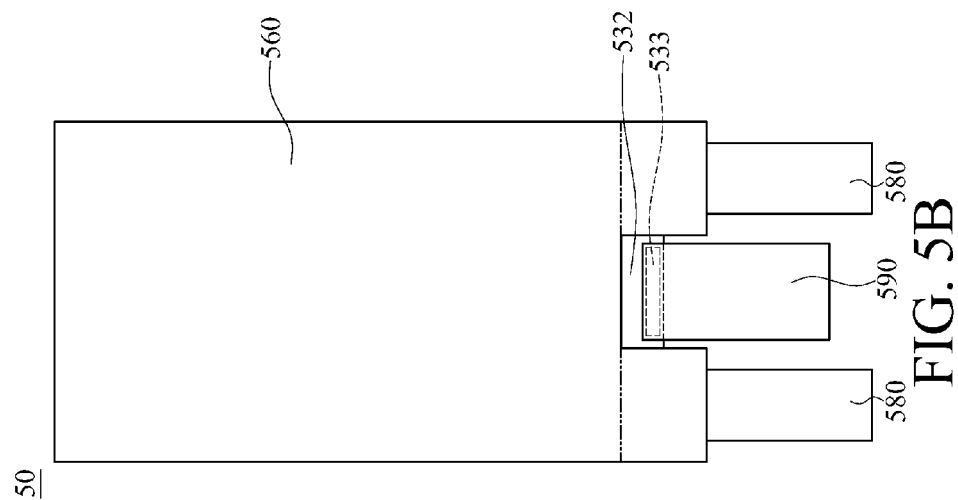
FIG. 5B is a top view of the flexible electronic device according to one embodiment of the present disclosure.

FIG. 5A is a perspective view of a flexible electronic device according to one embodiment of the present disclosure. FIG. 5B is a top view of the flexible electronic device according to one embodiment of the present disclosure. FIG. 5C is a bottom view of the flexible electronic device according to one embodiment of the present disclosure. As shown in FIG. 5A to 5C, the flexible electronic device 50 includes a first flexible substrate 510, a first electronic component 520 (not shown in figures), a second flexible substrate 530, a second electronic component 540 (not shown in figures), an adhesive layer 550, a first protection layer 560, a second protection layer 570, two first FPCs 580, a second FPC 590, a first main body structure 511, two first protruding structures 512, two first FPC bonding areas 513, a second main body structure 531, a second protruding structure 532 and a second FPC bonding area 533. The materials and components for achieving the aforementioned structures and the positions of the aforementioned structures similar to that in the aforementioned embodiments are not described hereinafter.

In this embodiment, the number of the first protruding structures 512 on the first flexible substrate 510 is two. In such a case, the numbers of the first FPC bonding areas 513 and the first FPCs 580 are both two.

In this embodiment, from the top view of FIGS. 5A to 5C, the second FPC 590 (or the second FPC bonding area 533) is located between the two first protruding structures 512.

Figure 6A:
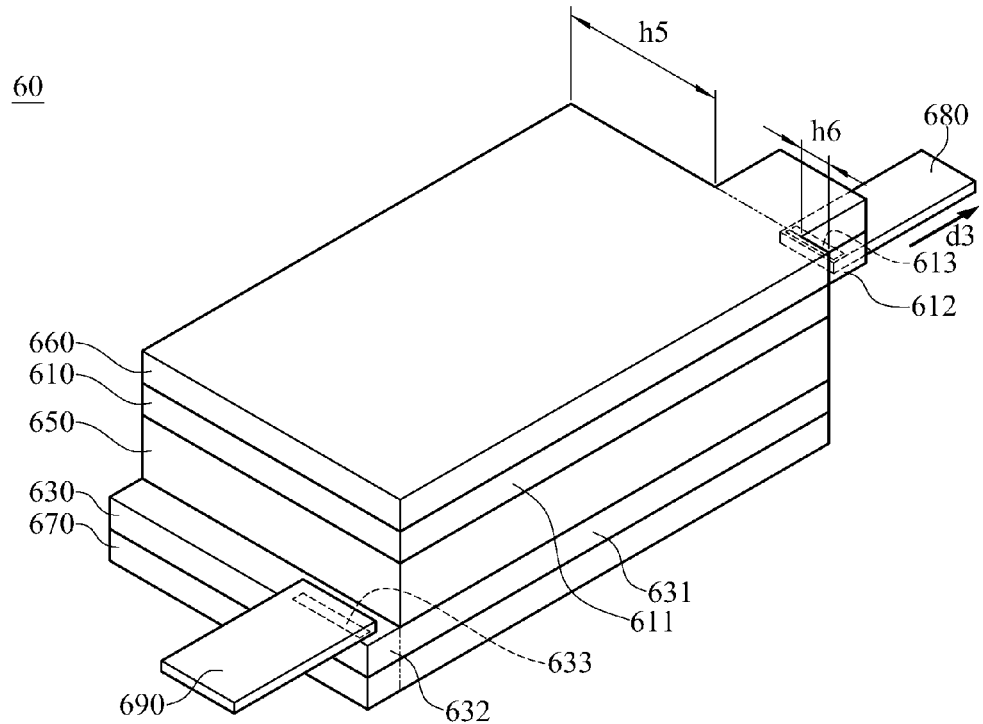
FIG. 6A is a perspective view of a flexible electronic device according to one embodiment of the present disclosure.
Figure 6B:
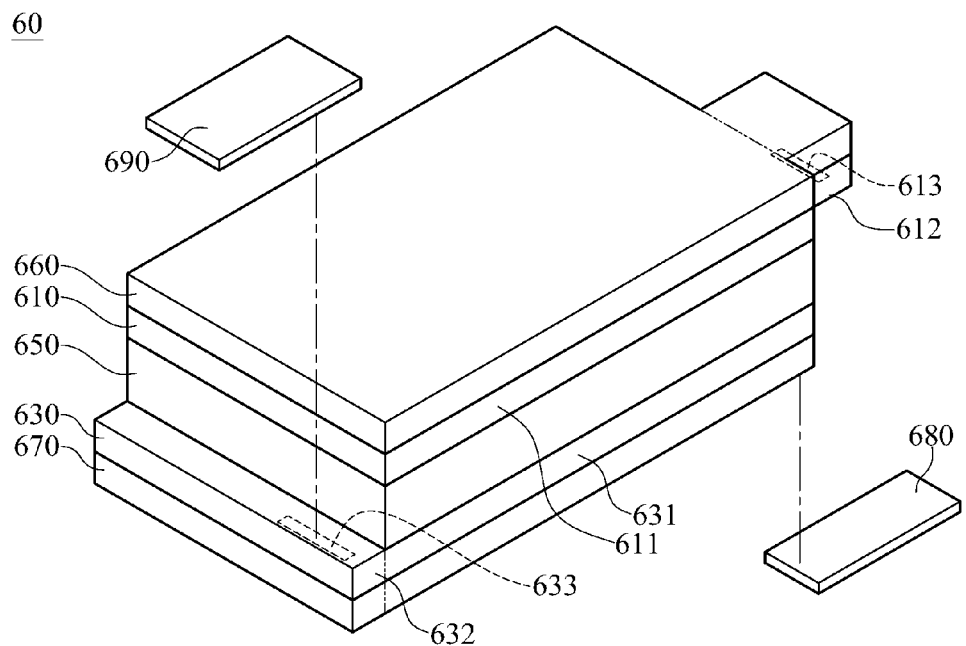
FIG. 6B is an exploded view of the flexible electronic device according to one embodiment of the present disclosure.
Figure 6C:
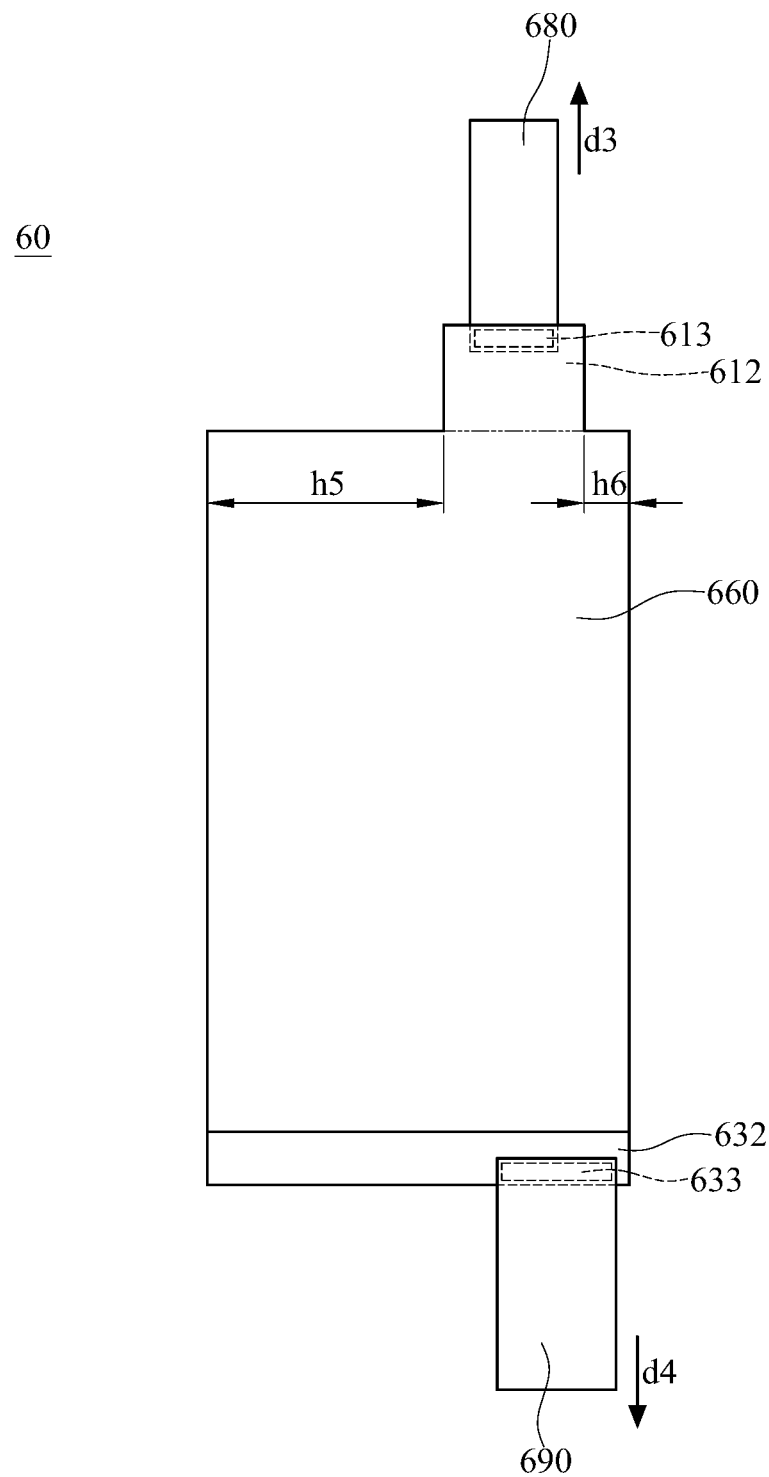
FIG. 6C is a top view of the flexible electronic device according to one embodiment of the present disclosure.
Figure 6D:
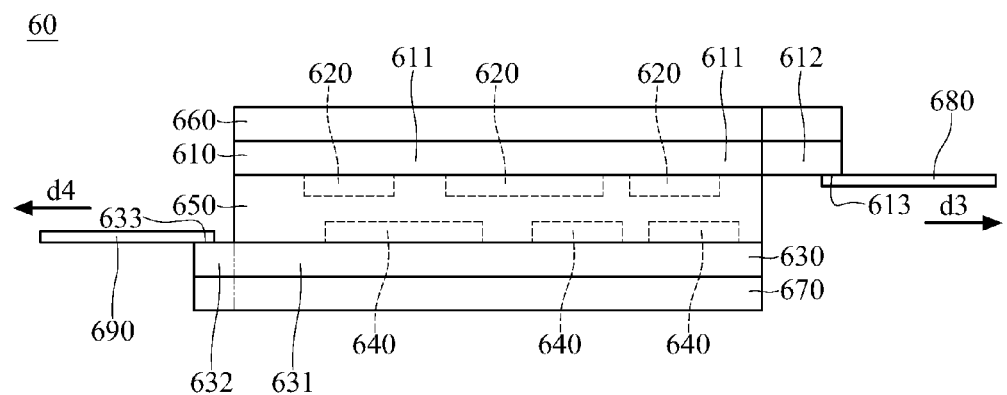
FIG. 6D is a side view of the flexible electronic device according to one embodiment of the present disclosure.

FIG. 6A is a perspective view of a flexible electronic device according to one embodiment of the present disclosure. FIG. 6B is an exploded view of the flexible electronic device according to one embodiment of the present disclosure. FIG. 6C is a top view of the flexible electronic device according to one embodiment of the present disclosure. FIG. 6D is a side view of the flexible electronic device 60 according to one embodiment of the present disclosure. As shown in FIG. 6A to 6D, the flexible electronic device 60 includes a first flexible substrate 610, a first electronic component 620, a second flexible substrate 630, a first electronic component 640, an adhesive layer 650, a first protection layer 660, a second protection layer 670, a first FPC 680, a second PFC 690, a first main body structure 611, a first protruding structure 612, a first FPC bonding area 613, a second main body structure 631, a second protruding structure 632, and a second FPC bonding area 633. The materials and components for achieving the aforementioned structures and the positions of the aforementioned structures similar to that in the aforementioned embodiments are not described hereinafter.

In this embodiment, the first protruding structure 612 protrudes from the first main body structure 611 in a first direction d3, the second protruding structure 632 protrudes from the second main body structure 631 in a second direction d4, and the first direction d3 and the second direction d4 are opposite directions. In other words, the first protruding structure 612 and the second protruding structure 632 are respectively disposed on two opposite sides of the flexible electronic device 60. For example, as shown in FIG. 6C, the first protruding structure 612 and the second protruding structure 632 are respectively disposed on top side and bottom side of the flexible electronic device 60; as shown in FIG. 6D, the first protruding structure 612 and the second protruding structure 632 are respectively disposed on right side and left side of the flexible electronic device 60.

In addition, in this embodiment, side edges of the first protruding structure 612 and side edges of the first main body structure 611 are spaced apart by a distance. As shown in FIG. 6A to FIG. 6C, one of the side edges of the first protruding structure 612 and one of the side edges of the first main body structure 611 are spaced apart by a distance h5, and the opposite side edge of the first protruding structure 612 and the opposite side edge of the first main body structure 611 are spaced apart by a distance h6.

The sizes of the distances h5 and h6 may be changed, but the present disclosure is not limited thereto. For example, in this embodiment, the distances h5 and h6 are both larger than zero. In other embodiments, one of the distances h5 and h6 may be zero. In such a case, one of the side edges of the first protruding structure 612 aligns with one of the side edges of the first main body structure 611.

Figure 7A:
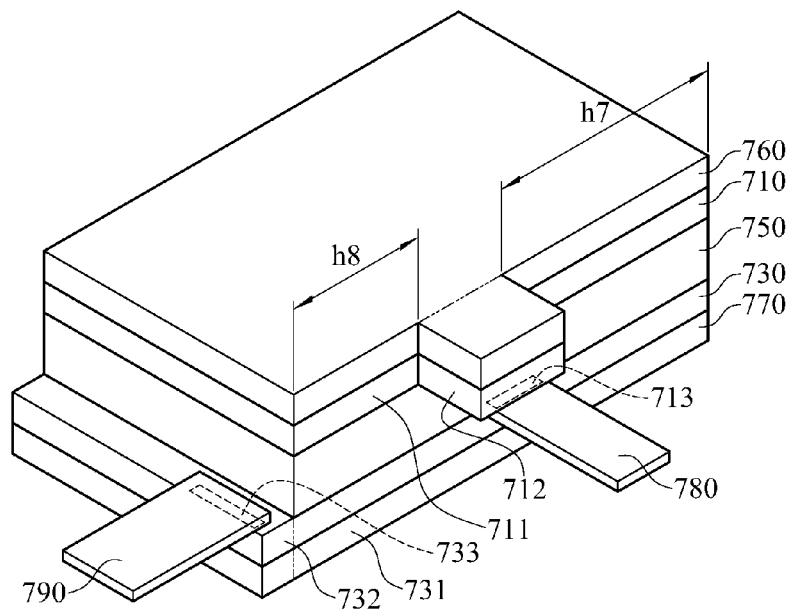
FIG. 7A is a perspective view of a flexible electronic device according to one embodiment of the present disclosure.
Figure 7B:
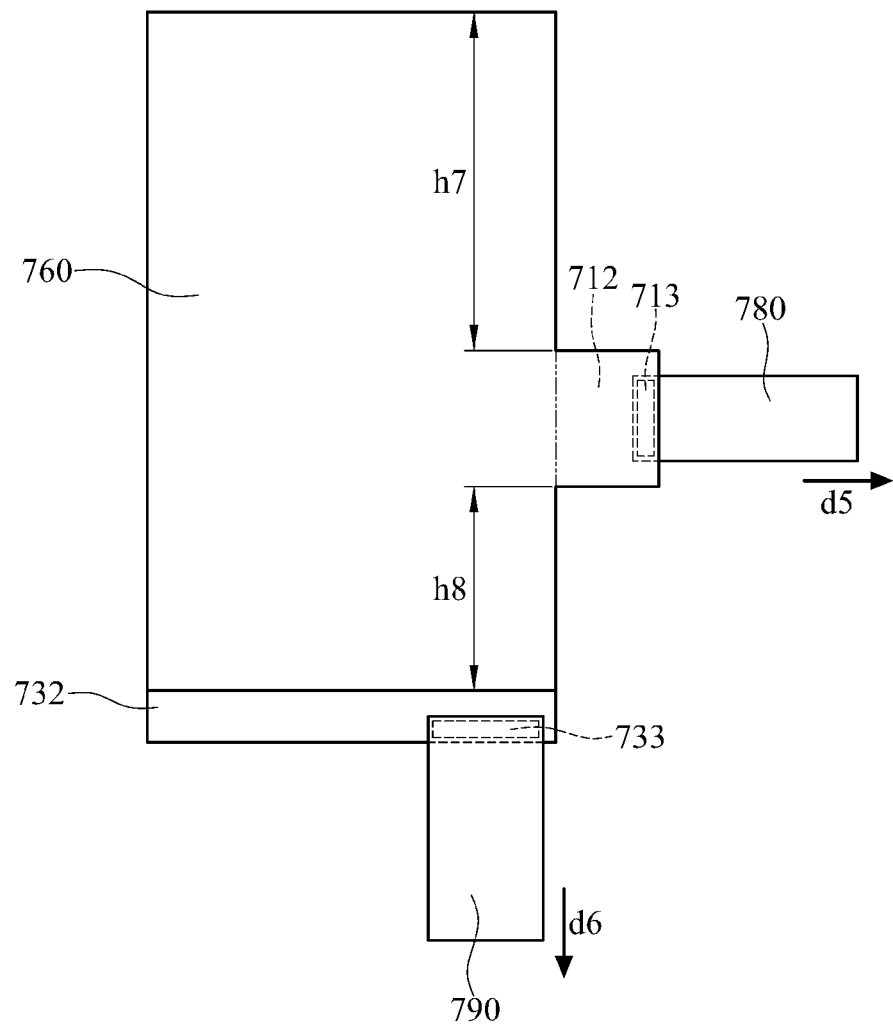
FIG. 7B is a top view of the flexible electronic device according to one embodiment of the present disclosure.

FIG. 7A is a perspective view of a flexible electronic device according to one embodiment of the present disclosure. FIG. 7B is a top view of the flexible electronic device according to one embodiment of the present disclosure. As shown in FIG. 7A to FIG. 7B, the flexible electronic device 70 includes a first flexible substrate 710, a first electronic component 720 (not shown in figure), a second flexible substrate 730, a second electronic component 740 (not shown in figure), an adhesive layer 750, a first protection layer 760, a second protection layer 770, a first FPC 780, a second FPC 790, a first main body structure 711, a first protruding structure 712, a first FPC bonding area 713, a second main body structure 731, a second protruding structure 732 and a second FPC bonding area 733. The materials and components for achieving the aforementioned structures and the positions of the aforementioned structures similar to that in the aforementioned embodiments are not described hereinafter.

In this embodiment, the first protruding structure 712 protrudes from the first main body structure 711 in a first direction d5, the second protruding structure 732 protrudes from the second main body structure 731 in a second direction d6, and the first direction d5 and the second direction d6 are perpendicular to each other. In other words, the first protruding structure 712 and the second protruding structure 732 are respectively disposed on two adjacent sides of the flexible electronic device 70. For example, as shown in FIG. 7B, the first protruding structure 712 and the second protruding structure 732 are respectively disposed on right side and bottom side of the flexible electronic device 70.

In addition, in this embodiment, side edges of the first protruding structure 712 and side edges of the first main body structure 711 are spaced apart by a distance. As shown in FIG. 7A to FIG. 7B, one of the side edges of the first protruding structure 712 and one of the side edges of the first main body structure 711 are spaced apart by a distance h7, and the opposite side edge of the first protruding structure 712 and the opposite side edge of the first main body structure 711 are spaced apart by a distance h8.

The sizes of the distances h7 and h8 may be changed, but the present disclosure is not limited thereto. For example, in this embodiment, the distances h7 and h8 are both larger than zero. In other embodiments, one of the distances h7 and h8 may be zero. In such a case, one of the side edges of the first protruding structure 712 aligns with one of the side edges of the first main body structure 711.

Figure 8A:
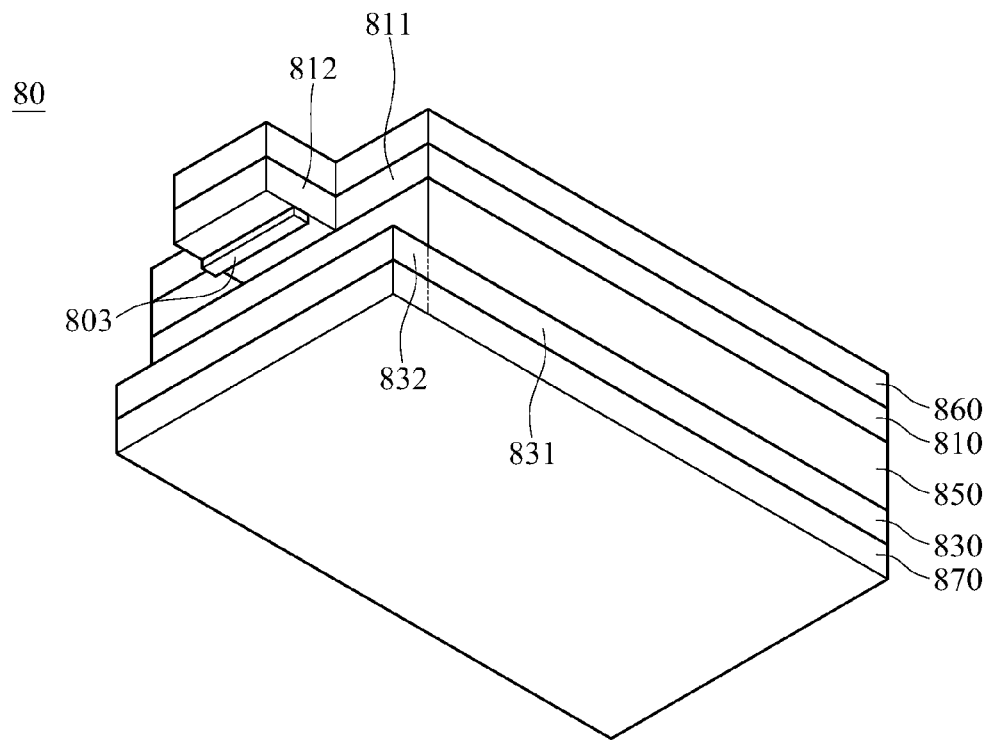
FIG. 8A is a perspective view of a flexible electronic device according to one embodiment of the present disclosure.
Figure 8B:
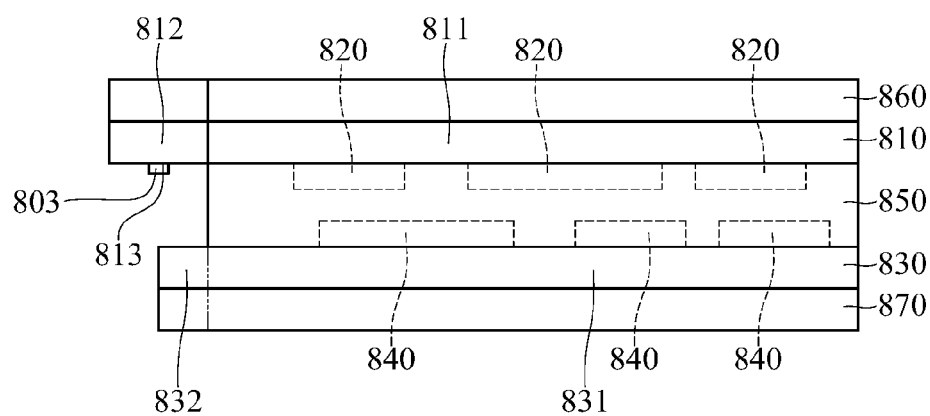
FIG. 8B is a side view of the flexible electronic device according to one embodiment of the present disclosure.

FIG. 8A is a perspective view of a flexible electronic device according to one embodiment of the present disclosure. FIG. 8B is a side view of the flexible electronic device according to one embodiment of the present disclosure. As shown in FIG. 8A to FIG. 8B, the flexible electronic device 80 includes a first flexible substrate 810, a first electronic component 820 (not shown in figure), a second flexible substrate 830, a second electronic component 840 (not shown in figure), an adhesive layer 850, a first protection layer 860, a second protection layer 870, a first main body structure 811, a first protruding structure 812, a first FPC bonding area 813, a second main body structure 831, a second protruding structure 832, and a second FPC bonding area (not shown in figure). For the purpose of clearly illustrating the flexible electronic device 80, the first FPC and the second FPC are omitted in FIG. 8A to FIG. 8B. In other words, the first FPC and the second FPC are not bonded to the flexible electronic device 80 yet. In addition, the materials and components for achieving the aforementioned structures and the positions of the aforementioned structures similar to that in the aforementioned embodiments are not described hereinafter.

In this embodiment, the flexible electronic device 80 further includes a first barrier layer 803 disposed on a first surface f11 of the first flexible substrate 810, and an orthogonal projection of the first barrier layer 803 projected to a plane (not shown) where the second flexible substrate 830 is located at least partially overlaps one of edges of the second flexible substrate 830. The flexible electronic device 80 is produced by a partial cutting process to partially cut the first plate member and the second plate member adhered to each other. The partial cutting process is described in detail in the following paragraphs. The first barrier layer 803 is disposed on a cutting path in the first FPC bonding area 813 in order to prevent the first protruding structure 812 and the first FPC bonding area 813 from being damaged during the partial cutting process. The first barrier layer 803 is disposed on a first surface f11 of the first flexible substrate 810, that is, the first barrier layer 803 is disposed on a surface facing the second flexible substrate 830. Therefore, the partial cutting process may be conducted to cut the flexible electronic device 80 from the second protection layer 870 to the first barrier layer 803 but without damaging the first FPC bonding area 813.

Similarly, in other embodiments, the flexible electronic device 80 may further include a second barrier layer (not shown in figure) disposed on a first surface f21 of the second flexible substrate 830, and an orthogonal projection of the second barrier layer projected to the first flexible substrate 810 at least partially overlaps one of edges of the first flexible substrate 810. The purpose of the second barrier layer is similar to that of the first barrier layer; therefore, the related description thereof is omitted.

In addition, the position and number of the first barrier layer 803 or the second barrier layer may be changed according to the wire arrangement on the first FPC or the second FPC. For example, when manufacturing the flexible electronic device 80, wires may be arranged in a distributed or centralized manner so as to advantage a unit cutting step to proceed. In another case, the wires may be arranged in another manner so that the wires would not interfere with each other, and the noise can be prevented. It is understood that the position and the number of the first barrier layer 803 or the second barrier layer may be changed according to actual requirements.

Figure 9A:
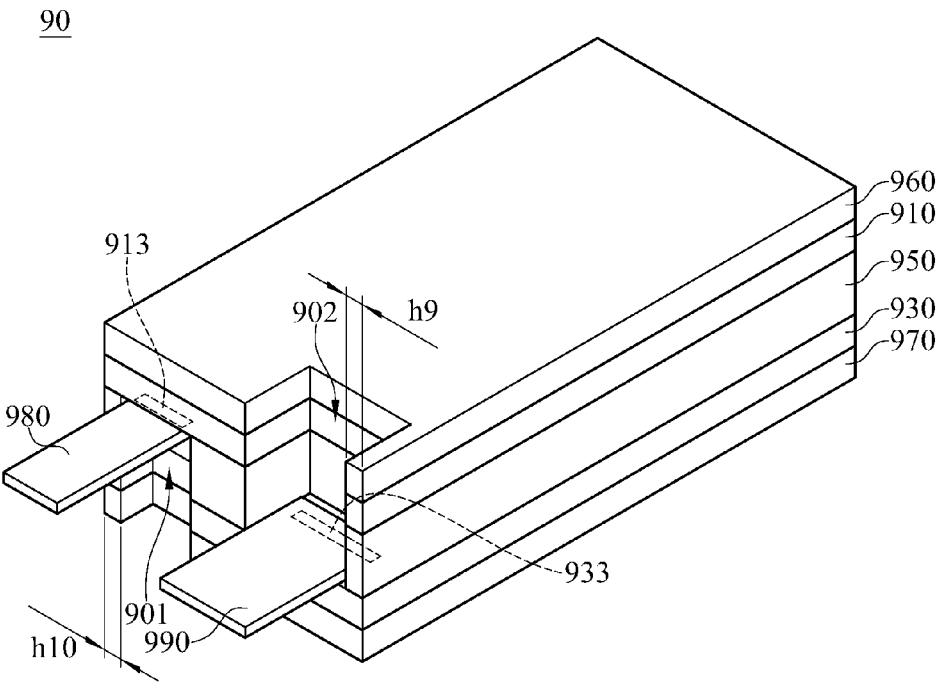
FIG. 9A is a perspective view of a flexible electronic device according to one embodiment of the present disclosure.
Figure 9B:
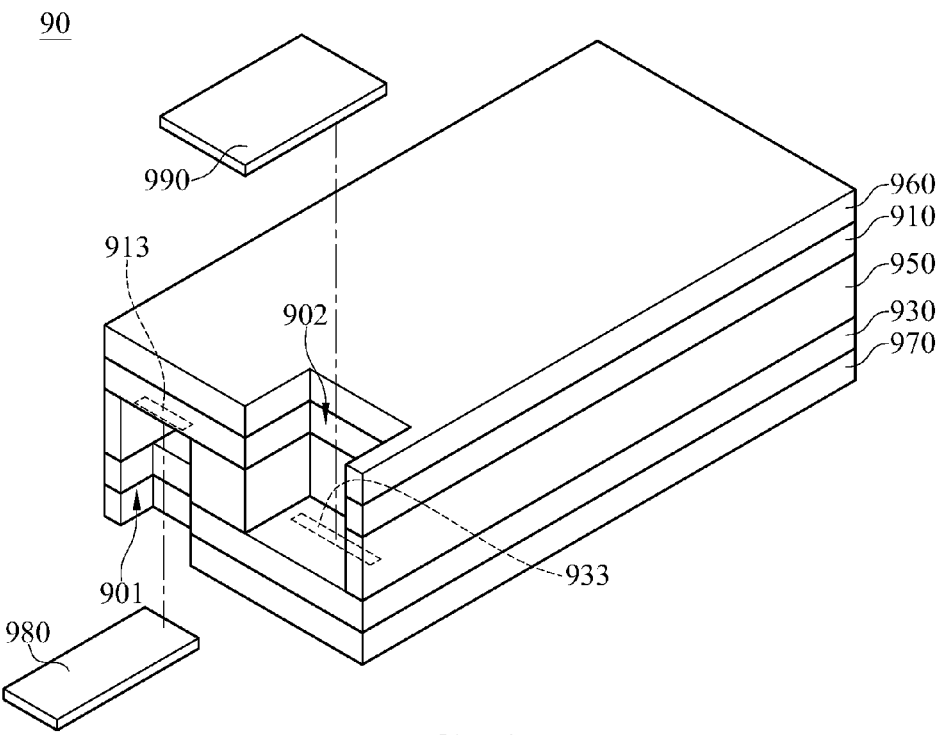
FIG. 9B is an exploded view of the flexible electronic device according to one embodiment of the present disclosure.
Figure 9E:
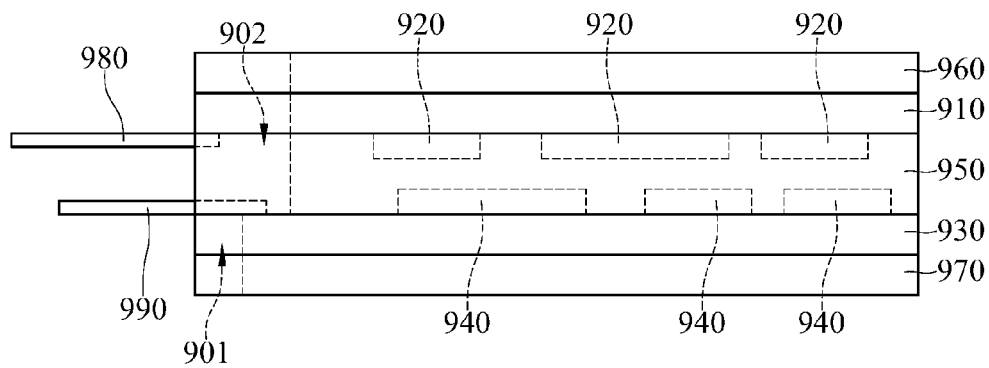
FIG. 9E is a side view of the flexible electronic device according to one embodiment of the present disclosure.

FIG. 9A is a perspective view of a flexible electronic device according to one embodiment of the present disclosure. FIG. 9B is an exploded view of the flexible electronic device according to one embodiment of the present disclosure. FIG. 9C is a top view of the flexible electronic device according to one embodiment of the present disclosure. FIG. 9D is a bottom view of the flexible electronic device according to one embodiment of the present disclosure. FIG. 9E is a side view of the flexible electronic device according to one embodiment of the present disclosure. As shown in FIG. 9A to FIG. 9E, the flexible electronic device 90 includes a first flexible substrate 910, a first electronic component 920, a second flexible substrate 930, a second electronic component 940, an adhesive layer 950, a first protection layer 960, a second protection layer 970, a first FPC 980, a second FPC 990, a first FPC bonding area 913, and a second FPC bonding area 933. The materials or components for achieving the aforementioned structures similar to that in the aforementioned embodiments are not described hereinafter.

In this embodiment, the flexible electronic device 90 further includes a first notch 901. The first notch 901 is formed on the second protection layer 970, the second flexible substrate 930 and the adhesive layer 950 to leave the first FPC bonding area 913 exposed. Wherein, the first notch 901 extents from a second surface of the second flexible substrate 930 to a first surface of the first flexible substrate 910 to leave the first FPC bonding area 913 exposed. In addition, the adhesive layer 950 surrounding the first notch 901 is used to adhere the first flexible substrate 910 and the second flexible substrate 930 to maintain a contour of the flexible electronic device 90, and thereby increasing the structural strength of the structure around the first FPC bonding area 913 and the first notch 901.

Furthermore, in this embodiment, the flexible electronic device 90 further includes a second notch 902. The second notch 902 is formed on the first protection layer 960, the first flexible substrate 910 and the adhesive layer 950 to leave the second FPC bonding area 933 exposed. Wherein, the second notch 902 extents from a second surface of first flexible substrate 910 to a first surface of the second flexible substrate 930 to leave the second FPC bonding area 933 exposed. In addition, the adhesive layer 950 surrounding the second notch 902 is used to adhere the first flexible substrate 910 and the second flexible substrate 930 so that the structural strength of the structure around the second FPC bonding area 933 and the second notch 902 is increased.

In this embodiment, the first notch 901 and the second notch 902 are disposed on the same side of the flexible electronic device 90, for example, as shown in FIG. 9B, the first notch 901 and the second notch 902 are disposed on bottom side of the flexible electronic device 90; as shown in FIG. 9C, the first notch 901 and the second notch 902 are disposed on top side of the flexible electronic device 90; as shown in FIG. 9D, the first notch 901 and the second notch 902 are disposed on left side of the flexible electronic device 90. However, the present discourse is not limited to the positions of the first notch 901 and the second notch 902. In other embodiments, the first notch 901 and the second notch 902 may be formed on different sides (e.g. adjacent sides or opposite sides) of the flexible electronic device 90.

In this embodiment, the first notch 901 is located on one of side edges of the flexible electronic device 90, but does not align with the adjacent side edge of the flexible electronic device 90. One of side edges of the first notch 901 and the adjacent one of side edges of the flexible electronic device 90 are spaced apart by a distance h10. In addition, the second notch 902 is located on one of side edges of the flexible electronic device 90, but does not align with the adjacent side edge of the flexible electronic device 90, either. One of side edges of the second notch 902 and the adjacent one of side edges of the flexible electronic device 90 are spaced apart by a distance h9.

In addition, the flexible electronic device 90 has one first notch 901 and one second notch 902, but the present disclosure is not limited thereto. In other embodiments, the flexible electronic device 90 may have more than one first notch 901 and more than one second notch 902. Similarly, the positions and numbers of the first notch 901 and the second notch 902 (or the first FPC bonding area 913 and the second FPC bonding area 933) may be changed according to the wire arrangements on the first FPC 980 and the second FPC 990. For example, when manufacturing the flexible electronic device 90, wires may be arranged in a distributed or centralized manner so as to advantage a unit cutting step to proceed. In another case, the wires may be arranged in another manner so that the wires would not interfere with each other, and the noise can be prevented. It is understood that the positions and the numbers of the first notch 901 and the second notch 902 may be changed according to actual requirements.

The first FPC 980 is able to be bonded to the first FPC bonding area 913 and stacked on the first flexible substrate 910, and the second FPC 990 is able to be bonded to the second FPC bonding area 933 and stacked on the second flexible substrate 930, as shown in FIG. 9A to FIG. 9D. Before bonding the first FPC 980 or the second FPC 990, the first FPC bonding area 913 and the second FPC bonding area 933 are uncovered and exposed to outside. Thus, in a method for manufacturing the flexible electronic device 90, the step of bonding the first FPC 980 to the first FPC bonding area 913 and the step of bonding the second FPC 990 to the second FPC bonding area 933 may be the last two steps. In production stage of the flexible electronic device 90, when the flexible substrate is removed from the carrier, a high stress occurs on the FPC bonding areas. If the step of bonding the FPC to the FPC bonding area is prior to the step of removing the flexible substrate from the carrier, the flexible electronic device would be damaged and a yield of the flexible electronic device 90 would be affected. Thus, when the step of bonding the FPC to the FPC bonding area is after the step of removing the flexible substrate from the carrier, a failure rate of manufacturing the flexible electronic device 90 may be largely reduced so as to advantage in manufacturing large size flexible electronic device. The related steps of manufacturing the flexible electronic device are described in the following embodiments as shown in FIGS. 12, 15 and 17.

Figure 10A:
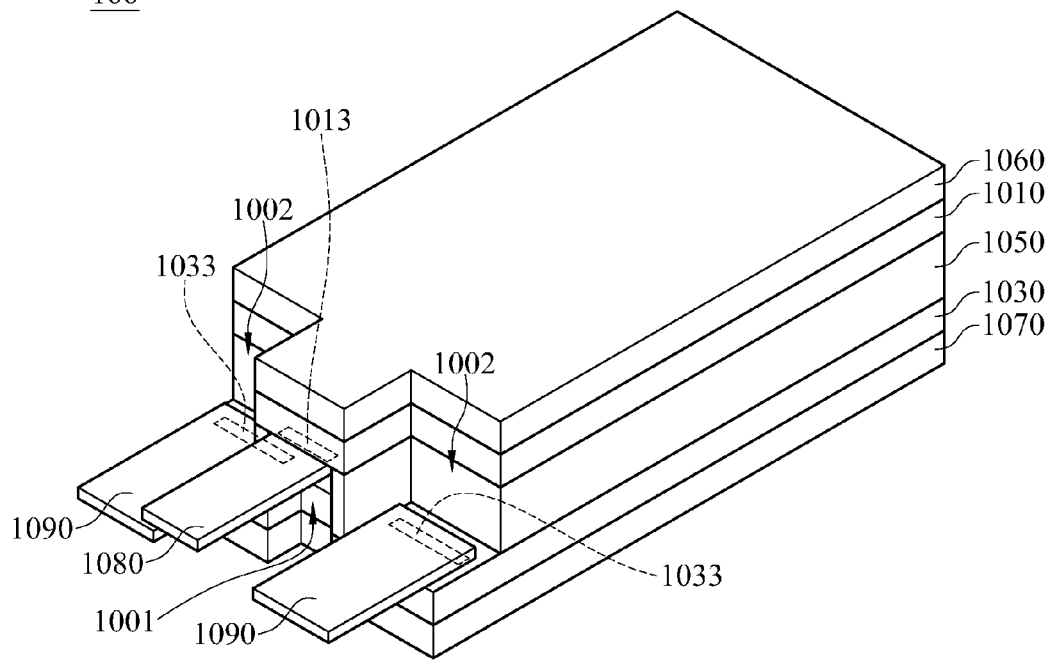
FIG. 10A is a perspective view of a flexible electronic device according to one embodiment of the present disclosure.
Figure 10B:
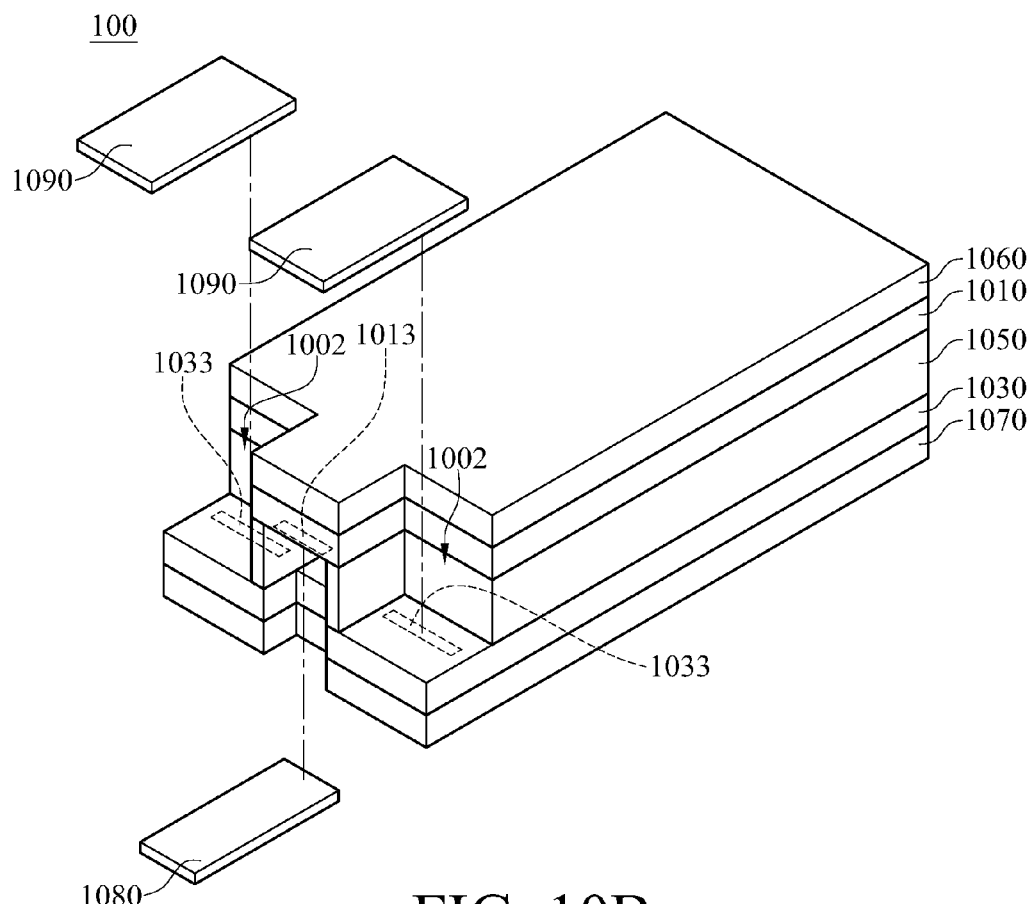
FIG. 10B is an exploded view of the flexible electronic device according to one embodiment of the present disclosure.
Figure 10C:
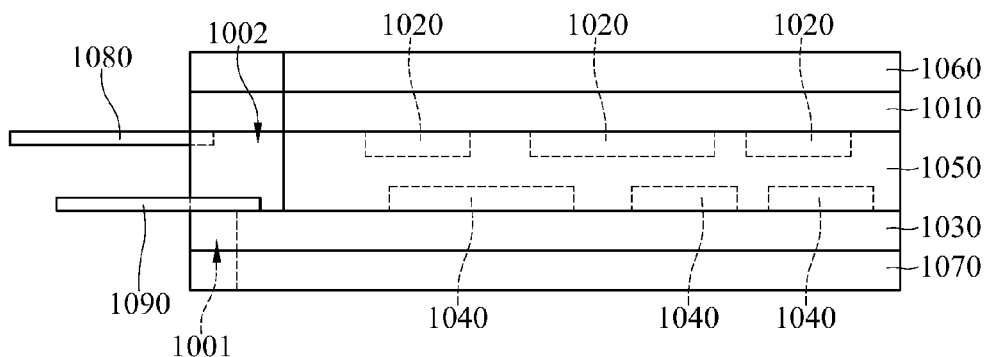
FIG. 10C is a side view of the flexible electronic device according to one embodiment of the present disclosure.

FIG. 10A is a perspective view of a flexible electronic device according to one embodiment of the present disclosure. FIG. 10B is an exploded view of the flexible electronic device according to one embodiment of the present disclosure. FIG. 10C is a side view of the flexible electronic device according to one embodiment of the present disclosure. As shown in FIG. 10A to FIG. 10B, the flexible electronic device 100 includes a first flexible substrate 1010, a first electronic component 1020, a second flexible substrate 1030, a second electronic component 1040, an adhesive layer 1050, a first protection layer 1060, a second protection layer 1070, a first FPC 1080, two second FPCs 1090, a first FPC bonding area 1013 and two second FPC bonding areas 1033. The materials or components for achieving the aforementioned structures similar to that in the aforementioned embodiments are not described hereinafter.

In this embodiment, the flexible electronic device 100 has two second notches 1002 respectively located on two corners of the flexible electronic device 100.

In addition, the flexible electronic device 100 has one first notch 1001 between the two second notches 1002. The numbers of the second FPCs 1090 and the second FPC bonding areas 1033 are both two.

Figure 11:
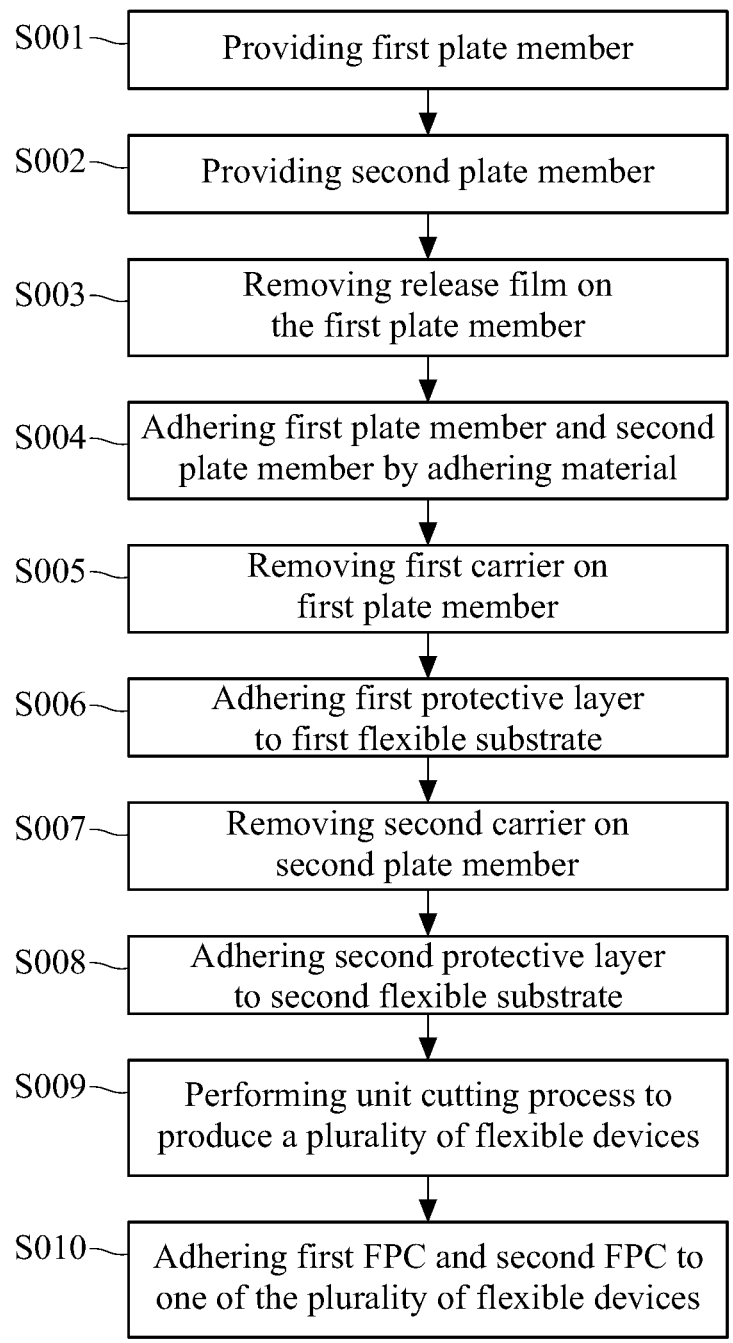
FIG. 11 is a flow chat of a method for manufacturing a flexible electronic device according to one embodiment of the present disclosure.

FIG. 11 is a flow chat of a method for manufacturing a flexible electronic device according to one embodiment of the present disclosure.

In a step S001, a first plate member is provided, and the plate member includes a carrier, a first flexible substrate, a plurality of first electronic components, an adhesive layer and a release film. The first carrier, the first flexible substrate, the plurality of first electronic components, the adhesive layer and the release film are stacked in sequence.

In a step S002, a second plate member is provided, the second plate member includes a second carrier, a second flexible substrate and a plurality of second electronic components. The second carrier, the second flexible substrate and the plurality of second electronic component are stacked in sequence.

In a step S003, the release film on the first plate member is removed to leave the adhesive layer exposed.

In a step S004, the first plate member and the second plate member are adhered to each other by the adhesive layer, and the adhesive layer wraps the plurality of second electronic components. It may also be interpreted that the plurality of second electronic components are embedded in the adhesive layer.

In a step S005, the first carrier on the first flexible substrate is removed.

In a step S006, a first surface of a first protection layer is adhered to the flexible substrate of the first plate member.

In a step S007, the second carrier on the second plate member is removed.

In a step S008, a first surface of a second protection layer is adhered to the second flexible substrate of the second plate member.

In a step S009, a unit cutting process is performed on the first plate member adhered to the second plate member to produce a plurality of flexible electronic devices.

In a step S010, at least one of first FPC and second FPC are bonded to one of the plurality of flexible electronic devices.

The present disclosure is not limited to the order of the aforementioned steps, and some of the aforementioned steps may be performed simultaneously. In general, the step S001 and the step S002 are performed at the beginning of the whole manufacturing steps, the step S009 and the step S010 are performed at the end of the whole manufacturing steps, but the order of the steps S003 to S008 may be changed, the present disclosure is not limited thereto.

Please refer to FIG. 12 and FIGS. 13A to 13M, FIG. 12 is a flow chart of a method for manufacturing a flexible electronic device according to one embodiment of the present disclosure, and FIGS. 13A to 13M are schematic views for manufacturing the flexible electronic device according to one embodiment of the present disclosure. In this embodiment, the first carrier and the second carrier are removed after the first plate member is adhered to the second plate member.

Figure 13A:
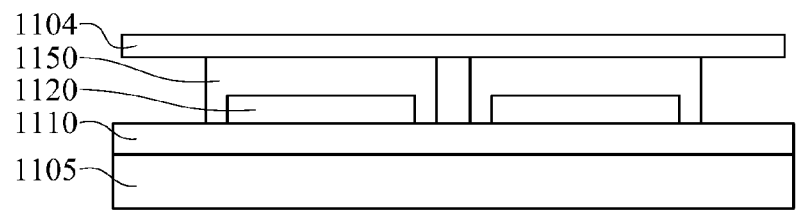
FIGS. 13A to 13M are schematic views for manufacturing the flexible electronic device according to one embodiment of the present disclosure.

In a step S101 as shown in FIG. 13A, the first plate member 11a is provided, the first plate member 11a includes a first carrier 1105, a first flexible substrate 1110, a plurality of first electronic components 1120, an adhesive layer 1150 and a release film 1104. The first carrier 1105, the first flexible substrate 1110, the plurality of first electronic components 1120, the adhesive layer 1150 and the release film 1104 are stacked in sequence. The first carrier 1105 is made of, for example, glass, but the present disclosure is not limited thereto. A release layer, a debonding layer or a sacrificial layer may be disposed between the first flexible substrate 1110 and the first carrier 1105, but the present disclosure is not limited thereto. The release film 1104 is, for example, a release film having pressure sensitive adhesives (PSA), a thermosetting adhesive or the other adhesive materials, the present disclosure is not limited thereto.

Figure 13B:
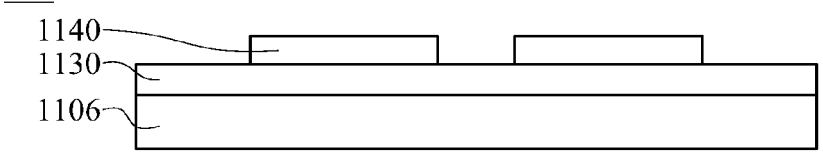

In a step S102 as shown in FIG. 13B, the second plate member 11b is provided. In this step, the second plate member 11b includes a second carrier 1106, a second flexible substrate 1130 and a plurality of second electronic components 1140, and the second carrier 1106, the second flexible substrate 1130 and the plurality of second electronic components 1140 are stacked in sequence. The second carrier 1106 is made of, for example, glass, but the present disclosure is not limited thereto. The aforementioned release layer, the debonding layer or the sacrificial layer may be disposed between the second flexible substrate 1130 and the second carrier 1106, the present disclosure is not limited thereto. The said release layer and the second carrier 1106 may be simultaneously removed or the said release layer may be left on the second flexible substrate 1130 after removing the second carrier 1106, the present disclosure is not limited thereto.

Figure 13C:
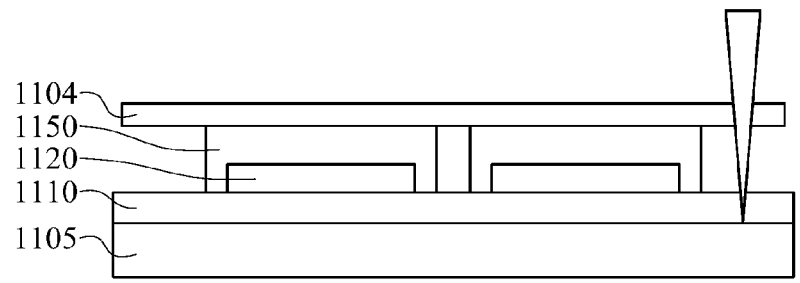

In a step S103 as shown in FIG. 13C, a flexible substrate cutting is performed on the first flexible substrate 1110 on the first carrier 1105. The flexible substrate cutting is performed by, for example, laser or a cutting tool. The cutting path of said flexible substrate cutting is performed in the range of, for example, the release layer, the debonding layer or the sacrificial layer, the present disclosure is not limited thereto.

Figure 13D:
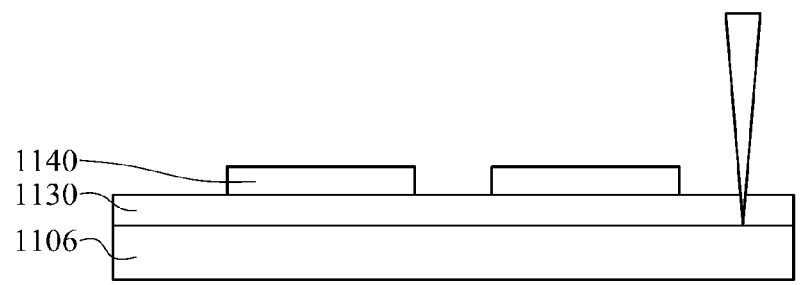

In a step S104 as shown in FIG. 13D, the flexible substrate cutting is performed on the second flexible substrate 1130 on the second carrier 1106. The flexible substrate cutting is performed by, for example, laser or a cutting tool. The cutting path of said flexible substrate cutting is performed in the range of, for example, the release layer, the debonding layer or the sacrificial layer, the present disclosure is not limited thereto.

Figure 13E:
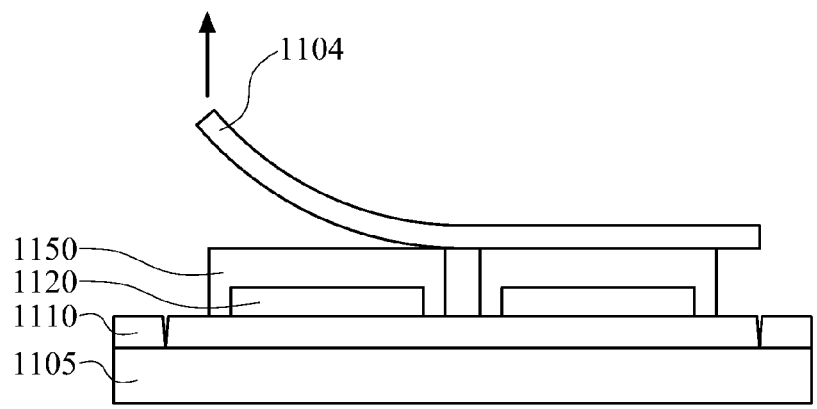

In a step S105 as shown in FIG. 13E, the release film 1104 on the first plate member 11a is removed to leave the adhesive layer 1150 exposed.

Figure 13F:
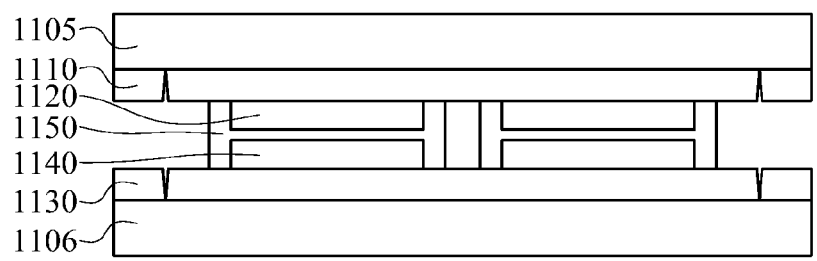

In a step S106 as shown in FIG. 13F, the first plate member 11a and the second plate member 11b are adhered to each other by the adhesive layer 1150, and the adhesive layer 1150 wraps the second electronic components 1140, it may also be interpreted that the plurality of second electronic components 1140 are embedded in the adhesive layer 1150. In this embodiment, after the first plate member 11a and the second plate member 11b are adhered to each other, they may be further conducted with a detection process such as an appearance detection, an optical detection, an electrical property detection or a light detection, but the present disclosure is not limited thereto.

Figure 13G:
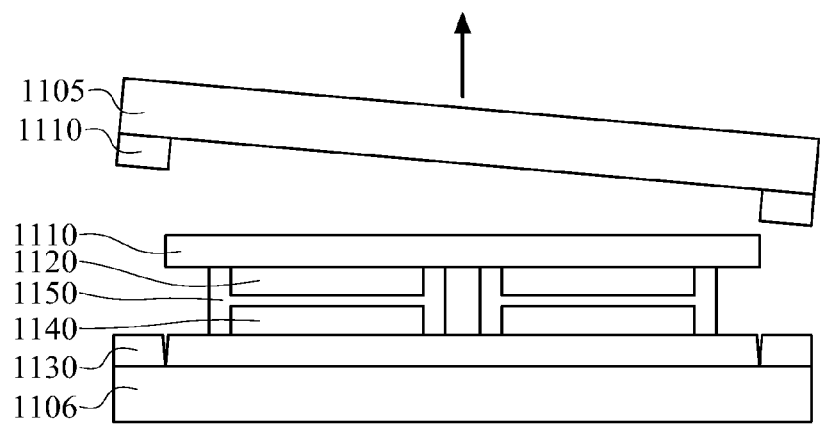

In a step S107 as shown in FIG. 13G, the first carrier 1105 on the first plate member 11a is removed. The process of removing the carrier is performed by, for example, mechanical manner, laser, or a combination of mechanical manner and laser, but the present disclosure is not limited thereto. In one embodiment of the present disclosure, take the mechanical manner as an example, a gas pressure in a variable pressure chamber formed between the first flexible substrate 1110 and the first carrier 1105 may be adjusted to produce a pressure difference between two opposite sides of variable pressure chamber, so the flexible fixing member and the first flexible substrate 1110 are deformed and curved simultaneously in order to advantage the aforementioned removing steps to proceed. In such a case, the separated surfaces are evenly pressed by air pressure so that stress concentration is reduced, so the electronic components are prevented from being damaged. Furthermore, in another embodiment of the present disclosure, it is optional to perform a pre-releasing process on a pre-releasing area located between the first flexible substrate 1110 and the first carrier 1105. In detail, a high pressure gas is provided on a conjunction between the first flexible substrate 1110 and the first carrier 1105 to produce a crack to advantage the aforementioned removing step to proceed.

Figure 13H:
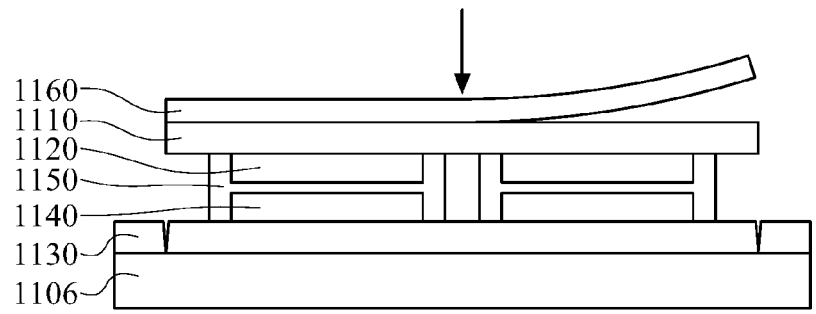

In a step S108 as shown in FIG. 13H, the first surface of the first protection layer 1160 is adhered to the first flexible substrate 1110 of the first plate member 11a. A cleaning step may be performed before the step of adhering the first protection layer 1160.

Figure 13I:
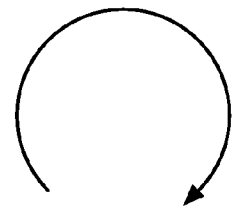
Figure 13I:
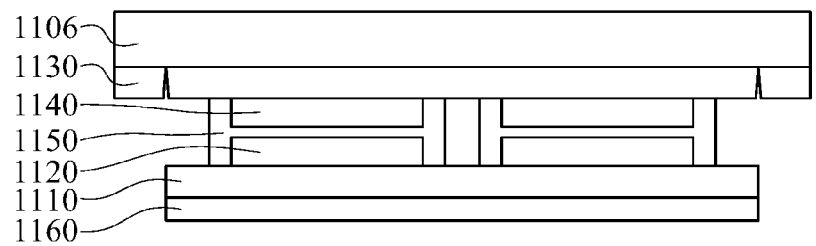

In a step S109 as shown in FIG. 13I, the first plate member 11a and the second plate member 11b, which are adhered to each other, are overturned so that the second plate member 11b is on the top. In this embodiment, the overturning is performed because a basic platform is located under the plate member. In other embodiments, the plate members has no need to be overturned when the basic platform is on the top of the plate member, and its fixing surface faces down.

Figure 13J:
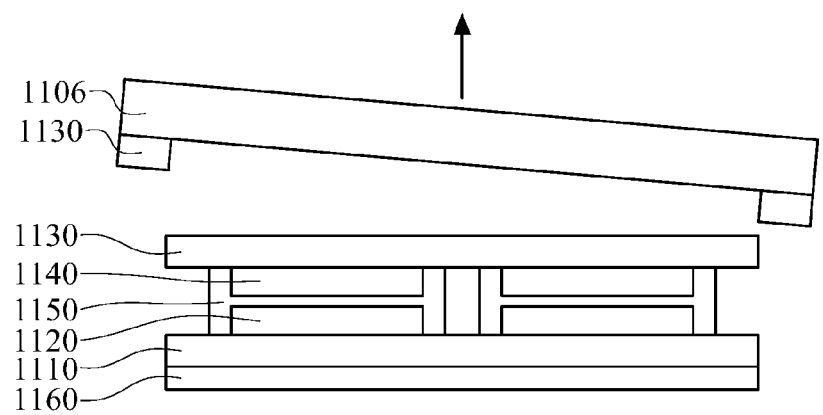

In a step S110 as shown in FIG. 13J, the second carrier 1106 on the second plate member 11b is removed. The process of removing carrier is similar to that in the aforementioned paragraphs, so the related descriptions are not described hereinafter.

Figure 13K:
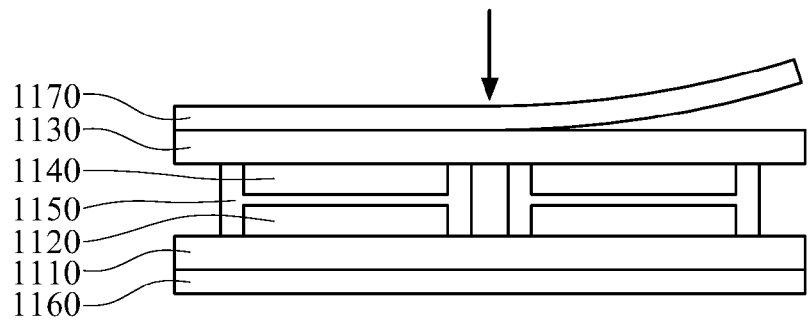

In a step S111 as shown in FIG. 13K, the first surface of the second protection layer 1170 is adhered to the second flexible substrate 1130 of the second plate member 11b. A cleaning step may be performed before the step of adhering the second protection layer 1170.

Figure 13L:
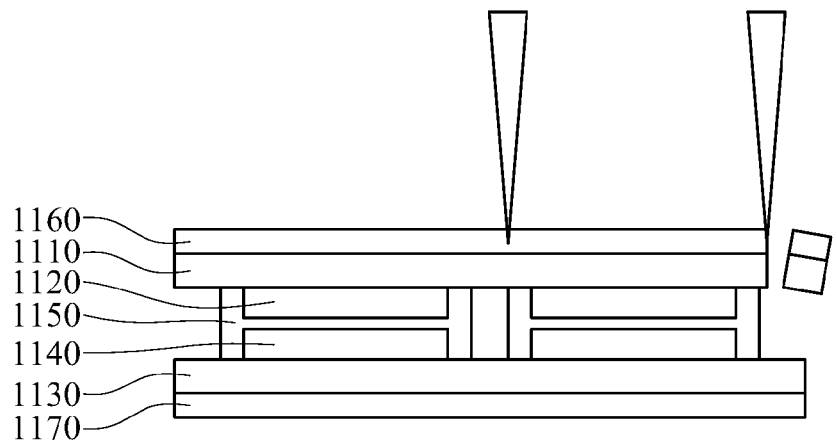

In a step S112 as shown in FIG. 13L, a unit cutting process is performed on the first plate member 11a and the second plate member 11b which are adhered to each other to produce a plurality of flexible electronic devices.

Figure 13M:
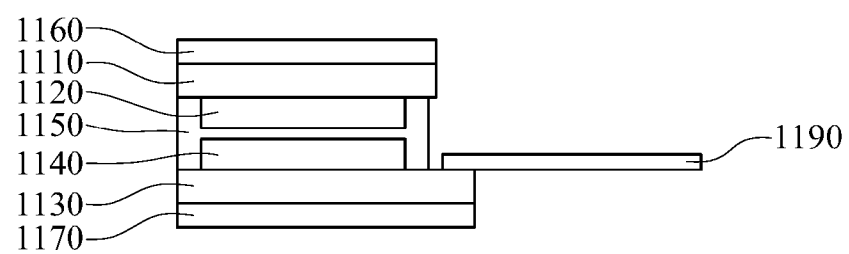

In a step S113 as shown in FIG. 13M, the first FPC (not shown in figures) and the second FPC 1190 are bonded to one of the plurality of flexible electronic devices.

Figure 14A:
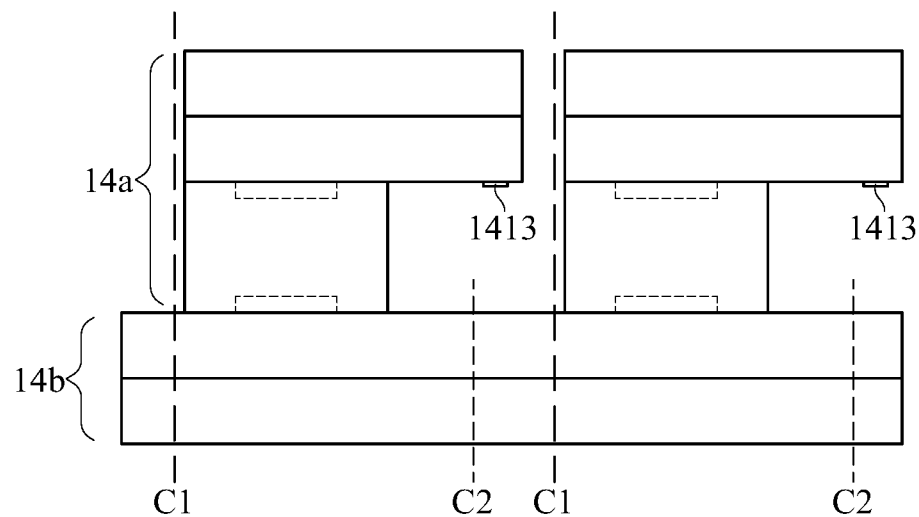
FIG. 14A is a cross-sectional view of performing a partial cutting process on a first plate member and a second plate member which are adhered to each other according to one embodiment of the present disclosure.
Figure 14B:
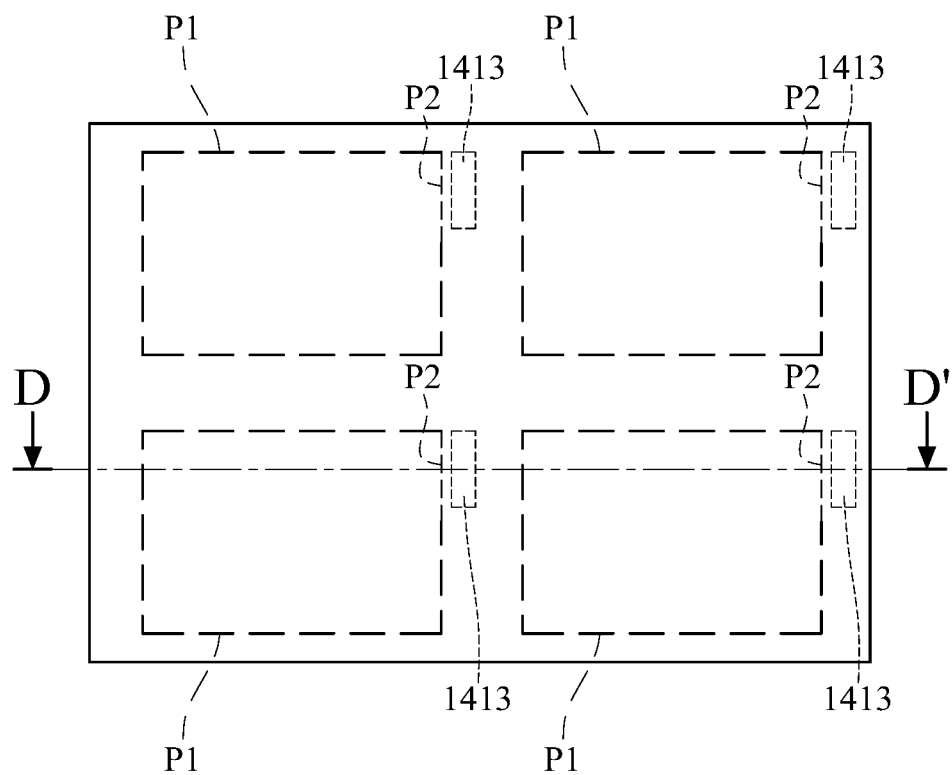
FIG. 14B is a top view of a path of performing the partial cutting process on the first plate member and the second plate member according to one embodiment of the present disclosure.
Figure 14C:
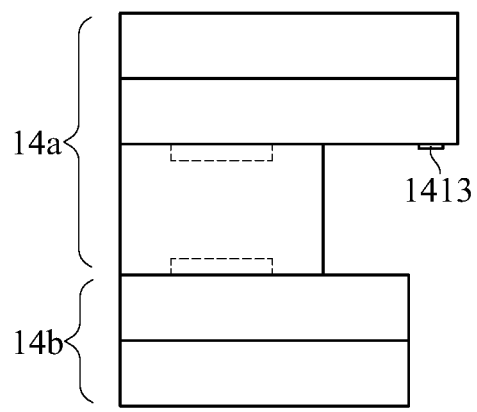
FIG. 14C is a cross-sectional view of the flexible electronic device produced by a unit cutting process according to one embodiment of the present disclosure.
Figure 14D:
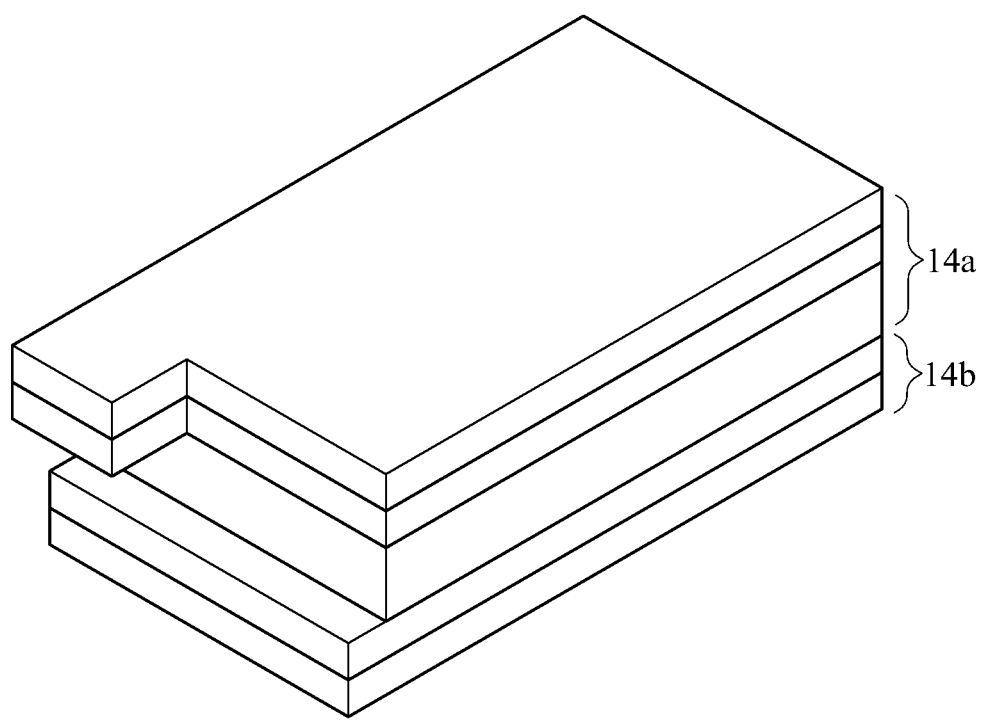
FIG. 14D is a perspective view of the flexible electronic device produced by the unit cutting process according to one embodiment of the present disclosure.

FIG. 14A is a cross-sectional view of a first plate member and a second plate member which are adhered to each other and performed with a partial cutting process according to one embodiment of the present disclosure, FIG. 14B is a top view of a path of performing the partial cutting process on the first plate member and the second plate member which are adhered to each other according to one embodiment of the present disclosure, FIG. 14C is a cross-sectional view of the flexible electronic device produced by a unit cutting process according to one embodiment of the present disclosure, and FIG. 14D is a perspective view of the flexible electronic device produced by the unit cutting process according to one embodiment of the present disclosure. The FIG. 14A is a cross-sectional view corresponding to the cross-sectional view of D-D' in FIG. 14B.

In this embodiment, the unit cutting process includes a full cutting process and a partial cutting process, and a cutting path of the full cutting process is the same as a cutting path of the partial cutting process. In the full cutting process, the first plate member 14a and the second plate member 14b which are adhered to each other are cut through (a cutting path C1 as shown in FIG. 14A). In the partial cutting process, the first plate member 14a and the second plate member 14b which are adhered to each other are partially cut (a cutting path C2 as shown in FIG. 14A). As shown in FIG. 14A, the first FPC bonding area 1413 is not cut during the partial cutting process. In other words, the first protruding structure on the first flexible substrate is not damaged during the partial cutting process. In addition, as shown in FIG. 14B, a cutting path P1 of the full cutting process is directly connected to a cutting path P2 of the partial cutting process. The full cutting process and the partial cutting process are performed on the same cutting path, and the cutting path P1 and the cutting path P2 are achieved by a continuous cutting process.

In some embodiments, the second plate member 14b may be cut through but without damaging the first plate member 14a by adjusting the power applied on the partial cutting process and the cutting depth and the number of cuts in the partial cutting process.

In other embodiments, for preventing the wires on the first FPC bonding area 1413 or the first FPC bonding area 1413 (not shown in figures) from being damaged while performing the partial cutting process, a barrier layer or an absorption layer is selectively disposed on the cutting path of the first FPC bonding area 1413. For example, the first plate member 14a further includes a plurality of first barrier layers (not shown in figures) disposed on the first surface of the first flexible substrate. In other words, the first barrier layers are disposed on a surface facing the second plate member 14b of the first FPC bonding area 1413. Therefore, the partial cutting process performs a cut from the second protection layer to the plurality of first barrier layers but without damaging the first FPC bonding area 1413, so it is favorable for the first FPC to bond in the following step.

Figure 15A:
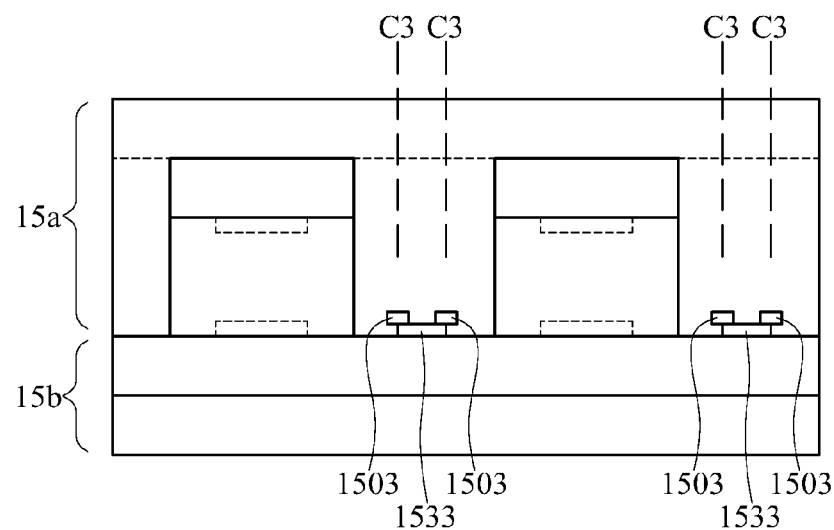
FIG. 15A is a cross-sectional view of a first plate member and a second plate member which are adhered to each other and performed with a partial cutting process according to one embodiment of the present disclosure.
Figure 15B:
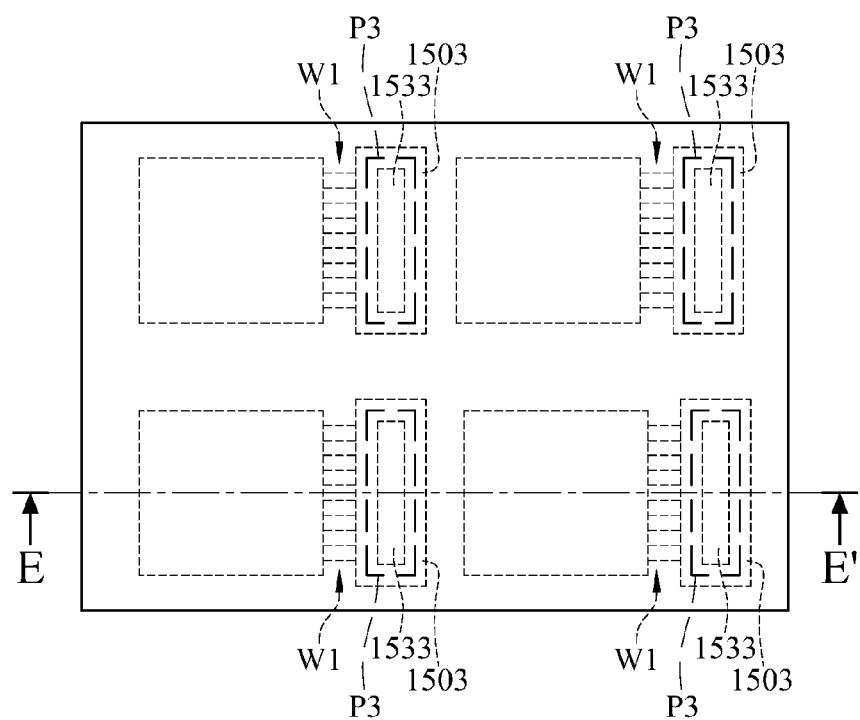
FIG. 15B is a top view of a path of performing the partial cutting process on the first plate member and the second plate member which are adhered to each other according to one embodiment of the present disclosure.

FIG. 15A is a cross-sectional view of a first plate member 15a and a second plate member 15b which are adhered to each other and performed with a partial cutting process according to one embodiment of the present disclosure, and FIG. 15B is a top view of a path of performing the partial cutting process on the first plate member 15a and the second plate member 15b which are adhered to each other according to one embodiment of the present disclosure. FIG. 15A is a cross-sectional view corresponding to the cross-sectional view of E-E' in FIG. 15B.

In this embodiment, the second plate member 15b further includes a plurality of second barrier layers 1503 disposed on the first surface of the second flexible substrate. In other words, the second barrier layers 1503 are disposed on a surface of the second FPC bonding area 1533 facing the first plate member 15a. The partial cutting process performs a cut C3 from the first protection layer to the plurality of second barrier layer 1503. The second barrier layers 1503 are disposed under the cutting path. The second barrier layers 1503 and the first barrier layer are made of, for example, metallic material, adhesive layer, photoresist material or the other materials capable of stopping the cutting or absorbing energy.

The second barrier layers 1503 are disposed along the edge of the second FPC bonding area 1533. As shown in FIG. 15B, the second barrier layers 1503 are disposed along the predetermined path P3 located within a range of the second barrier layers 1503. When the partial cutting process is performed along the path P3, the protection layer opposite to another side of the second FPC bonding area 1533 is able to be removed but without damaging the second FPC bonding area 1533 or the wires W1 corresponding to the second FPC bonding area 1533.

Figure 16:
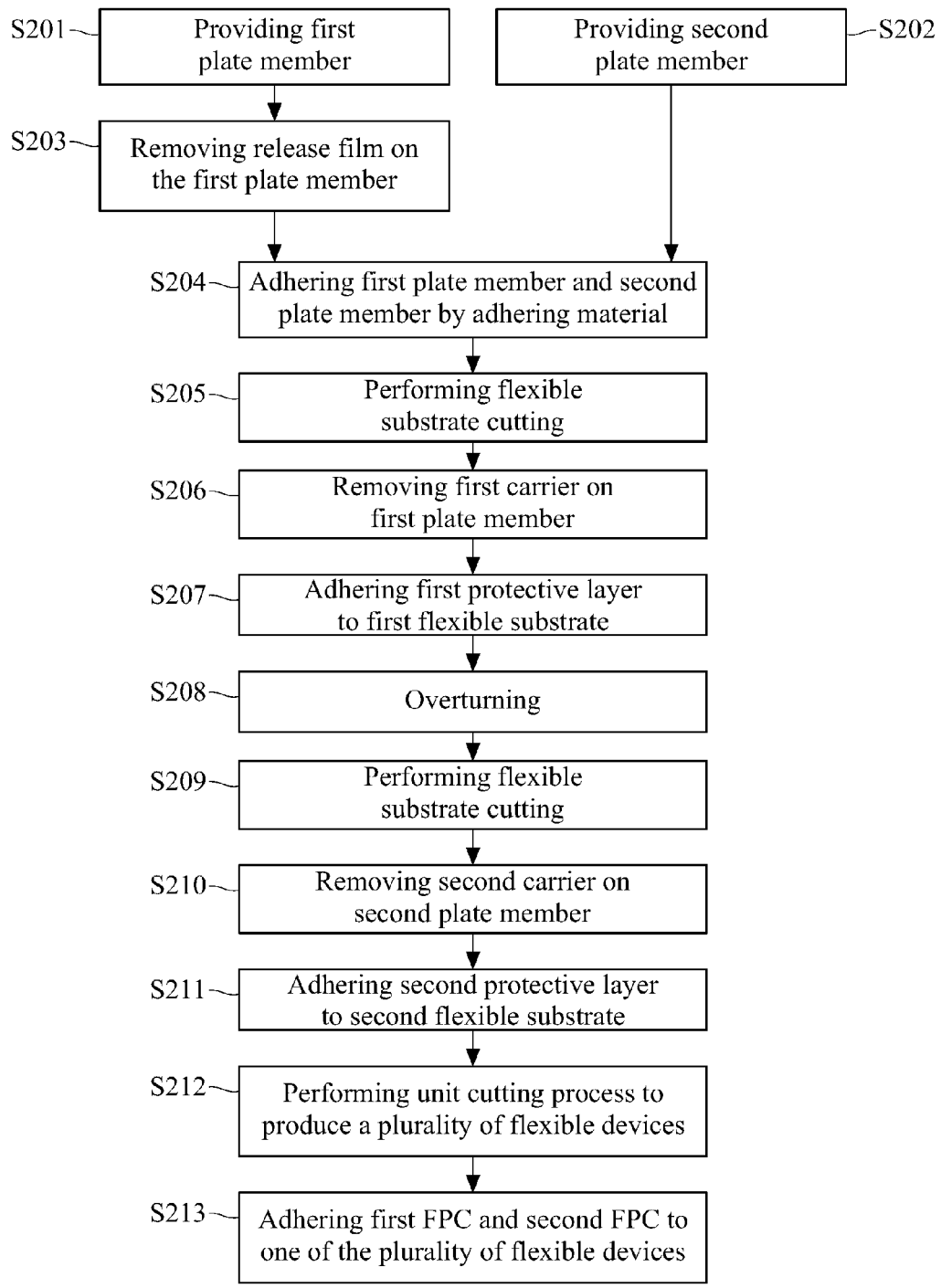
FIG. 16 is a flow chart of a method for manufacturing a flexible electronic device according to another embodiment of the present disclosure.
Figure 17A:
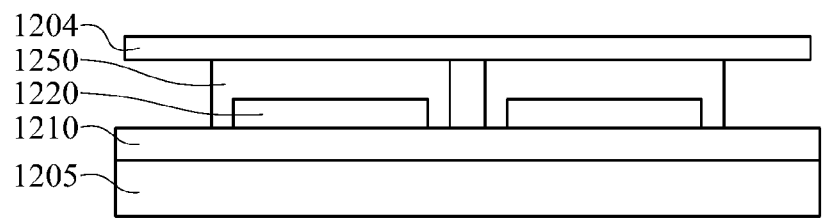
FIG. 17A to FIG. 17M are schematic views for manufacturing the flexible electronic device according to another embodiment of the present disclosure.
Figure 17B:
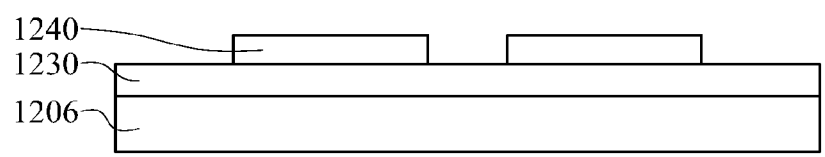
Figure 17C:
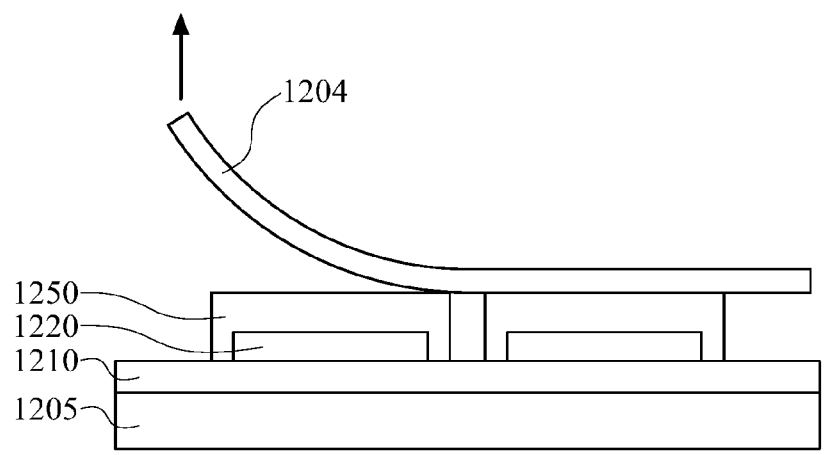
Figure 17D:
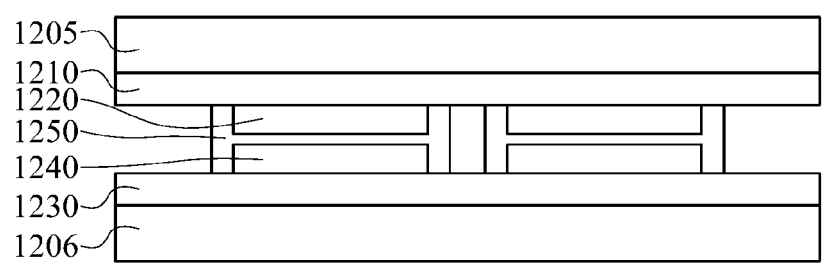
Figure 17E:
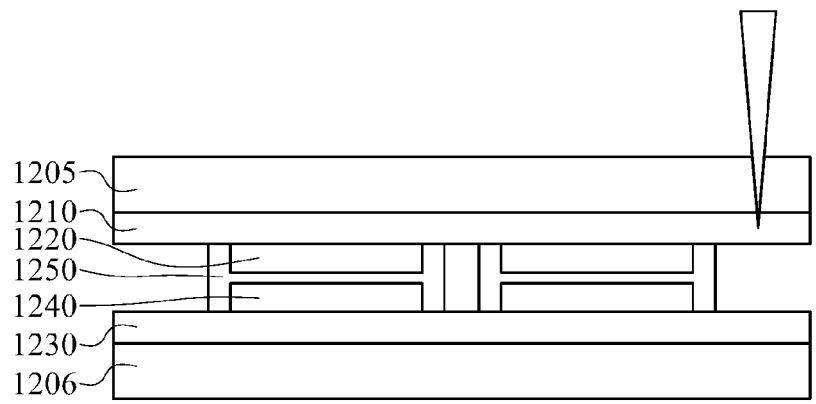
Figure 17F:
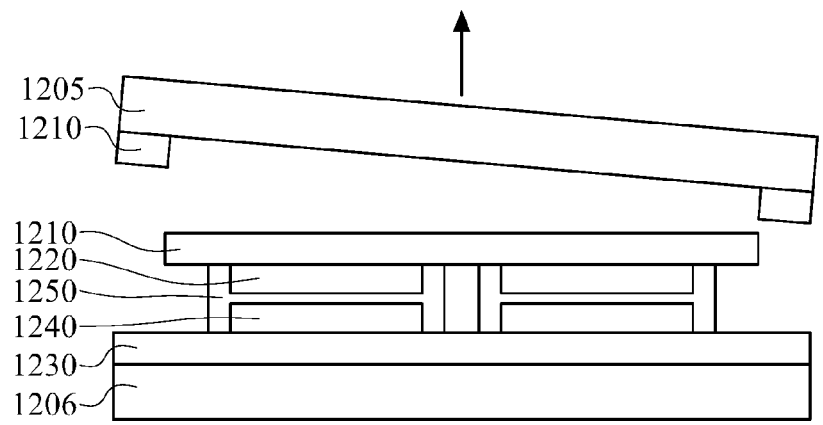
Figure 17G:
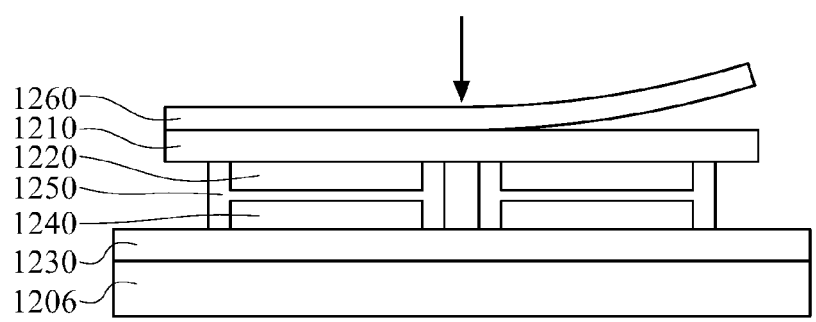
Figure 17H:
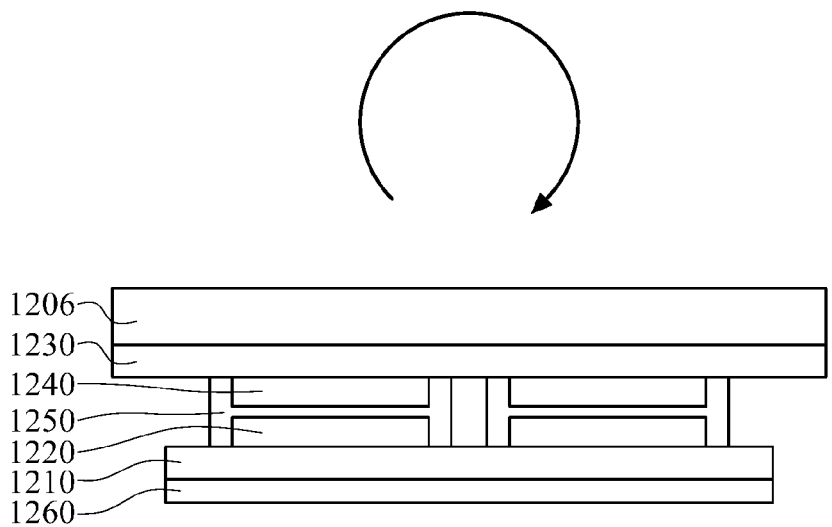
Figure 17I:
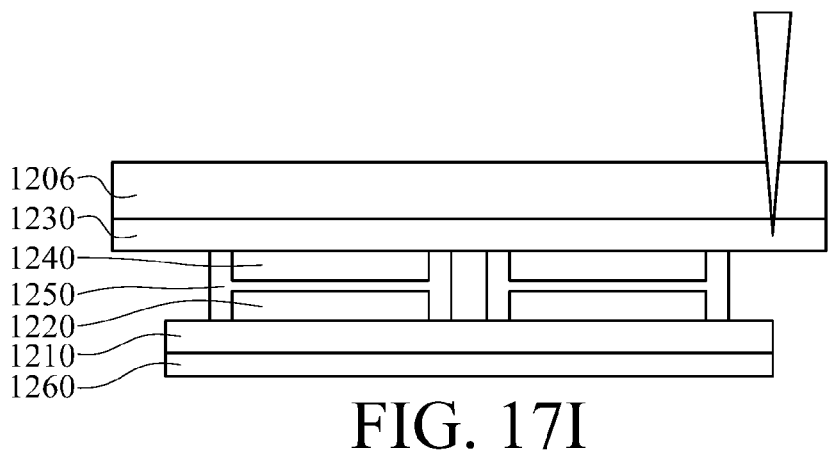
Figure 17J:
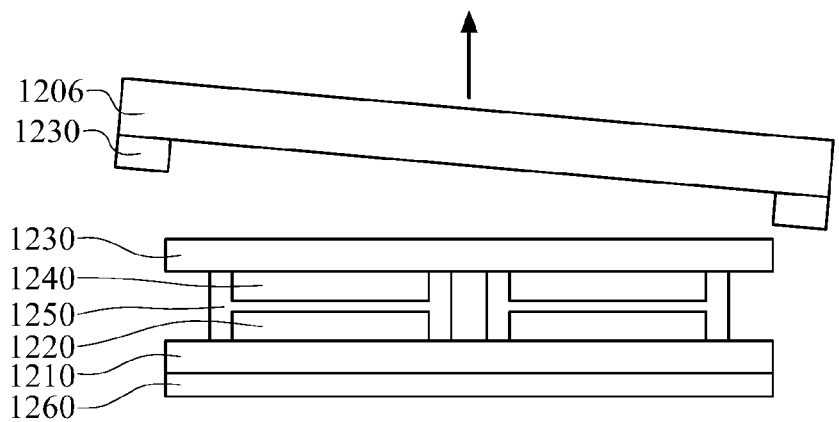
Figure 17K:
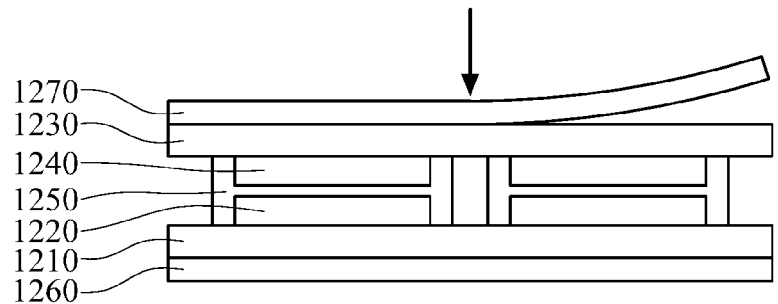
Figure 17L:
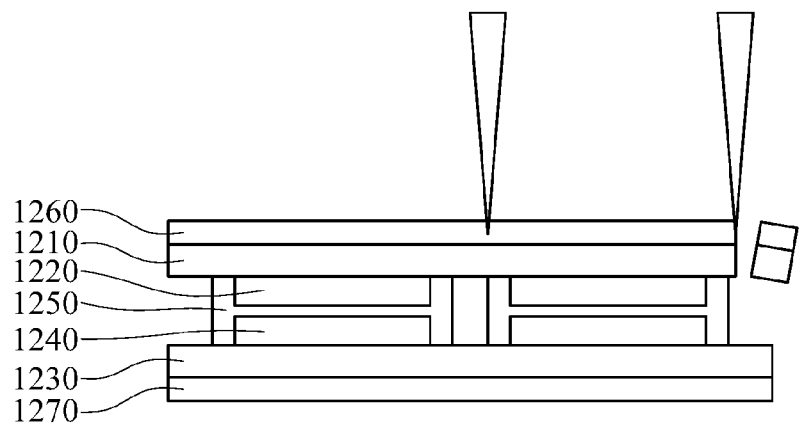
Figure 17M:
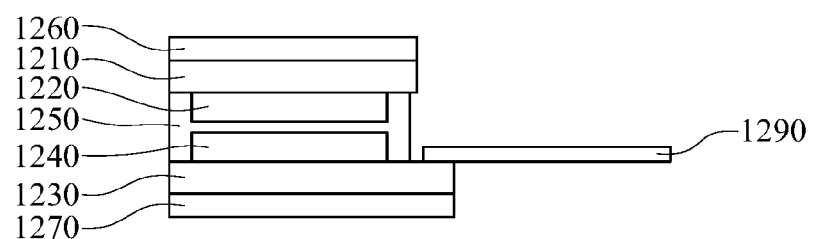

Please refer to FIG. 16 to FIG. 17M. FIG. 16 is a flow chart of a method for manufacturing a flexible electronic device according to another embodiment of the present disclosure, and FIGS. 17A to 17M are schematic views for manufacturing the flexible electronic device according to another embodiment of the present disclosure. In this embodiment, the step of adhering the first plate member and the second plate member is prior to the removal of the first carrier and the second carrier.

In a step S201 (as shown in FIG. 17A), the first plate member 12a is provided. In this step, the first plate member 12a includes a first carrier 1205, a first flexible substrate 1210, a plurality of first electronic components 1220, an adhesive layer 1250 and a release film 1204. The first carrier 1205, the first flexible substrate 1210, the plurality of first electronic components 1220, the adhesive layer 1250 and the release film 1204 are stacked in sequence. The first carrier 1205 is made of, for example, glass, but the present disclosure is not limited thereto.

In a step S202 (as shown in FIG. 17B), the second plate member 12b is provided. In this step, the second plate member 12b includes a second carrier 1206, a second flexible substrate 1203, a plurality of second electronic components 1240, and the second carrier 1206, the second flexible substrate 1230 and the plurality of second electronic components 1240 are stacked in sequence. The second carrier 1206 is made of, for example, glass, but the present disclosure is not limited thereto.

In a step S203 as shown in FIG. 17C, the release film 1204 on the first plate member 12a is removed to leave the adhesive layer 1250 exposed.

In a step S204 as shown in FIG. 17D, the first plate member 12a is adhered to the second plate member 12b by the adhesive layer 1250, and the adhesive layer 1250 wraps the plurality of second electronic components 1240 (or, the second electronic components 1240 are embedded in the adhesive layer 1250). In this embodiment, after the first plate member 12a and the second plate member 12b are adhered to each other, they may be further conducted with a detection process such as an appearance detection, an optical detection, an electrical property detection or a light detection, but the present disclosure is not limited thereto.

In a step S205 as shown in FIG. 17E, a flexible substrate cutting is performed on the first flexible substrate 1210 on the first carrier 1205. The flexible substrate cutting is performed by, for example, laser or a cutting tool. The cutting path of said flexible substrate cutting is, for example, performed on the range of the release layer, the debonding layer or the sacrificial layer, but the present disclosure is not limited thereto.

In a step S206 as shown in FIG. 17F, the first carrier 1205 of the first plate member 12a is removed. The process of removing carrier is similar to that in the aforementioned paragraphs, so the related descriptions are not described hereinafter.

In a step S207 as shown in FIG. 17G, the first surface of the first protection layer 1260 is adhered to the first flexible substrate 1210 of the first plate member 12a. A cleaning step may be performed before the step of adhering the first protection layer 1260.

In a step S208 (as shown in FIG. 17H), the first plate member 12a and the second plate member 12b, which are adhered to each other, are overturned so that the second plate member 12b is on the top. In this embodiment, the overturning is performed because a basic platform is located under the plate member. In other embodiments, the plate members has no need to be overturned when the basic platform is on the top of the plate member, and its fixing surface faces down.

In a step S209 as shown in FIG. 17I, the flexible substrate cutting is performed on the second flexible substrate 1230 on the second carrier 1206. The flexible substrate cutting is performed by, for example, laser or a cutting tool. The cutting path of said flexible substrate cutting is, for example, performed on the range of the release layer, the debonding layer or the sacrificial layer, but the present disclosure is not limited thereto.

In a step S210 as shown in FIG. 17J, the second carrier 1206 on the second plate member 12b is removed. The process of removing carrier is similar to that in the aforementioned paragraphs, so the related descriptions are not described hereinafter In a step S211 as shown in FIG. 17K, the first surface of the second protection layer 1270 is adhered to the second flexible substrate 1230 of the second plate member 12b. The cleaning step may be performed before the step of adhering the second protection layer 1270.

In a step S212 as shown in FIG. 17L, the unit cutting process is performed on the first plate member 12a and the second plate member 12b, which are adhered to each other, to produce the plurality of flexible electronic devices.

In step S213 (as shown in FIG. 17M), the first FPC (not shown in figures) and the second FPC 1290 are bonded to one of the plurality of flexible electronic devices.

As mentioned in above, the step of adhering the first plate member and the second plate member is prior to the removal of the first carrier and the second carrier. In this embodiment, the order of the step of adhering the protection layer may be changed among the steps. For example, a step of adhering the first protection layer or the second protection layer to the respective flexible substrate is performed right after the step of removing the first carrier or the second carrier. For another example, the steps of removing the first carrier and the second carrier are both prior to the step of adhering the first protection and the second protection layer to the respective flexible substrates. In addition, the order of the steps for removing the first carrier and the second carrier may be changed among the steps. For example, the first carrier on the first plate member is removed after the first plate member is adhered to the second member by the adhesive layer. For another example, the second carrier on the second plate member is removed before the removal of the first carrier. Furthermore, the step of cutting the first flexible substrate or the second flexible substrate may change its order among the steps. For example, the step of cutting the first flexible substrate or the second flexible substrate is performed before the step of adhering the first plate member to the second plate member by the adhesive layer. For another example, the step of cutting the first flexible substrate or the second flexible substrate is performed after the step of adhering the first plate member to the second plate member. Except for the aforementioned examples, the order of the other steps among the steps may be changed as well; the present disclosure is not limited thereto.

Figure 18:
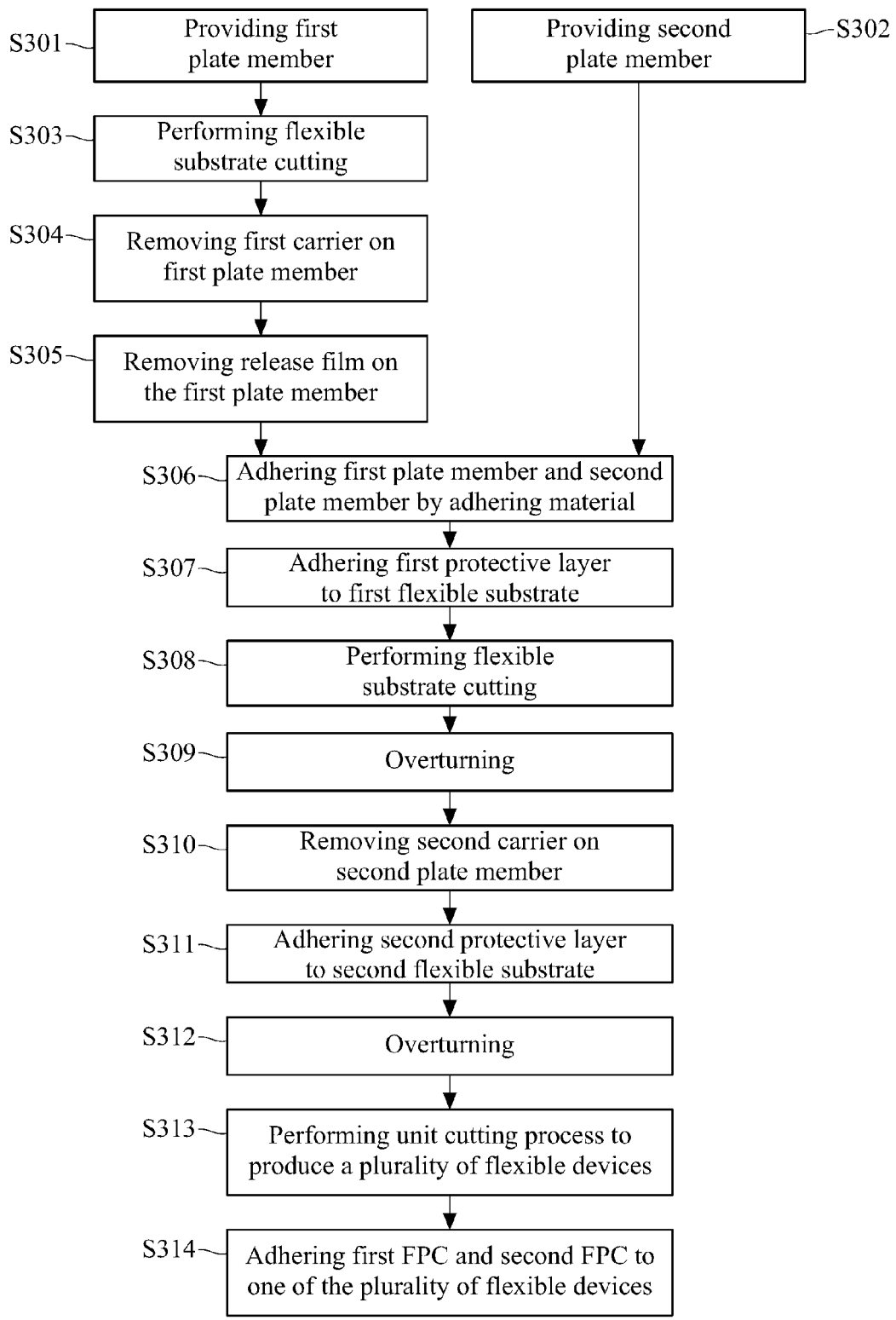
FIG. 18 is a flow chart of a method for manufacturing a flexible electronic device according to yet another embodiment of the present disclosure.
Figure 19A:
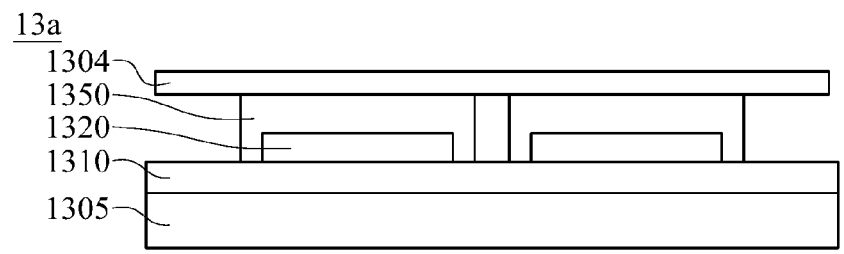
FIG. 19A to FIG. 19N are schematic views for manufacturing the flexible electronic device according to yet another embodiment of the present disclosure.
Figure 19B:
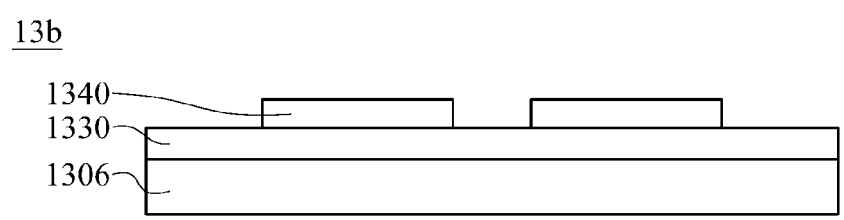
Figure 19C:
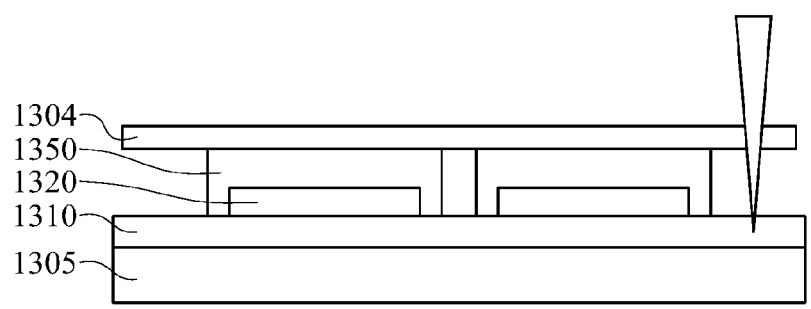
Figure 19D:
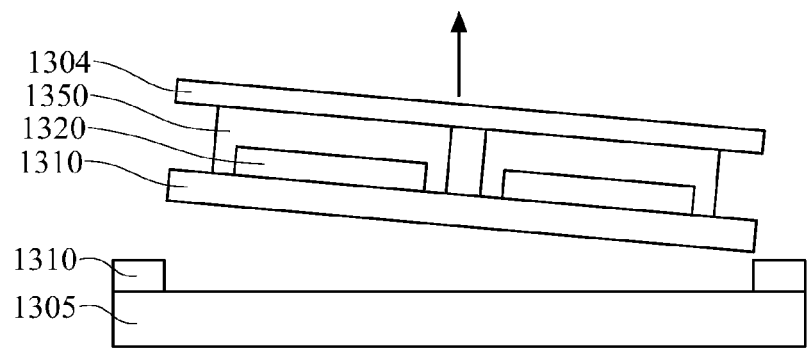
Figure 19E:
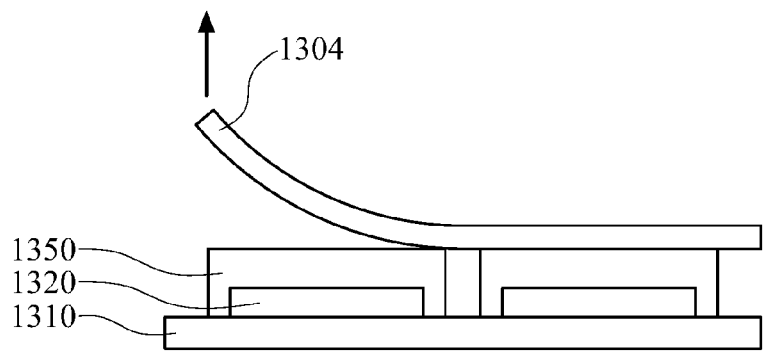
Figure 19F:
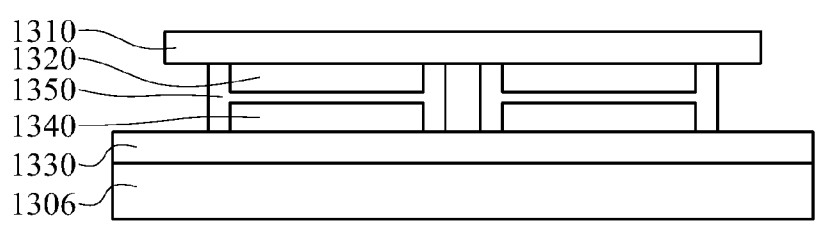
Figure 19G:
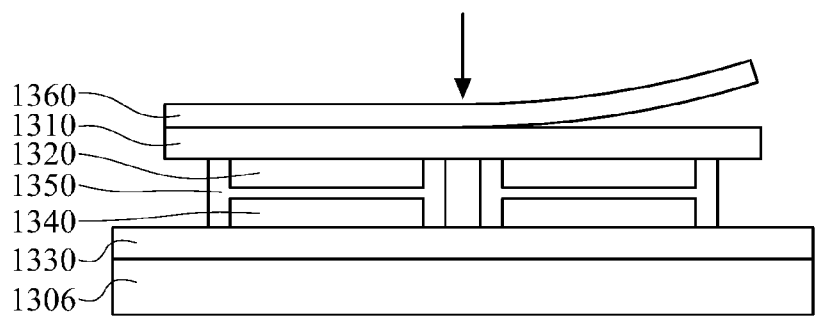
Figure 19H:
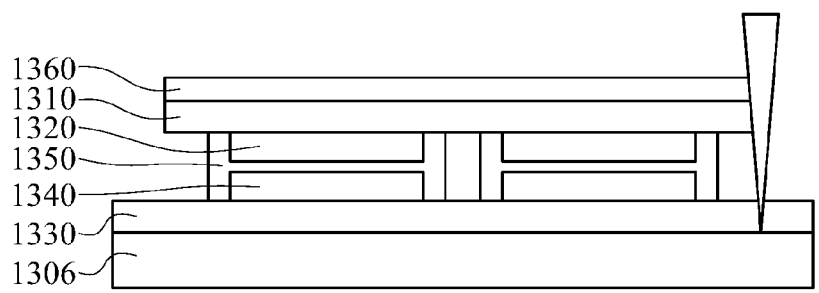
Figure 19I:
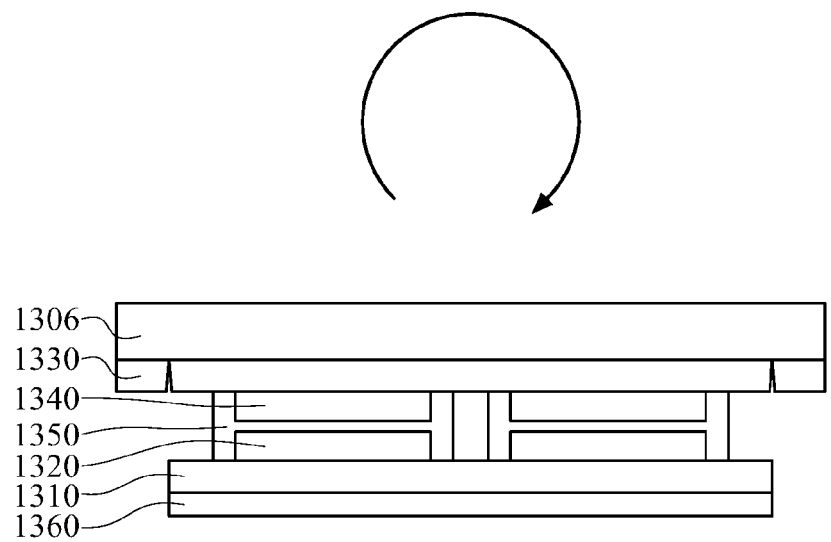
Figure 19J:
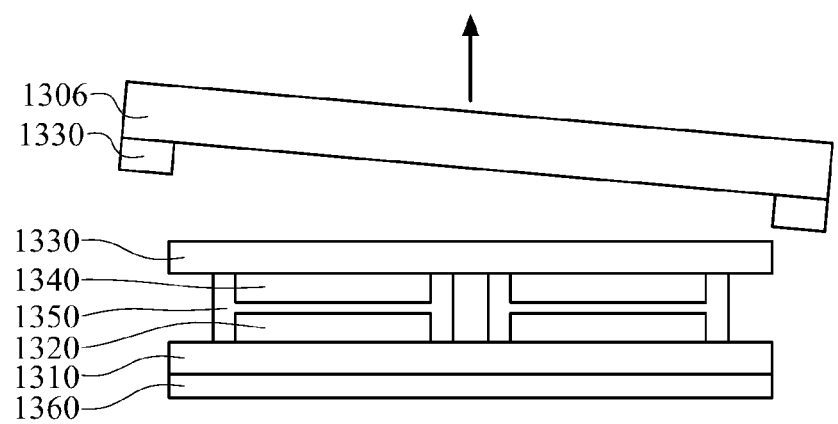
Figure 19K:
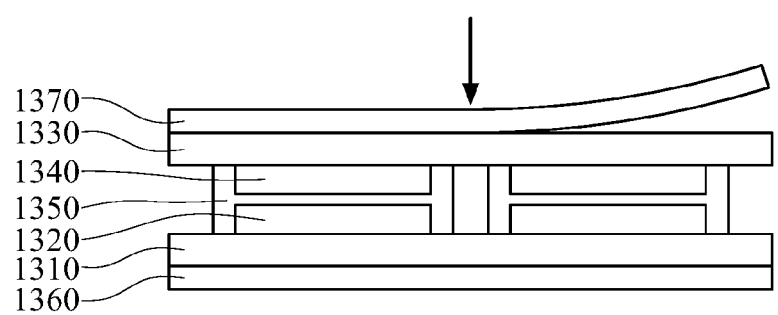
Figure 19L:
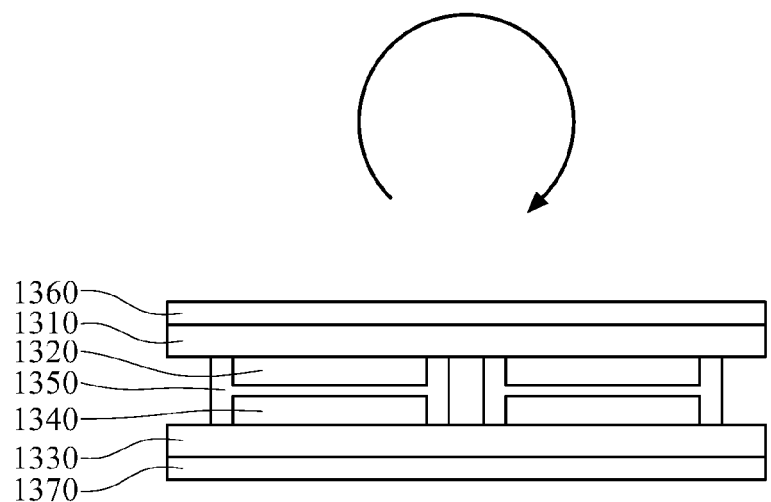
Figure 19M:
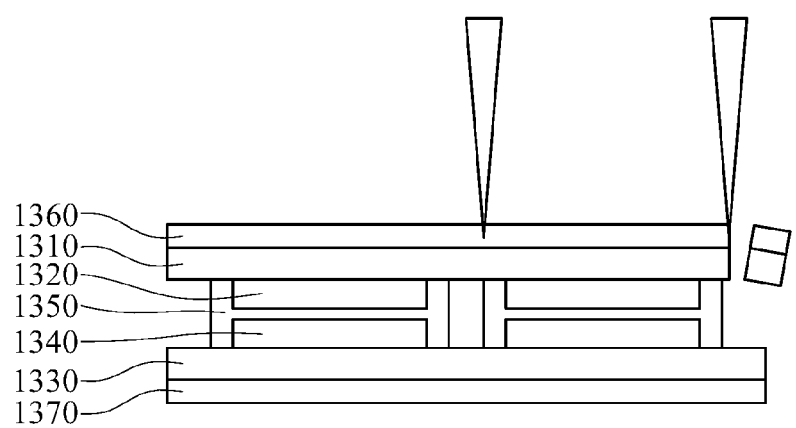
Figure 19N:
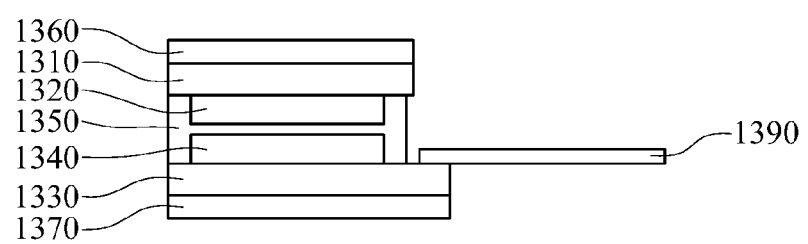

Please refer to FIG. 18 and FIG. 19A to FIG. 19N, FIG. 18 is a flow chart of a method for manufacturing a flexible electronic device according to yet another embodiment of the present disclosure, and FIG. 19A to FIG. 19N are schematic views for manufacturing the flexible electronic device according to yet another embodiment of the present disclosure. In this embodiment, one of the carriers (the first carrier on the first plate member or the second carrier on the second plate member) is firstly removed, and then the first plate member is bonded to the second plate member, and then the rest carrier is removed.

In a step S301 as shown in FIG. 19A, the first plate member 13a is provided. In this step, the first plate member 13a includes a release film 1304, an adhesive layer 1350, a plurality of electronic components 1320, a first flexible substrate 1310 and a first carrier 1305, and the release film 1304, the adhesive layer 1350, the plurality of electronic components 1320, the first flexible substrate 1310 and the first carrier 1305 are stacked in sequence. The first carrier 1305 is made of, for example, glass, but the present disclosure is not limited thereto.

In a step S302 as shown in FIG. 19B, the second plate member 13b is provided. In this step, the second plate member 13b includes a plurality of second electronic components 1340, a second flexible substrate 1330 and a second carrier 1306, and the plurality of second electronic components 1340, the second flexible substrate 1330 and the second carrier 1306 are stacked in sequence. The plurality of second electronic components 1340 are disposed on the first surface of the second flexible substrate 1330, and the second carrier 1306 is adjacent to the second surface of the second flexible substrate 1330. The second carrier 1306 is made of, for example, glass, but the present disclosure is not limited thereto.

In a step S303 as shown in FIG. 19C, a flexible substrate cutting is performed on the first flexible substrate 1310 of the first carrier 1305. The flexible substrate cutting is performed by, for example, laser or a cutting tool. The cutting path of said flexible substrate cutting is, for example, performed on the range of a layer film, a debonding layer or a sacrificial layer, but the present disclosure is not limited thereto.

In a step S304 as shown in FIG. 19D, the first carrier 1305 on the first plate member 13a is removed to leave the first flexible substrate 1310 exposed. The process of removing the carrier is similar to that in the aforementioned embodiments, so the related descriptions are not described hereinafter.

In a step S305 as shown in FIG. 19E, the release film 1304 on the first plate member 13a is removed to leave the adhesive layer 1350 exposed.

In a step S306 as shown in FIG. 19F, the first plate member 13a is adhered to the second plate member 13b by the adhesive layer 1350, and the adhesive layer 1350 wraps the plurality of second electronic components 1340. In this embodiment, after the first plate member 13a and the second plate member 13b are adhered to each other, they may be further conducted with a detection process such as an appearance detection, an optical detection, an electrical property detection or a light detection, but the present disclosure is not limited thereto.

In a step S307 as shown in FIG. 19G, the first surface of the first protection layer 1360 is adhered to the first flexible substrate 1310 of the first plate member 13a. A cleaning step may be performed before the step of adhering the first protection layer 1360.

In a step S308 as shown in FIG. 19H, a flexible substrate cutting is performed on the second flexible substrate 1330 of the second carrier 1306. The flexible substrate cutting is performed by, for example, laser or a cutting tool. The cutting path of said flexible substrate cutting is, for example, performed on the range of the release layer, the debonding layer or the sacrificial layer, the present disclosure is not limited thereto.

In a step S309 as shown in FIG. 19I, the first plate member 13a and the second plate member 13b which are adhered to each other are overturned so that the second plate member 13b is on the top. In this embodiment, the overturning is performed because a basic platform is located under the plate member. In other embodiments, the plate members has no need to be overturned when the basic platform is on the top of the plate member, and its fixing surface faces down.

In a step S310 as shown in FIG. 19J, the second carrier 1306 on the second plate member 13b is removed to leave the second flexible substrate 1330 exposed. The process of removing the carrier is similar to that in the aforementioned embodiments, so the related descriptions are not described hereinafter.

In a step S311 as shown in FIG. 19K, the first surface of the second protection layer 1370 is adhered to the second flexible substrate 1330 of the second plate member 13b. A cleaning step may be performed before the step of bonding the second protection layer 1370.

In a step S312 as shown in FIG. 19L, the first plate member 13a adhered to the second plate member 13b is overturned so that the first plate member 13a is on the top. In this embodiment, the overturning is performed because a basic platform is located under the plate member. In other embodiments, the plate members has no need to be overturned when the basic platform is on the top of the plate member, and its fixing surface faces down.

In a step S313 as shown in FIG. 19M, the unit cutting process is performed on the first plate member 13a and the second plate member 13b which are adhered to each other to produce the plurality of flexible electronic device.

In a step S314 as shown in FIG. 19N, the first FPC (not shown in figures) and the second FPC 1390 are bonded to one of the plurality of flexible electronic device.

As mentioned in above, the components on one of the first plate member or the second plate member being removed is adhered to the other plate member, and then the rest carrier is removed. Except the aforementioned examples as shown in FIG. 18 and FIG. 19A to FIG. 19N, the removed components may be changed. For example, the components on the first plate member are firstly removed before adhering to the second plate member. In another example, the components on the second plate member are firstly removed before adhering to the first plate member. In addition, the step of adhering the protection layer may change its order among the steps. For example, after the components on the first plate member or the second plate member are removed by removing the respective carrier, the step of adhering the protection layer is prior to the step of removing the rest carrier. In anther example, after the components on the first plate member or the second plate member are removed by removing the respective carrier, the step of adhering the protection layer may be performed after the step of removing the rest carrier.

In another embodiment of the present disclosure, the component on the first plate member may be removed (this is to say, the first plate member of the first carrier has been removed) and the component on the second plate member may be removed (that is to say, the second plate member of the second carrier has been removed), and then the removed components may be adhered to each other. In the present disclosure, the method for removing the components on the first plate member may be changed. For example, the first carrier is fixed in place, and then the components on the fixed first carrier are removed from the fixed first carrier. In another example, the components on the first plate member are fixed in place, and then the first carrier is removed from the components on the first plate member. In addition, the method for removing the components on the second plate member may be changed as well. For example, the second carrier is fixed in place, and then the components on the second plate member are removed from the second carrier. In another example, the second plate member is fixed in place, and then the second carrier is removed from the components on the second plate member.

Furthermore, the step of adhering the protection layer may change its order among the steps. For example, a step of adhering the first protection layer or the second protection layer to the flexible substrate may be performed right after the step of removing the first carrier or the second carrier. In another example, the step of adhering the protection layer and the second protection layer to the carrier may be performed after both the first carrier and the second carrier are removed.

Figure 20:
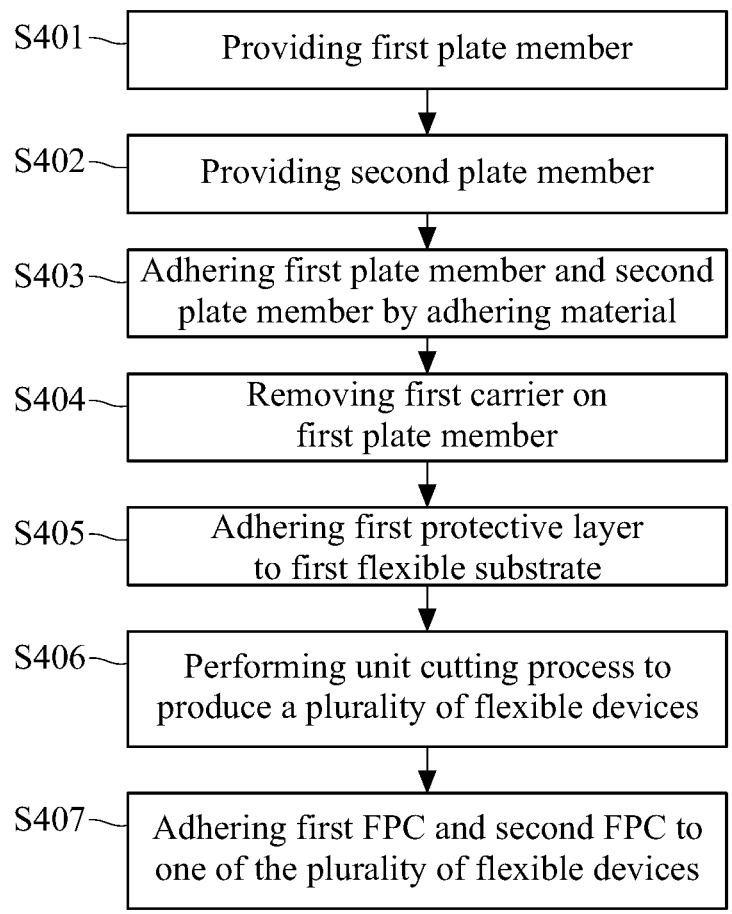
FIG. 20 is a flow chat of method of manufacturing a flexible electronic device according to still another embodiment of the present disclosure.
Figure 21:
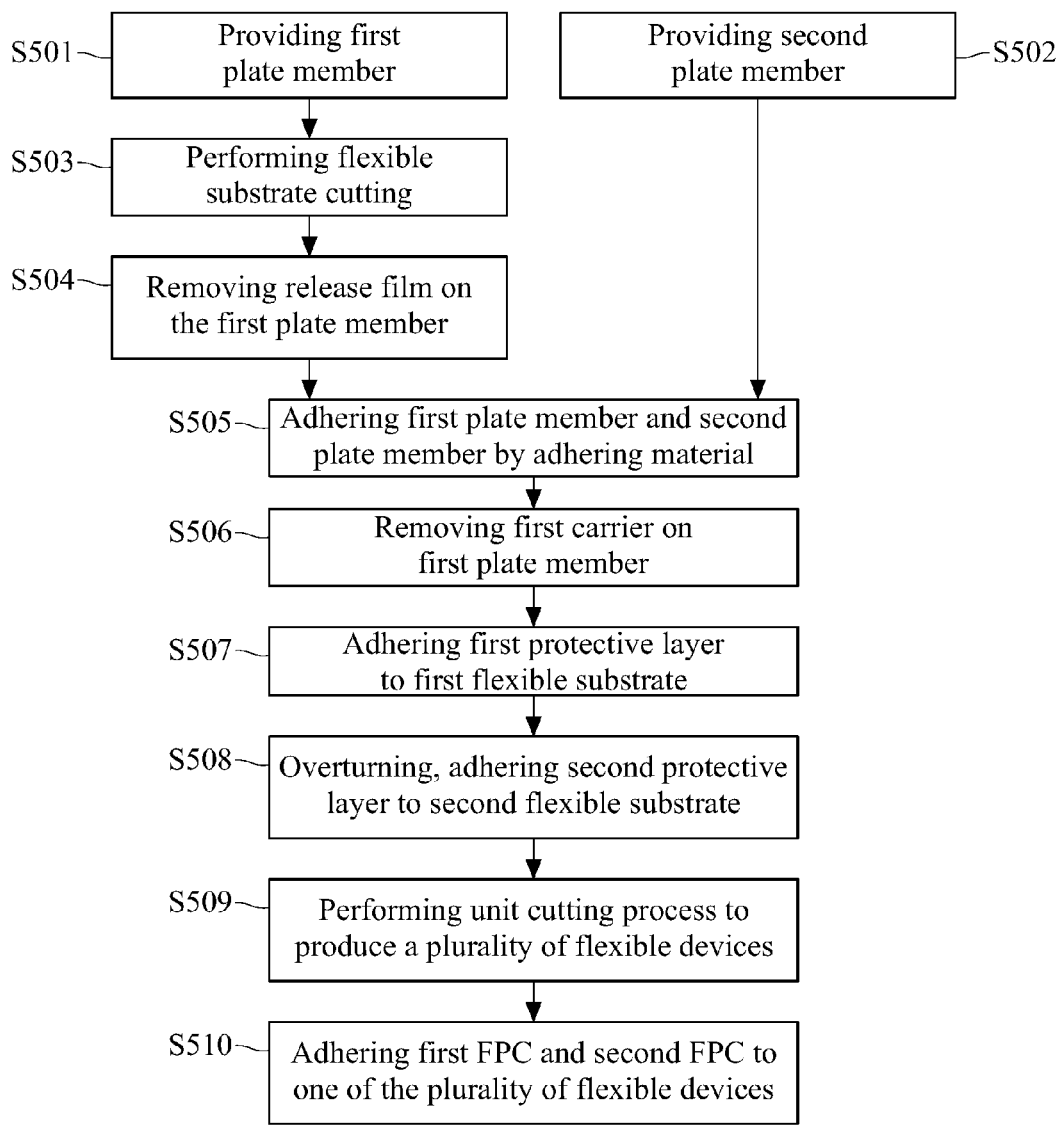
FIG. 21 is a flow chart of a method for manufacturing a flexible electronic device according to still another embodiment of the present disclosure.

FIG. 20 is a flow chat of method of manufacturing a flexible electronic device according to still another embodiment of the present disclosure.

In a step S401, a first plate member is provided, the first plate member includes a first carrier, a flexible substrate and a plurality of first electronic components. The first carrier, the first flexible substrate and the plurality of first electronic components are stacked in sequence.

In a step S402, a second plate member is provided, the second plate member includes a second flexible substrate and a plurality of second electronic components. The second plate member is produced by, for example, a roll-to-roll process, but the present disclosure is not limited thereto.

In a step S403, the first plate member and the second plate member are adhered to each other by an adhesive layer, and the adhesive layer wraps the plurality of first electronic components and the plurality of second electronic components (or, the plurality of first electronic components and the plurality of second electronic components are wrapped in the adhesive layer). The adhesive layer may be pre-provided on the first plate member or the second plate member, or the adhesive layer may be additionally introduced, the present disclosure is not limited thereto.

In a step S404, the first carrier on the first plate member is removed.

In a step S405, a first surface of a first protection layer is adhered to the first flexible substrate of the first plate member.

In a step S406, a unit cutting process is performed on the first plate member and the second plate member, which are adhered to each other, to produce a plurality of flexible electronic devices.

In a step S407, a first FPC and a second FPC are bonded to one of the plurality of flexible electronic devices.

The order of the aforementioned steps is not limited in the present disclosure, and some of the aforementioned steps may be performed simultaneously. In general, the step S401 and the step S402 are performed at the beginning of the whole manufacturing steps, the step S406 and the step S407 are performed at the end of the whole manufacturing steps, but the order of the steps S403 to S405 may be changed, the present disclosure is not limited thereto.

In one embodiment of the present disclosure, the first plate member and the second plate member are adhered to each other by the adhesive layer, and a step of wrapping the plurality of first electronic components and the plurality of second electronic components by the adhesive layer is performed before the step of removing the first carrier on the first plate member. In another embodiment of the present disclosure, the step of adhering and wrapping the first plate member and the second plate member by the adhesive layer is performed after the step of removing the first carrier on the first plate member.

In one embodiment of the present disclosure, the second plate member does not include a second protection layer. Therefore, after the step of adhering the first plate member and the second plate member by the adhesive layer further includes: bonding a first surface of a second protection layer to the second flexible substrate of the second plate member.

In other embodiments, the second plate member produced by the roll-to-roll process includes a second protection layer, and the second protection layer, the second flexible substrate, and the plurality of electronic components are stacked in sequence.

Please refer to FIG. 21 and FIG. 22A to FIG. 22J, FIG. 21 is a flow chart of a method for manufacturing a flexible electronic device according to still another embodiment of the present disclosure, and FIGS. 22A to 22J are schematic views for manufacturing the flexible electronic device according to still another embodiment of the present disclosure. In this embodiment, the first carrier is removed after the first plate member and the second plate member are bonded.

Figure 22A:
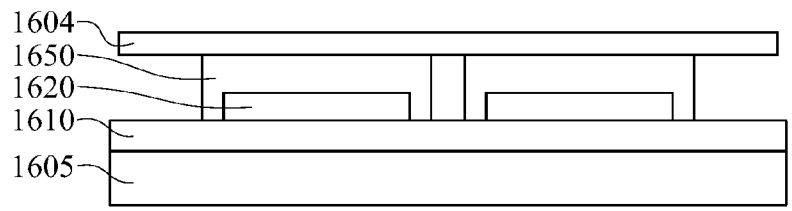
FIGS. 22A to 22J are schematic views for manufacturing the flexible electronic device according to still another embodiment of the present disclosure.

In a step S501 as shown in FIG. 22A, the first plate member 16a is provided. The first plate member 16a includes a first carrier 1605, a first flexible substrate 1610, a plurality of first electronic components 1620, an adhesive layer 1650 and a release film 1604, and the first carrier 1605, the first flexible substrate 1610, the plurality of first electronic components 1620, the adhesive layer 1650 and the release film 1604 are stacked in sequence. The first carrier 1605 is made of, for example, glass, but the present disclosure is not limited thereto. A release layer, a debonding layer or a sacrificial layer may be disposed between the first flexible substrate 1610 and the first carrier 1605, but the present disclosure is not limited thereto. After removing the first carrier 1605, the aforementioned layer and the first carrier 1605 may be removed simultaneously, or the aforementioned layer may be left on the first carrier 1605, the present disclosure is not limited thereto. The release film 104 is, for example, a release film having a pressure sensitive adhesive (PSA), a thermosetting adhesive or other adhesive material, the present disclosure is not limited thereto.

Figure 22B:
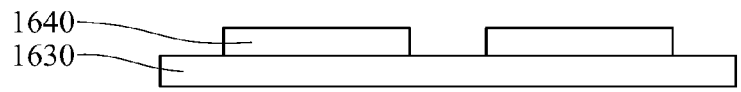

In a step S502 as shown in FIG. 22B, a second plate member 16b is provided. In this step, the second plate member 16b includes a second flexible substrate 1630 and a plurality of second electronic components 1640.

Figure 22C:
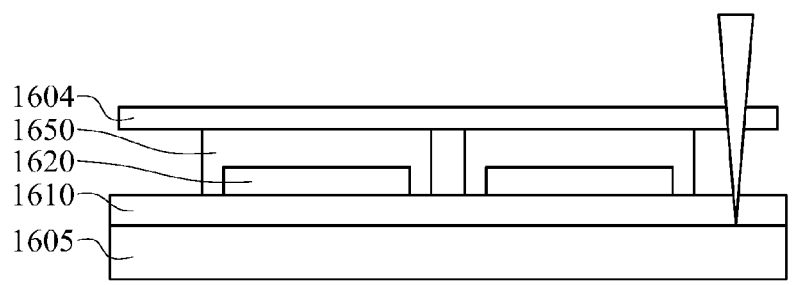

In a step S503 as shown in FIG. 22C, a flexible substrate cutting is performed on the first flexible substrate 1610 on the first carrier 1605. The flexible substrate cutting is performed by, for example, laser or a cutting tool. The cutting path of said flexible substrate cutting is, for example, performed on the range of the release layer, the debonding layer or the sacrificial layer, the present disclosure is not limited thereto.

Figure 22D:
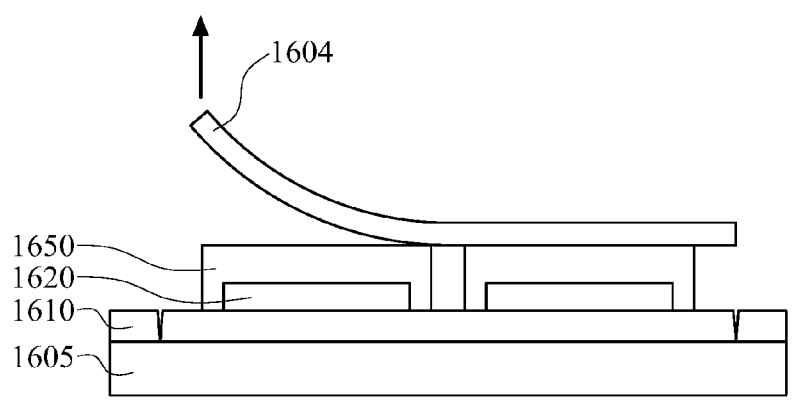

In a step S504 as shown in FIG. 22D, the release film 1604 on the first plate member 16a is removed to leave the adhesive layer 1650 exposed.

Figure 22E:
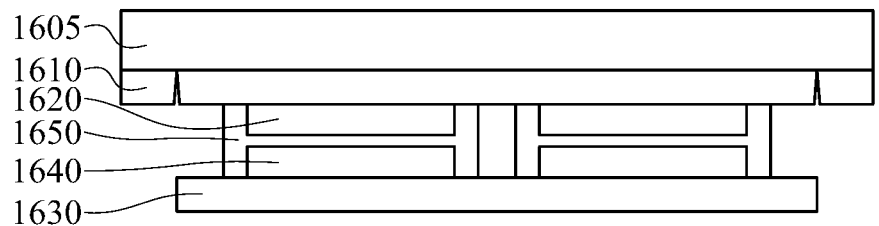

In a step S505 as shown in FIG. 22E, the first plate member 16a and the second plate member 16b are adhered to each other by the adhesive layer 1650, and the adhesive layer 1650 wraps the plurality of first electronic components 1620 and the plurality of second electronic components 1640 (or the plurality of first electronic components 1620 and the plurality of second electronic components 1640 are embedded in the adhesive layer 1650). In one embodiment, after the first plate member 16a and the second plate member 16b are adhered, they may be further conducted with a detection process such as an appearance detection, an optical detection, an electrical property detection or a light detection, but the present disclosure is not limited thereto.

Figure 22F:
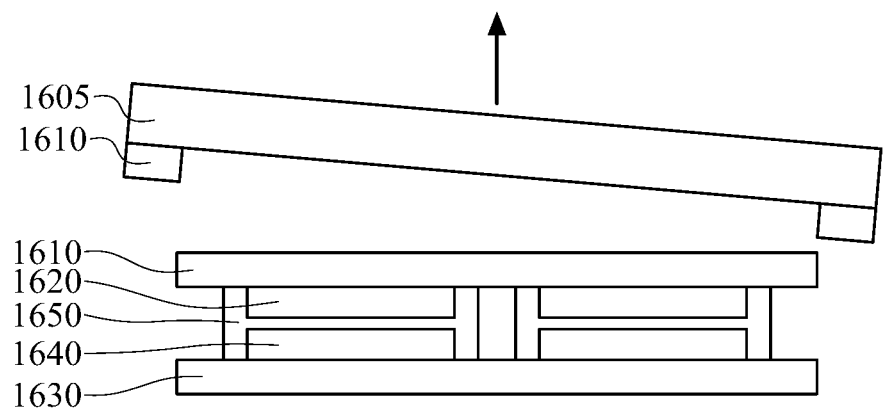

In a step S506 as shown in FIG. 22F, the first carrier 1605 on the first plate member 16a is removed. The process of removing the carrier is performed by, for example, mechanical manner, laser, or a combination of mechanical manner and laser, but the present disclosure is not limited thereto. In one embodiment of the present disclosure, take the mechanical manner as an example, a gas pressure in a variable pressure chamber formed between the first flexible substrate 1610 and the first carrier 1605 may be adjusted to produce a pressure difference between two opposite sides of the flexible fixing member on the side of the variable pressure chamber, so the flexible fixing member and the first flexible substrate 1610 are deformed and curved simultaneously in order to advantage the aforementioned removing steps to proceed. In such a case, the separated surfaces are evenly pressed by air pressure so that stress concentration is reduced, so the electronic components are prevented from being damaged. Furthermore, in another embodiment of the present disclosure, it is selectively to perform a pre-releasing process on a pre-releasing area located between the first flexible substrate 1610 and the first carrier 1605. In detail, a high pressure gas is provided on a conjunction between the first flexible substrate 1610 and the first carrier 1605 to produce a crack to advantage the aforementioned removing step to proceed.

Figure 22G:
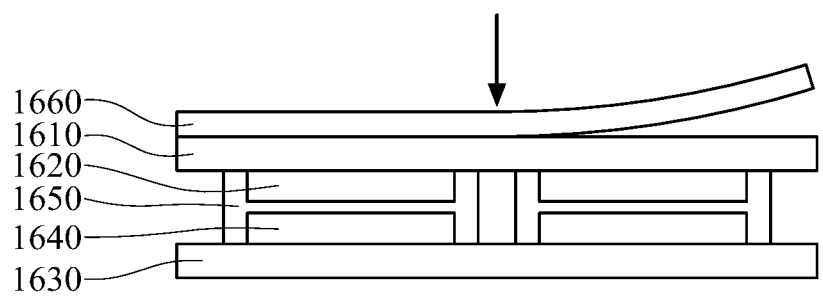

In a step S507 as shown in FIG. 22G, the first surface of the first protection layer 1660 is adhered to the first flexible substrate 1610 of the first plate member 16a. A cleaning step may be performed before the step of adhering the first protection layer 1660.

Figure 22H:
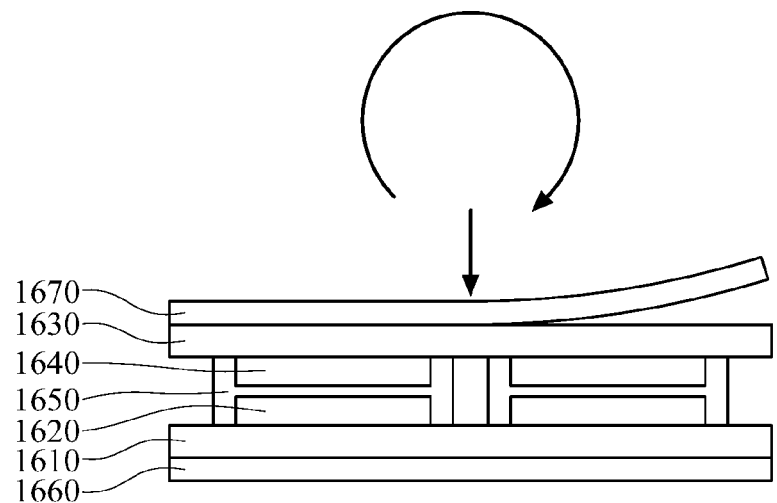

In a step S508 as shown in FIG. 22H, the first plate member 16a and the second plate member 16b which are adhered to each other are overturned so that the second plate member 16b is on the top, and the first surface of the second protection layer 1670 is adhered to the second flexible substrate 1630 of the second plate member 16b. A cleaning step may be performed before the step of adhering the second protection layer 1670. In the embodiment of the present disclosure, the overturning is performed because a basic platform is located under the plate member. In other embodiments, the plate members has no need to be overturned when the basic platform is on the top of the plate member, and its fixing surface faces down.

Figure 22I:
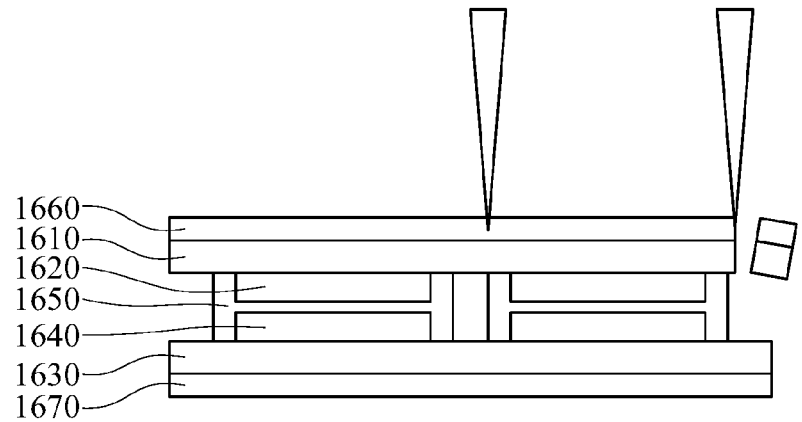

In a step S509 as shown in FIG. 22I, the unit cutting process is performed on the first plate member 16a and the second plate member 16b which are adhered to each other to produce the plurality of flexible electronic devices.

Figure 22J:
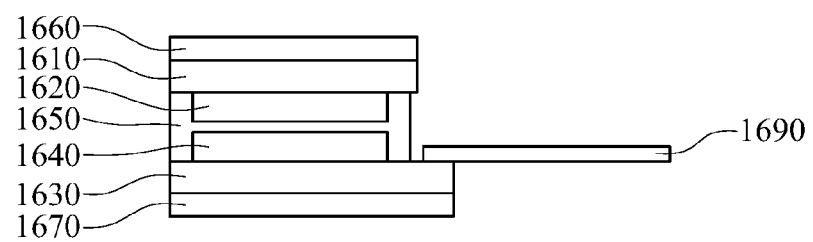

In a step S510 as shown in FIG. 22J, at least one of the first FPC (not shown in figures) and the second FPC 1690 is bonded to one of the plurality of flexible electronic devices.

As discussed in above, in the embodiments of the disclosure, since the orthogonal projection of the first FPC bonding area projected to the plane where the second flexible substrate is located does not overlap the second flexible substrate, and the orthogonal projection of the second FPC bonding area projected to the plane where the first flexible substrate is located does not overlap the first flexible substrate, so the step of bonding the FPC bonding area may be performed after the step of removing the carrier while manufacturing the flexible electronic device. Hence, a failure rate of manufacturing the flexible electronic device is largely reduced so as to advantage in manufacturing multiple flexible components on a large size carrier.

In addition, in the embodiments of the present disclosure, the flexible electronic device is not limited to be adapted to COF (chip-on-film) or COP (chip-on-plastic) technology.

Furthermore, the step of bonding the FPC is performed after the steps of removing the carrier and the unit cutting process. Therefore, a failure rate of removing the components from the carrier is reduced so as to increase production yield, and it is also favorable for manufacturing large size flexible components.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A flexible electronic device, comprising:
a first flexible substrate having a first surface and a second surface which are opposite to each other;
a first electronic component disposed on the first surface of the first flexible substrate;
a second flexible substrate having a first surface and a second surface which are opposite to each other, and the first surface of the second flexible substrate facing the first surface of the first flexible substrate;
a second electronic component disposed on the first surface of the second flexible substrate; and
an adhesive layer disposed between the first surface of the first flexible substrate and the first surface of the second flexible substrate;
wherein the first surface of the first flexible substrate has a first flexible printed circuit (FPC) bonding area outside the adhesive layer, an orthogonal projection of the first FPC bonding area projected on a plane where the second flexible substrate is located does not overlap the second flexible substrate, the first surface of the second flexible substrate has a second FPC bonding area outside the adhesive layer, and an orthogonal projection of the second FPC bonding area projected on a plane where the first flexible substrate is located does not overlap the first flexible substrate.

2. The flexible electronic device according to claim 1, further comprising a first FPC and a second FPC, wherein the first FPC is bonded to the first FPC bonding area and stacked on the first flexible substrate, and the second FPC is bonded to the second FPC bonding area and stacked on the second flexible substrate.

3. The flexible electronic device according to claim 1, wherein the first flexible substrate comprises a first main body structure and a first protruding structure, the first protruding structure protrudes from an edge of the first main body structure, and the first FPC bonding area is on the first protruding structure.

4. The flexible electronic device according to claim 3, wherein the second flexible substrate comprises a second main body structure and a second protruding structure, the second protruding structure protrudes from an edge of the second main body structure, and the second FPC bonding area is on the second protruding structure.

5. The flexible electronic device according to claim 4, wherein the first protruding structure protrudes from the first main body structure in a first direction, the second protruding structure protrudes from the second main body structure in a second direction, and the first direction and the second direction are same direction, opposite directions or perpendicular to each other.

6. The flexible electronic device according to claim 4, further comprising a second barrier layer disposed on the first surface of the second flexible substrate, wherein an orthogonal projection of the second barrier layer projected to the plane where the first flexible substrate is located at least partially overlaps one of edges of the first flexible substrate.

7. The flexible electronic device according to claim 3, wherein a conjunction between the first protruding structure and the first main body structure has a cove cut.

8. The flexible electronic device according to claim 3, wherein one of side edges of the first protruding structure and one of side edges of the first main body structure are aligned with each other or spaced apart by a distance.

9. The flexible electronic device according to claim 3, further comprising a first barrier layer disposed on the first surface of the first flexible substrate, and an orthogonal projection of the first barrier layer projected to the plane where the second flexible substrate is located at least partially overlaps one of edges of the second flexible substrate.

10. The flexible electronic device according to claim 1, further comprising a first notch, wherein the first notch extends from the second surface of the second flexible substrate to the first surface of the first flexible substrate to leave the first FPC bonding area exposed.

11. The flexible electronic device according to claim 10, further comprising a second notch, wherein the second notch from the second surface of the first flexible substrate to the first surface of the second flexible substrate to leave the second FPC bonding area exposed.

12. The flexible electronic device according to claim 1, further comprising a first protection layer and a second protection layer, the first protection layer disposed on the second surface of the first flexible substrate, and the second protection layer disposed on the second surface of the second flexible substrate.

13. A method for manufacturing a flexible electronic device, comprising:
providing a first plate member comprising a first carrier, a first flexible substrate, a plurality of first electronic components, an adhesive layer and a release film, wherein the first carrier, the first flexible substrate, the plurality of first electronic components, the adhesive layer and the release film are stacked in sequence;
providing a second plate member comprising a second carrier, a second flexible substrate and a plurality of second electronic components, wherein the second carrier, the second flexible substrate and the plurality of second electronic components are stacked in sequence;
removing the release film on the first plate member to leave the adhesive layer exposed;
adhering the first plate member and the second plate member by the adhesive layer;
removing the first carrier on the first plate member;
removing the second carrier on the second plate member;
performing a unit cutting process on the first plate member and the second plate member which are adhered to each other to produce a plurality of flexible electronic devices; and
bonding a first FPC and a second FPC to one of the plurality of flexible electronic devices.

14. The method according to claim 13, further comprising:
adhering a first surface of a first protection layer to the first flexible substrate of the first plate member; and
adhering a first surface of a second protection layer on the second flexible substrate of the second plate member.

15. The method according to claim 14, wherein the unit cutting process comprises a full cutting process or a partial cutting process, the full cutting process and the partial cutting process are performed on a same cutting path, the first plate member and the second plate member which are adhered to each other are cut through during the full cutting process, and the first plate member and the second plate member which are adhered to each other are partially cut during the partial cutting process.

16. The method according to claim 15, wherein the partial cutting process is used to cut the first protection layer to a second barrier layer on a first surface of the second flexible substrate, or cut the second protection layer to a first barrier layer on a first surface of the first flexible substrate.

17. A method for manufacturing a flexible electronic device, comprising:
providing a first plate member comprising a first carrier, a first flexible substrate, and a plurality of first electronic components, wherein the first carrier, the first flexible substrate, and the plurality of first electronic components are stacked in sequence;
providing a second plate member comprising a second flexible substrate and a plurality of second electronic components;
adhering the first plate member and the second plate member by an adhesive layer;
removing the first carrier on the first plate member;
performing a unit cutting process on the first plate member and the second plate member which are adhered to each other to produce a plurality of flexible electronic devices; and
bonding a first FPC and a second FPC to one of the plurality of flexible electronic devices.

18. The method according to claim 17, further comprising:
adhering a first surface of a first protection layer to the first flexible substrate of the first plate member; and
adhering a first surface of a second protection layer to the second flexible substrate of the second plate member.

19. The method according to claim 17, wherein the second plate member further comprises a second protection layer, and the second protection layer, the second flexible substrate and the plurality of second electronic components are stacked in sequence.

20. The method according to claim 17, wherein the step of adhering a first plate member and the second plate member by the adhesive layer is performed before a step of removing the first carrier on the first plate member.

21. The method according to claim 17, wherein the step of adhering a first plate member and the second plate member by the adhesive layer is performed after a step of removing the first carrier on the first plate member.

* * * * *